United States Patent
Shimote et al.

(10) Patent No.: US 9,837,369 B2
(45) Date of Patent: Dec. 5, 2017

(54) SEMICONDUCTOR DEVICE AND MANUFACTURING METHOD THEREOF

(71) Applicant: Renesas Electronics Corporation, Tokyo (JP)

(72) Inventors: Yoshikazu Shimote, Tokyo (JP); Shinji Baba, Tokyo (JP); Toshihiro Iwasaki, Tokyo (JP); Kazuyuki Nakagawa, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 24 days.

(21) Appl. No.: 15/023,716

(22) PCT Filed: Sep. 27, 2013

(86) PCT No.: PCT/JP2013/076227
§ 371 (c)(1),
(2) Date: Mar. 22, 2016

(87) PCT Pub. No.: WO2015/045089
PCT Pub. Date: Apr. 2, 2015

(65) Prior Publication Data
US 2016/0233189 A1    Aug. 11, 2016

(51) Int. Cl.
*H01L 23/31* (2006.01)
*H01L 21/56* (2006.01)
(Continued)

(52) U.S. Cl.
CPC ............ *H01L 24/17* (2013.01); *H01L 21/563* (2013.01); *H01L 21/78* (2013.01);
(Continued)

(58) Field of Classification Search
CPC ....... H01L 21/563; H01L 24/81; H01L 24/16; H01L 24/13; H01L 23/49816;
(Continued)

(56) References Cited

U.S. PATENT DOCUMENTS 6,229,711 B1 *   5/2001   Yoneda ............ H01L 23/49838
                                                    174/259
2007/0201193 A1 *   8/2007   Tsuji ................ H01L 21/561
                                                    361/820
(Continued)

FOREIGN PATENT DOCUMENTS

JP            2000-77471 A        3/2000
JP            2000216304 A        8/2000
(Continued)

OTHER PUBLICATIONS

International Search Report for PCT/JP2013/076227 dated Nov. 12, 2013.
(Continued)

*Primary Examiner* — Marvin Payen
*Assistant Examiner* — Jeremy Joy
(74) *Attorney, Agent, or Firm* — Sughrue Mion, PLLC

(57) ABSTRACT

In a semiconductor device (SP1) according to an embodiment, a solder resist film (first insulating layer, SR1) which is in contact with the base material layer, and a resin body (second insulating layer, 4) which is in contact with the solder resist film and the semiconductor chip, are laminated in between the base material layer (2CR) of a wiring substrate 2 and a semiconductor chip (3). In addition, a linear expansion coefficient of the solder resist film is equal to or larger than a linear expansion coefficient of the base material layer, and the linear expansion coefficient of the solder resist film is equal to or smaller than a linear expansion coefficient of the resin body. Also, the linear expansion coefficient of the base material layer is smaller than the linear expansion coefficient of the resin body. According to the above-described configuration, damage of the semiconductor device caused by a temperature cyclic load can be suppressed, and thereby reliability can be improved.

12 Claims, 30 Drawing Sheets

(51) Int. Cl.
| | | |
|---|---|---|
| *H01L 23/00* | (2006.01) | |
| *H01L 23/498* | (2006.01) | |
| *H01L 23/50* | (2006.01) | |
| *H01L 21/78* | (2006.01) | |
| *H05K 3/28* | (2006.01) | |
| *H05K 3/34* | (2006.01) | |
| *H01L 21/683* | (2006.01) | |

(52) U.S. Cl.
CPC .... *H01L 23/3142* (2013.01); *H01L 23/49805* (2013.01); *H01L 23/49822* (2013.01); *H01L 23/49827* (2013.01); *H01L 23/49838* (2013.01); *H01L 23/49894* (2013.01); *H01L 23/50* (2013.01); *H01L 23/562* (2013.01); *H01L 24/16* (2013.01); *H01L 24/32* (2013.01); *H01L 24/49* (2013.01); *H01L 24/73* (2013.01); *H01L 24/81* (2013.01); *H01L 24/97* (2013.01); *H01L 21/561* (2013.01); *H01L 21/6836* (2013.01); *H01L 23/3128* (2013.01); *H01L 23/49816* (2013.01); *H01L 23/564* (2013.01); *H01L 24/11* (2013.01); *H01L 24/13* (2013.01); *H01L 2221/6834* (2013.01); *H01L 2221/68327* (2013.01); *H01L 2224/0401* (2013.01); *H01L 2224/05009* (2013.01); *H01L 2224/05022* (2013.01); *H01L 2224/05124* (2013.01); *H01L 2224/05572* (2013.01); *H01L 2224/1134* (2013.01); *H01L 2224/1146* (2013.01); *H01L 2224/1147* (2013.01); *H01L 2224/11849* (2013.01); *H01L 2224/13012* (2013.01); *H01L 2224/13014* (2013.01); *H01L 2224/13016* (2013.01); *H01L 2224/13076* (2013.01); *H01L 2224/13082* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/16055* (2013.01); *H01L 2224/16105* (2013.01); *H01L 2224/16225* (2013.01); *H01L 2224/16227* (2013.01); *H01L 2224/16237* (2013.01); *H01L 2224/1713* (2013.01); *H01L 2224/32225* (2013.01); *H01L 2224/48091* (2013.01); *H01L 2224/48106* (2013.01); *H01L 2224/48227* (2013.01); *H01L 2224/48235* (2013.01); *H01L 2224/73204* (2013.01); *H01L 2224/73265* (2013.01); *H01L 2224/814* (2013.01); *H01L 2224/81191* (2013.01); *H01L 2224/81385* (2013.01); *H01L 2224/81815* (2013.01); *H01L 2224/83104* (2013.01); *H01L 2224/94* (2013.01); *H01L 2224/97* (2013.01); *H01L 2924/00014* (2013.01); *H01L 2924/014* (2013.01); *H01L 2924/01029* (2013.01); *H01L 2924/05442* (2013.01); *H01L 2924/0665* (2013.01); *H01L 2924/10253* (2013.01); *H01L 2924/15311* (2013.01); *H01L 2924/15321* (2013.01); *H01L 2924/181* (2013.01); *H01L 2924/186* (2013.01); *H01L 2924/2064* (2013.01); *H01L 2924/351* (2013.01); *H05K 3/284* (2013.01); *H05K 3/3436* (2013.01); *H05K 2201/068* (2013.01); *H05K 2201/09427* (2013.01); *H05K 2201/10704* (2013.01); *H05K 2201/10977* (2013.01); *H05K 2203/0465* (2013.01)

(58) Field of Classification Search
CPC ........... H01L 23/49827; H01L 23/3128; H01L 23/49822; H01L 24/17
See application file for complete search history.

(56) References Cited

U.S. PATENT DOCUMENTS

| | | | | |
|---|---|---|---|---|
| 2007/0221400 | A1* | 9/2007 | Kurashina | H01L 21/563 174/255 |
| 2009/0057892 | A1* | 3/2009 | Osumi | H01L 23/3171 257/737 |
| 2010/0264552 | A1* | 10/2010 | Nakasato | H01L 21/6835 257/778 |
| 2012/0048607 | A1* | 3/2012 | Takahashi | H01L 21/563 174/260 |
| 2012/0083073 | A1* | 4/2012 | Tanuma | H01L 21/563 438/125 |
| 2013/0001274 | A1* | 1/2013 | Konno | H01L 23/49838 228/104 |
| 2013/0070437 | A1* | 3/2013 | Mohammed | H01L 23/5386 361/767 |
| 2013/0075936 | A1* | 3/2013 | Lin | H01L 24/19 257/777 |
| 2014/0183744 | A1* | 7/2014 | Lee | H01L 21/563 257/762 |
| 2014/0210109 | A1* | 7/2014 | Tanaka | H01L 23/49827 257/778 |
| 2014/0346684 | A1* | 11/2014 | Kojima | H01L 24/32 257/783 |

FOREIGN PATENT DOCUMENTS

| | | |
|---|---|---|
| JP | 2007-227708 A | 9/2007 |
| JP | 2007-266136 A | 10/2007 |
| JP | 2009-64812 A | 3/2009 |
| JP | 2013-12648 A | 1/2013 |
| WO | 2012140908 A1 | 10/2012 |

OTHER PUBLICATIONS

Communication dated Apr. 19, 2017, from the European Patent Office in counterpart European Application No. 13894643.9.

* cited by examiner

SEMICONDUCTOR DEVICE AND MANUFACTURING METHOD THEREOF

CROSS REFERENCE TO RELATED APPLICATIONS

This application is a National Stage of International Application No. PCT/JP2013/076227 filed Sep. 27, 2013, the contents of which are incorporated herein by reference in their entirety.

TECHNICAL FIELD

The present invention relates to, for example, a semiconductor device in which a semiconductor chip is mounted over a solder resist film of a wiring substrate with a resin body interposed therebetween, and a manufacturing method thereof.

BACKGROUND ART

Japanese Patent Application Laid-Open Publication No. 2013-12648 (Patent Document 1) describes a semiconductor device in which a semiconductor chip is mounted over a solder resist film of a wiring substrate with an underfill resin interposed therebetween, and a manufacturing method thereof. Patent Document 1 describes a technique in which a projecting electrode is arranged on a narrow portion of a bonding lead which is exposed from the solder resist film and the electrode is connected to the lead via the solder material.

In addition, Japanese Patent Application Laid-Open Publication No. 2000-77471 (Patent Document 2) describes a technique in which a projecting electrode (bump) is arranged in a part with a large width of a bonding lead (conductive pattern) exposed from a solder resist film and the electrode is connected to the lead via a solder material.

In addition, Japanese Patent Application Laid-Open Publication No. 2007-266136 (Patent Document 3) describes a technique in which each solder resist layer formed on a top surface and a bottom surface of a wiring substrate includes glass cloth to thereby reinforce mechanical strength of the wiring substrate.

RELATED ART DOCUMENTS

Patent Documents

Patent Document 1: Japanese Patent Application Laid-Open Publication No. 2013-12648
Patent Document 2: Japanese Patent Application Laid-Open Publication No. 2000-77471
Patent Document 3: Japanese Patent Application Laid-Open Publication No. 2007-266136

SUMMARY OF THE INVENTION

Problems to be Solved by the Invention

As illustrated in FIG. 2 of Patent Document 1 described above, for example, the ball grid array (BGA) semiconductor device is configured of the wiring substrate, the semiconductor chip to be mounted over the wiring substrate, a resin body to protect (or fix) the semiconductor chip, and the like. In addition, the wiring substrate over which the semiconductor chip is mounted includes a base material layer, wiring layers formed on front and back surfaces of the base material layer, and the solder resist film which covers the wiring layers.

In this manner, the single semiconductor device is configured of plural types of materials. In addition, the respective materials have various thermal expansion coefficients. In other words, the thermal expansion coefficients of the respective materials are not necessarily the same as each other.

Accordingly, it has been found out that stress is generated on a connection interface between the respective materials configuring the semiconductor device or the like when a temperature cyclic load under which temperature rise and temperature drop are repeated is applied to such a semiconductor device, which causes reduced reliability of the semiconductor device.

Other problems and novel features will be apparent from the description of the present specification and the attached drawings.

Means for Solving the Problems

In a semiconductor device according to an embodiment, a first insulating layer being in contact with a base material layer and a second insulating layer being in contact with the first insulating layer and a semiconductor chip are laminated between the base material layer of a wiring substrate and the semiconductor chip. In addition, a linear expansion coefficient of the first insulating layer is equal to or larger than a linear expansion coefficient of the base material layer, the linear expansion coefficient of the first insulating layer is equal to or smaller than a linear expansion coefficient of the second insulating layer, and the linear expansion coefficient of the base material layer is smaller than the linear expansion coefficient of the second insulating layer.

Effects of the Invention

According to the embodiment, it is possible to improve reliability of the semiconductor device.

BRIEF DESCRIPTIONS OF THE DRAWINGS

Figure 1:
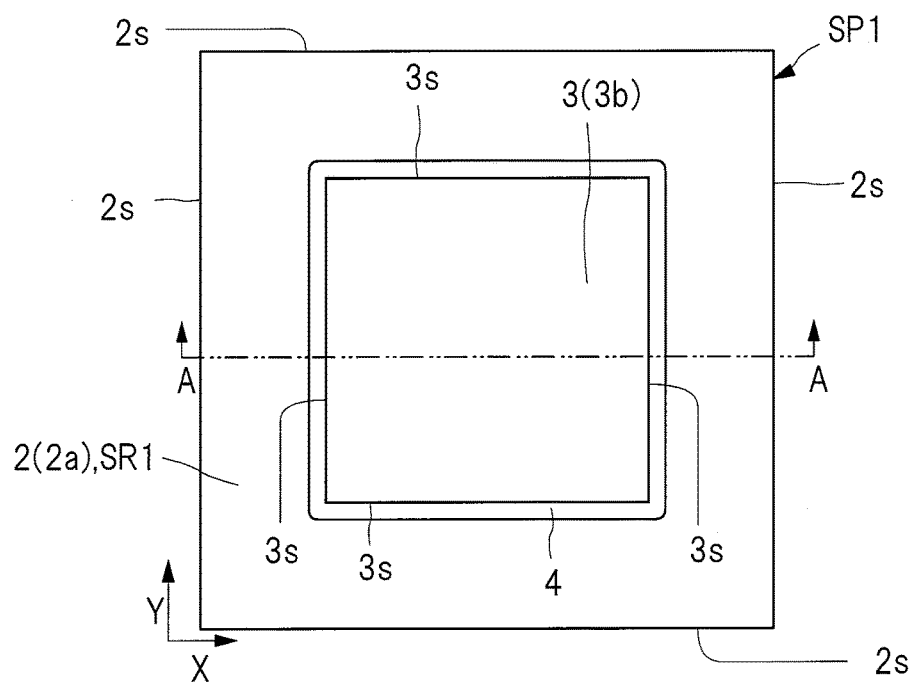
FIG. 1 is a plan view illustrating an overall structure on a chip mounting surface side of a semiconductor device as an embodiment.

DETAILED DESCRIPTION OF PREFERRED EMBODIMENTS (Explanation of Description Form, Basic Terms and Method in Present Application)

In this application, a mode of an embodiment will be described in a plurality of sections or the like when required as a matter of convenience. However, these are not irrelevant to each other unless otherwise stated in particular, and the one relates to the entire or a part of the other as a modified example, details, or the like irrespective of the order of descriptions. Also, the description of the same portions is not repeated in principle. Further, the components in the mode of the embodiment are not always indispensable unless otherwise stated in particular, except the case where the number of the components is logically limited to the specific value and unless otherwise specified clearly from the context.

Similarly, in the description of the mode of the embodiment and others, even when "X made of A" or the like is referred to with respect to a material and a composition, X containing elements other than A is not excluded unless otherwise stated in particular and unless otherwise specified clearly from the context. For example, when referring to an ingredient, it means "X containing A as a main ingredient" or the like. For example, even when "silicon member" or the like is referred to, it is needless to say that the meaning is not limited to pure silicon and the member includes those containing additives other than silicon such as SiGe (silicon-germanium) alloy, multi-element alloy containing silicon as a main ingredient and the like. In addition, even when a gold plating, a Cu layer, a nickel plating and others are referred to, not only a pure one but a member containing each of gold, Cu, nickel, and the like as a main ingredient is included unless otherwise specified in particular.

Further, even when a specific value or amount is referred to, a value larger than the specific value or smaller than the specific value is also applicable unless otherwise stated in particular, except the case where it is logically limited to the specific value and unless otherwise specified clearly from the context.

Also, the same or similar components are denoted by the same or similar reference signs or characters throughout the drawings for describing the embodiment, and the repetitive description thereof is omitted.

Although there is a case in which the term "top surface" or "bottom surface" is used in the present application, there is also a case in which the top surface is arranged to be lower than the bottom surface, for example, after a semiconductor package is mounted since various modes are present as mounting modes of the semiconductor package. In the present application, a planar surface on an element formation surface side of a semiconductor chip will be described as a front surface, and a surface opposite to the front surface will be described as a back surface. In addition, a planar surface on a chip mounting surface side of a wiring substrate will be described as the top surface or the front surface, and a surface opposite to the top surface will be described as the bottom surface.

In addition, in the accompanying drawings, hatching or the like may be omitted even in a cross section in the case where the drawings become rather complicated or distinction from a clearance is apparent. In association with this, when it is obvious from the description or the like, a contour line in a background may be omitted even in a case of a planarly closed hole. In addition, in order to specify the fact that a portion is not a clearance or specify a boundary of regions, hatching or dot pattern may be given even in the case other than the cross section.

<Semiconductor Device>

Figure 2:
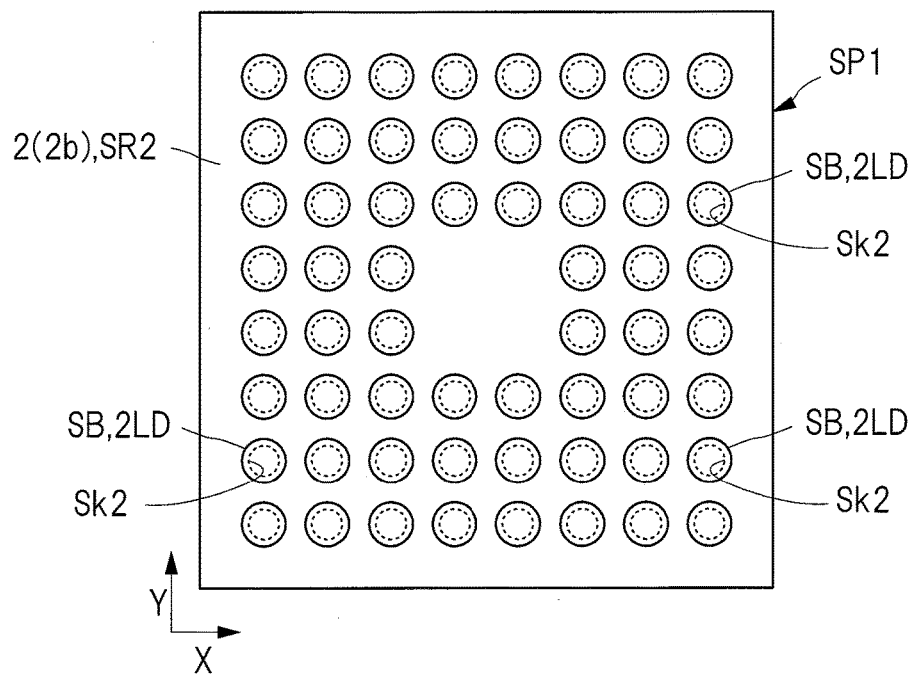
FIG. 2 is a plan view illustrating amounting surface (opposite surface) side of the semiconductor device illustrated in FIG. 1.
Figure 3:
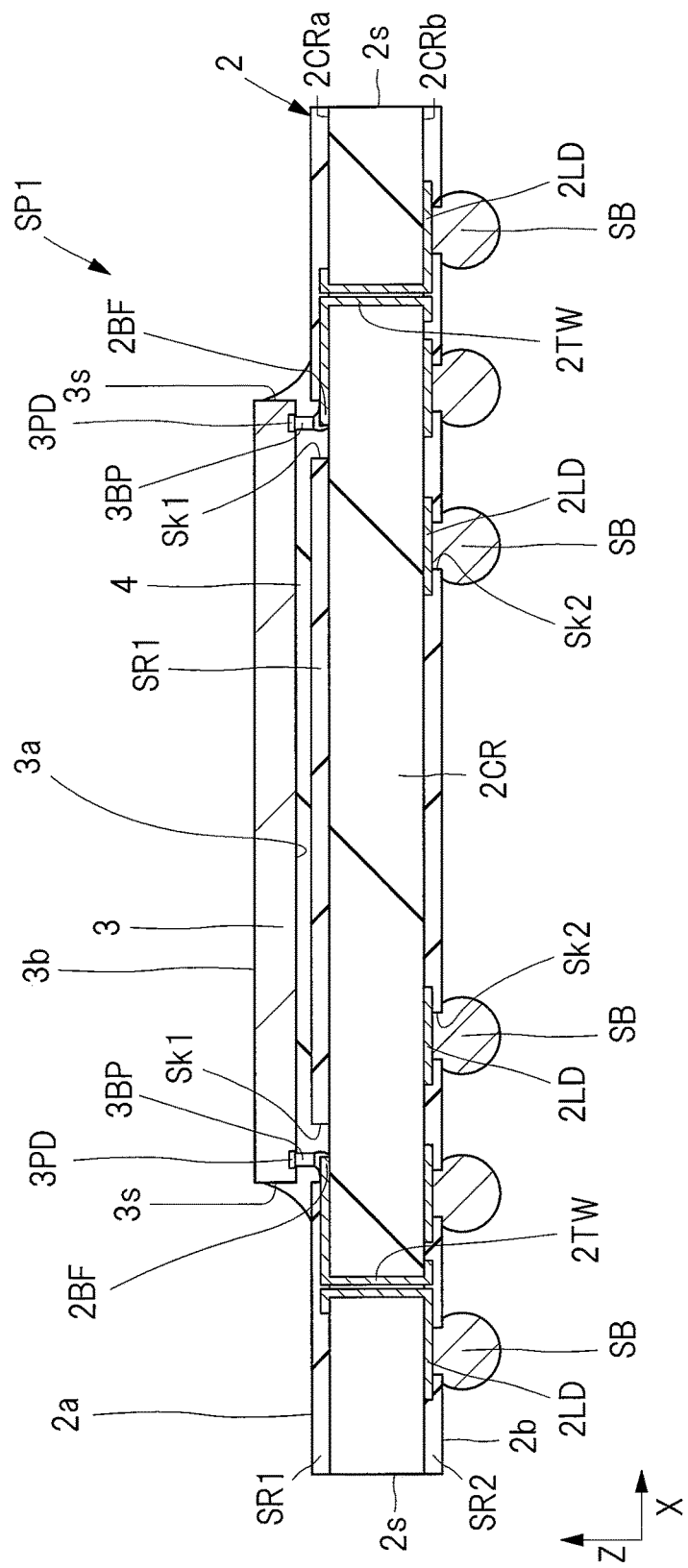
FIG. 3 is a cross-sectional view taken along a line A-A of FIG. 1.
Figure 4:
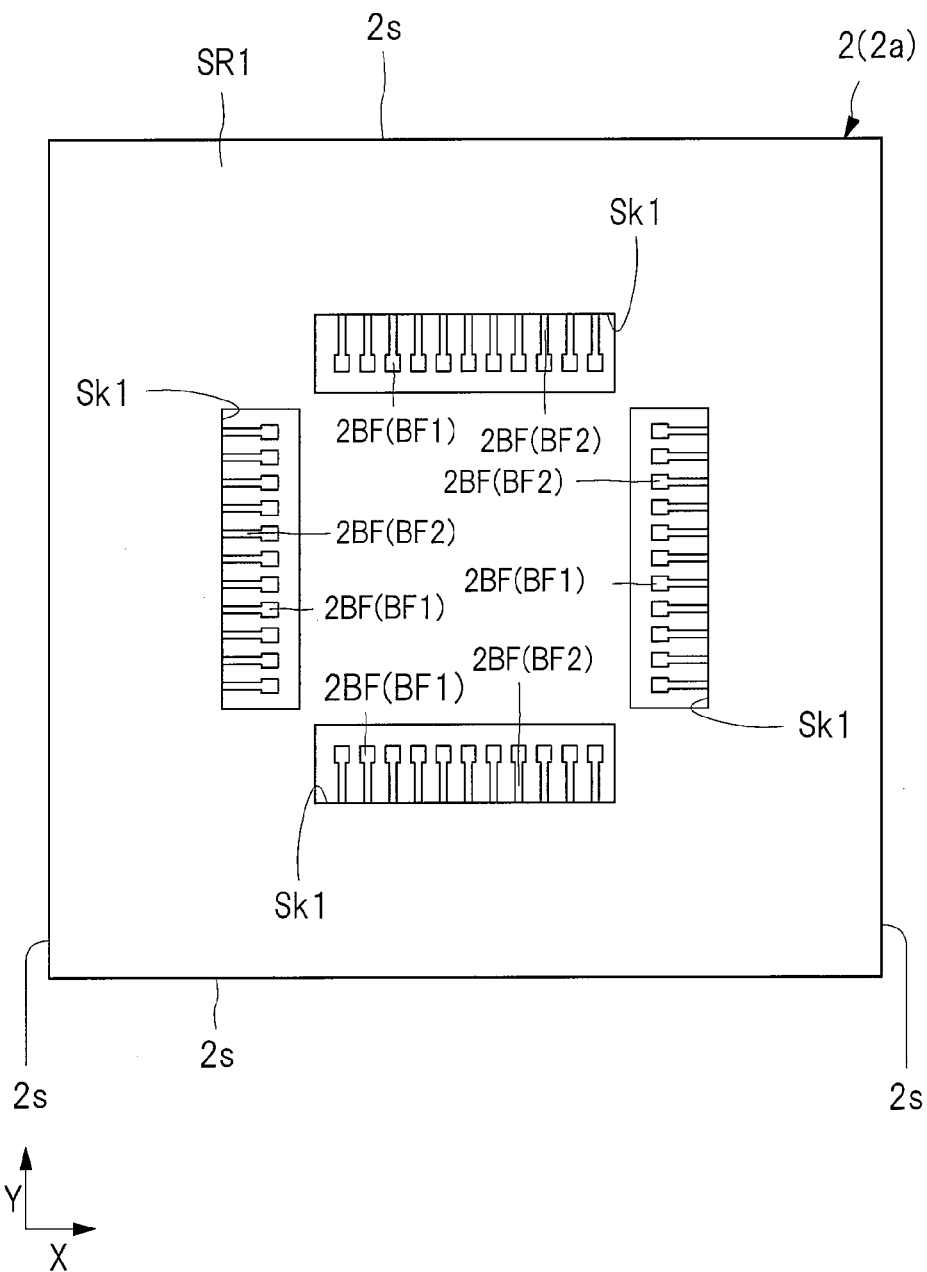
FIG. 4 is a plan view illustrating a chip mounting surface side of a wiring substrate when a semiconductor chip and a resin body illustrated in FIG. 1 are removed.
Figure 5:
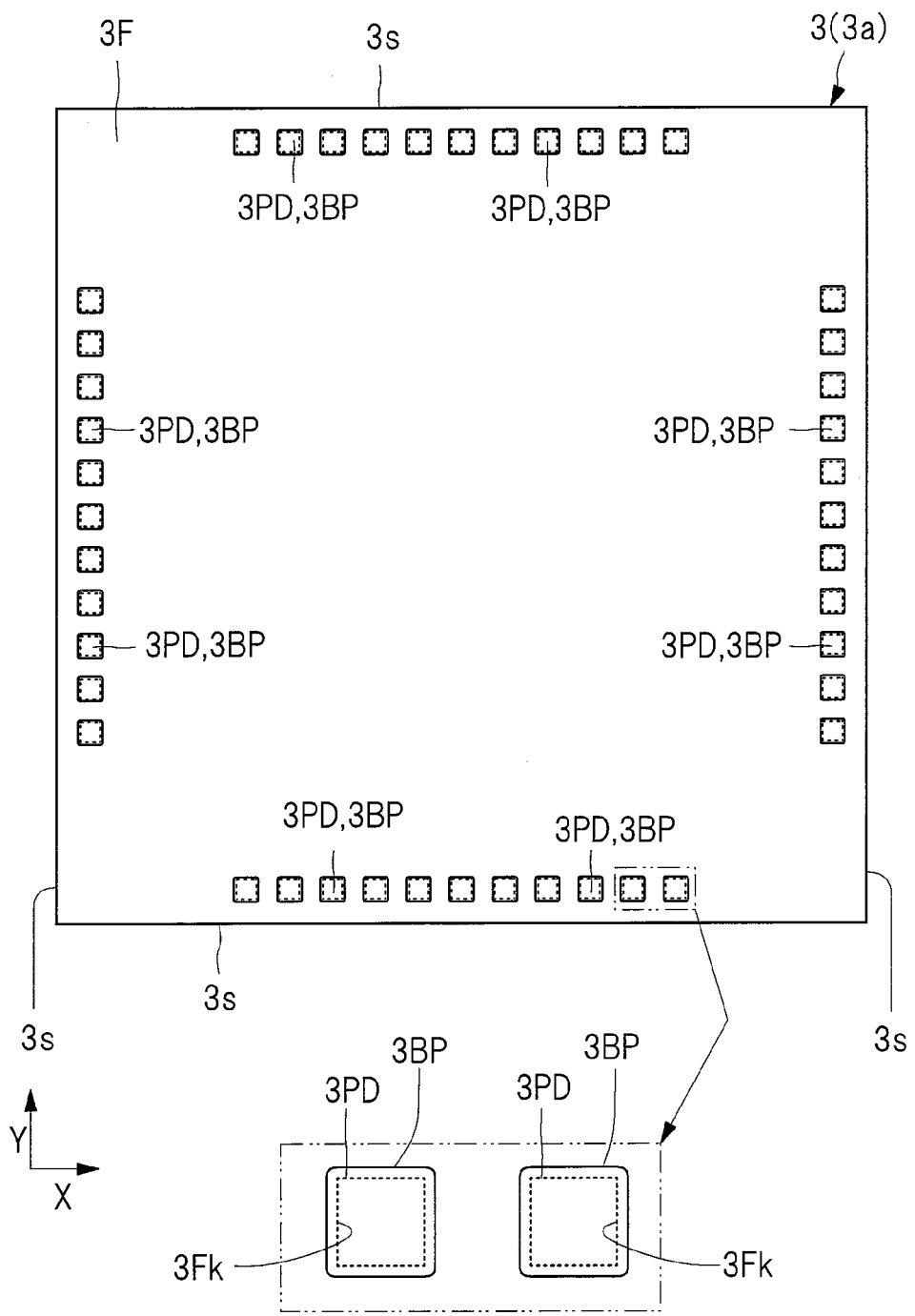
FIG. 5 is a plan view illustrating a front surface (an opposing surface to the wiring substrate) of the semiconductor chip illustrated in FIG. 1.

First, a description will be given regarding a general configuration of a semiconductor device SP1 according to the present embodiment with reference to FIGS. 1 to 5. FIG. 1 is a plan view illustrating an overall structure on a chip mounting surface side of the semiconductor device according to the present embodiment. In addition, FIG. 2 is a plan view illustrating a mounting surface (opposite surface) side of the semiconductor device illustrated in FIG. 1. In addition, FIG. 3 is a cross-sectional view taken along a line A-A of FIG. 1. In addition, FIG. 4 is a plan view illustrating the chip mounting surface side of the wiring substrate when a semiconductor chip and a resin body illustrated in FIG. 1 are removed. In addition, FIG. 5 is a plan view illustrating the front surface (an opposing surface of the wiring substrate) of the semiconductor chip illustrated in FIG. 1.

Incidentally, FIGS. 2 to 5 illustrate terminals in an enlarged manner than numerical examples to be described below by reducing the number of the terminals for viewability thereof. The number of the terminals (a pad 3PD, a bonding finger 2BF, a solder ball SB or the like) is not limited to the modes illustrated in FIGS. 2 to 5. For example, the present application can be applied to a semiconductor device in which each number of terminals such as the pad 3PD, the bonding finger 2BF, and the solder ball SB is about 100 to 10,000. In addition, FIG. 5 also illustrates a partially enlarged plan view in which two of the plurality of pads 3PD are enlarged in order to illustrate a structure of the pad 3PD and a projecting electrode 3BP in a plan view.

The semiconductor device SP1 according to the present embodiment includes a wiring substrate 2, a semiconductor chip 3 (see FIGS. 1 and 3) mounted over the wiring substrate 2, and a resin body (an insulating layer, an underfill material, a sealing material, an adhesive, or a die-bonding material) 4 formed between the wiring substrate 2 and the semiconductor chip 3.

As illustrated in FIG. 3, the wiring substrate 2 includes a top surface (a surface, a main surface, or a chip mounting surface) 2a over which the semiconductor chip 3 is mounted, a bottom surface (a surface, a main surface, or a mounting surface) 2b opposite to the top surface 2a, and a side surface 2s (see FIGS. 1 to 3) arranged between the top surface 2a and the bottom surface 2b and forms a quadrangular outer shape in the plan view as illustrated in FIGS. 2 and 3. In the examples illustrated in FIGS. 1 and 2, a planar size (dimensions in the plan view, dimensions of the top surface 2a and the bottom surface 2b, or an outer size) of the wiring substrate 2 is formed in, for example, a quadrangular shape with a length of one side being about 12 mm to 60 mm. In addition, a thickness (height) of the wiring substrate 2, that is, a distance from the top surface 2a to the bottom surface 2b illustrated in FIG. 4 is, about 0.3 mm to 1.3 mm, for example.

The wiring substrate 2 is an interposer to electrically connect the semiconductor chip 3 mounted over the top surface 2a side and a mounting substrate (not illustrated) and includes a plurality of wiring layers (two layers in the example illustrated in FIG. 2) that electrically connect the top surface 2a side as the chip mounting surface and the bottom surface 2b side as the mounting surface. The wiring substrate 2 includes a top surface (a surface, a first surface, a main surface, or a bonding finger formation surface) 2CRa and a bottom surface (a surface, a second surface, a main surface, or a land formation surface) 2CRb opposite to the top surface 2CRa, and includes a base material layer (a core layer, or an insulating layer) 2CR which is made of a prepreg, for example, in which a glass fiber (fiber material) is impregnated with resin. The wiring layers are formed on the top surface 2CRa and bottom surface 2CRb of the base material layer 2CR, respectively.

A plurality of conductive patterns are formed in the wiring layers formed on the top surface 2CRa of the base material layer 2CR, and the conductive patterns include a plurality of bonding fingers (terminals, electrodes, or internal interface terminals) 2BF as terminals to electrically connect the semiconductor chip 3 and the wiring substrate 2 as illustrated in FIG. 3. A detailed structure of the bonding finger 2BF will be described later. In addition, a plurality of conductive patterns are formed in the wiring layers formed on the bottom surface 2CRb of the base material layer 2CR, and the conductive patterns include a plurality of lands (terminals, electrodes, external interface terminals, or external terminals) 2LD as terminals to which a plurality of solder balls SB as external terminals of the semiconductor device SP1 are connected as illustrated in FIG. 3.

The conductive pattern such as the bonding finger 2BF or the land 2LD is a metal film formed by, for example, a plating method and is made of a metal containing copper (Cu) as a main material, for example. In addition, a thickness (film thickness) of the conductive pattern such as the bonding finger 2BF or the land 2LD is about, for example, 5 μm to 30 μm.

Incidentally, in FIG. 2, although the description is given by simplifying a wiring layer structure and featuring the wiring substrate 2 with a two-layer structure in order to describe a technical idea of the present application in an easily understandable manner, the number of the wiring layers is not limited to two and may be three or more, for example. A description will be given later regarding a modified example according to a wiring substrate with three or more wiring layers.

In addition, a solder resist film (insulating layer) SR1 which is an insulating layer containing resin is formed on the top surface 2CRa of the base material layer 2CR, and most of the top surface 2CRa is covered with the solder resist film SR1. In addition, as illustrated in FIG. 4, an opening Sk1 is formed in the solder resist film SR1, and each part of the plurality of bonding fingers 2BF is exposed from the solder resist film SR1 in the opening Sk1. In the example illustrated in FIG. 4, the opening Sk1 is formed to straddle the plurality of bonding fingers 2BF. In other words, each part of the plurality of bonding fingers 2BF is collectively exposed from the solder resist film SR1 in the single opening Sk1.

In addition, a solder resist film (insulating layer) SR2 which is an insulating layer containing resin is formed on the bottom surface 2CRb of the base material layer 2CR, and most of the bottom surface 2CRb is covered with the solder resist film SR2. In addition, as illustrated in FIG. 3, the plurality of openings Sk2 are formed in the solder resist film SR2, and each part of the plurality of lands 2LD is exposed from the solder resist film SR2 in the opening Sk2. In the example illustrated in FIG. 3, the openings Sk2 are formed corresponding to the plurality of lands 2LD, respectively. In other words, the opening Sk2 is individualy formed in each of the plurality of bonding fingers 2BF, and the plurality of bonding fingers 2BF are exposed from the solder resist film SR2 in the plurality of openings Sk2, respectively.

Although a detailed structure of the solder resist film SR1 and the solder resist film SR2 will be described later, each of the solder resist film SR1 and the solder resist film SR2 is formed by causing the glass fiber to be impregnated with a plurality of filler particles and resins in the present embodiment. In addition, each thickness (film thickness) of the solder resist film SR1 and the solder resist film SR2 each covering the conductive pattern is set to about 5 µm to 35 µm.

In addition, the wiring layers on the top surface 2CRa side of the base material layer 2CR and the wiring layers on the bottom surface 2CRb side are electrically connected to each other via a plurality of through-hole wires 2TW respectively formed inside a plurality of through-holes which are provided to penetrate from one of the top surface 2CRa and the bottom surface 2CRb to the other. The through-hole wire 2TW is formed by a plating method, for example, and is made of a metal containing copper (Cu) as a main material, for example, similarly to the conductive pattern such as the bonding finger 2BF and the land 2LD.

In addition, in the example illustrated in FIG. 3, the solder ball (a solder material, an external terminal, an electrode, or an external electrode) SB is connected to each of the plurality of lands 2LD. The solder ball SB is a conductive member that electrically connects the plurality of terminals (not illustrated) on the mounting substrate side and the plurality of lands 2LD at the time of mounting the semiconductor device SP1 onto the mounting substrate (not illustrated). In other words, the solder ball SB is the external terminal of the semiconductor device SP1.

The solder ball SB is a solder material made of, for example, a Sn—Pb solder material containing lead (Pb), or a so-called lead-free solder which substantially does not contain Pb. Examples of the lead-free solder includes pure tin (Sn), tin-bismuth (Sn—Bi), tin-copper-silver (Sn—Cu—Ag), tin-copper (Sn—Cu), and the like. Here, the lead-free solder means a material with a content of lead (Pb) being equal to or lower than 0.1 wt %, and this content is defined based on an instruction by restriction of hazardous substances (RoHS).

In addition, the plurality of solder balls SB are arranged in rows and columns (an array form or a matrix form) as illustrated in FIG. 2. In other words, the plurality of solder balls SB are arranged along a side of the bottom surface 2b of the wiring substrate 2 over a plurality of columns. In addition, the plurality of lands 2LD to which the plurality of solder balls SB are bonded are also arranged in rows and columns (a matrix form). In this manner, a semiconductor device in which the plurality of external terminals (the solder ball SB and the land 2LD) are arranged in the matrix form on the mounting surface side of the wiring substrate 2 is referred to as an area array semiconductor device. In the area array semiconductor device, the mounting surface (the bottom surface 2b) side of the wiring substrate 2 can be effectively utilized as an arrangement space of external terminals, so that it is preferable in that an increase in mounting area of the semiconductor device can be suppressed even when the number of external terminals increases. That is, it is possible to mount the semiconductor device with the increased number of external terminals in accordance with high functionality and high integration while saving the space.

In addition, as illustrated in FIGS. 1 and 3, the semiconductor device SP1 includes the semiconductor chip 3 to be mounted over the wiring substrate 2. The semiconductor chip 3 includes a front surface (a main surface or a top surface) 3a (see FIG. 3), a back surface (a main surface or a bottom surface) 3b opposite to the front surface 3a, and a side surface 3s positioned between the front surface 3a and the back surface 3b. In addition, the semiconductor chip 3 is formed to have a quadrangular outer shape with a smaller plane area than the wiring substrate 2 in a plan view as illustrated in FIG. 1. In the example illustrated in FIG. 1, the semiconductor chip 3 is mounted on a central portion of the top surface 2a of the wiring substrate 2 such that the respective four side surfaces 3s extend along the respective four side surfaces 2s of the wiring substrate 2.

In addition, as illustrated in FIG. 5, the semiconductor chip 3 includes the plurality of pads (bonding pads) 3PD formed on the front surface 3a side. In the example illustrated in FIG. 5, the plurality of pads 3PD are formed at peripheral edge portion of the front surface 3a along each side of the front surface 3a (along the side surfaces 3s). In addition, in the example illustrated in FIG. 3, the semiconductor chip 3 is mounted over the wiring substrate 2 via the plurality of projecting electrodes 3BP in a state in which the front surface 3a opposes the top surface 2a of the wiring substrate 2. Such a mounting method is referred to as a face-down mounting method or a flip chip connection method.

The semiconductor chip 3 (to be specific, a semiconductor substrate as a base material of the semiconductor chip 3) is made of, for example, silicon (Si). In addition, an insulating film 3F is formed on the front surface 3a to cover the base material and wiring of the semiconductor chip 3, and a plurality of openings 3Fk are formed in the insulating film 3F. Each front surface of the plurality of pads 3PD is exposed from the insulating film 3F in the opening 3Fk formed in the insulating film 3F. In addition, each of the plurality of pads 3PD is made of metal and is made of aluminum (Al), for example, in the present embodiment.

In addition, as illustrated in FIGS. 3 and 5, the projecting electrodes (conductive members) 3BP are connected to the plurality of pads 3PD, respectively. The plurality of pads 3PD of the semiconductor chip 3 and the plurality of bonding fingers 2BF of the wiring substrate 2 are electrically connected to each other via the plurality of projecting electrodes 3BP. The projecting electrode 3BP is a metal member that is formed to project above the front surface 3a of the semiconductor chip 3. In other words, the projecting electrode 3BP is the conductive member configured to electrically connect a circuit formed in the semiconductor chip 3 and the bonding finger 2BF of the wiring substrate.

The following configuration can be exemplified as the projecting electrode 3BP. For example, it is possible to utilize a pillar bump (columnar electrode) in which a solder film is formed on a tip surface of a conductive post made of copper (Cu) or nickel (Ni), as the projecting electrode 3BP. Further, for example, it is possible to utilize a stud bump in which metal melted by making use of a ball bonding technique is bonded to the pad 3PD, as the projecting electrode 3BP. Further, for example, it is possible to utilize a solder bump in which the solder material itself is used as the projecting electrode 3BP, as the projecting electrode 3BP. In the present embodiment, as a representative example, a description will be given by featuring a case in which the projecting electrode 3BP is the pillar bump.

In addition, as illustrated in FIG. 3, a resin body 4 is arranged between the semiconductor chip 3 and the wiring substrate 2. The resin body 4 is arranged so as to close a space between the front surface 3a of the semiconductor chip 3 and the top surface 2a of the wiring substrate 2. In other words, the resin body 4 is in close contact with (in contact with) both the solder resist film SR1 of the wiring substrate 2 and the front surface 3a of the semiconductor chip 3.

In addition, the resin body 4 is made of an insulating (non-conductive) material and is arranged so as to seal parts (bonding portions of the plurality of projecting electrodes 3BP) to electrically connect the semiconductor chip 3 and the wiring substrate 2. In this manner, the resin body 4 is arranged to seal the bonding portions of the plurality of projecting electrodes 3BP, so that the electrically connected parts between the semiconductor chip 3 and the wiring substrate 2 can be protected. In addition, the resin body 4 is in close contact with the wiring substrate 2 and the semiconductor chip 3, so that stress which is generated on the connection part of the projecting electrode 3BP can be dispersed. The resin body 4 is formed, for example, by mixing filler particles such as silica ($SiO_2$) in an epoxy resin and then thermally curing the resin.

<Details of Structure Between Semiconductor Chip and Wiring Substrate>

Figure 6:
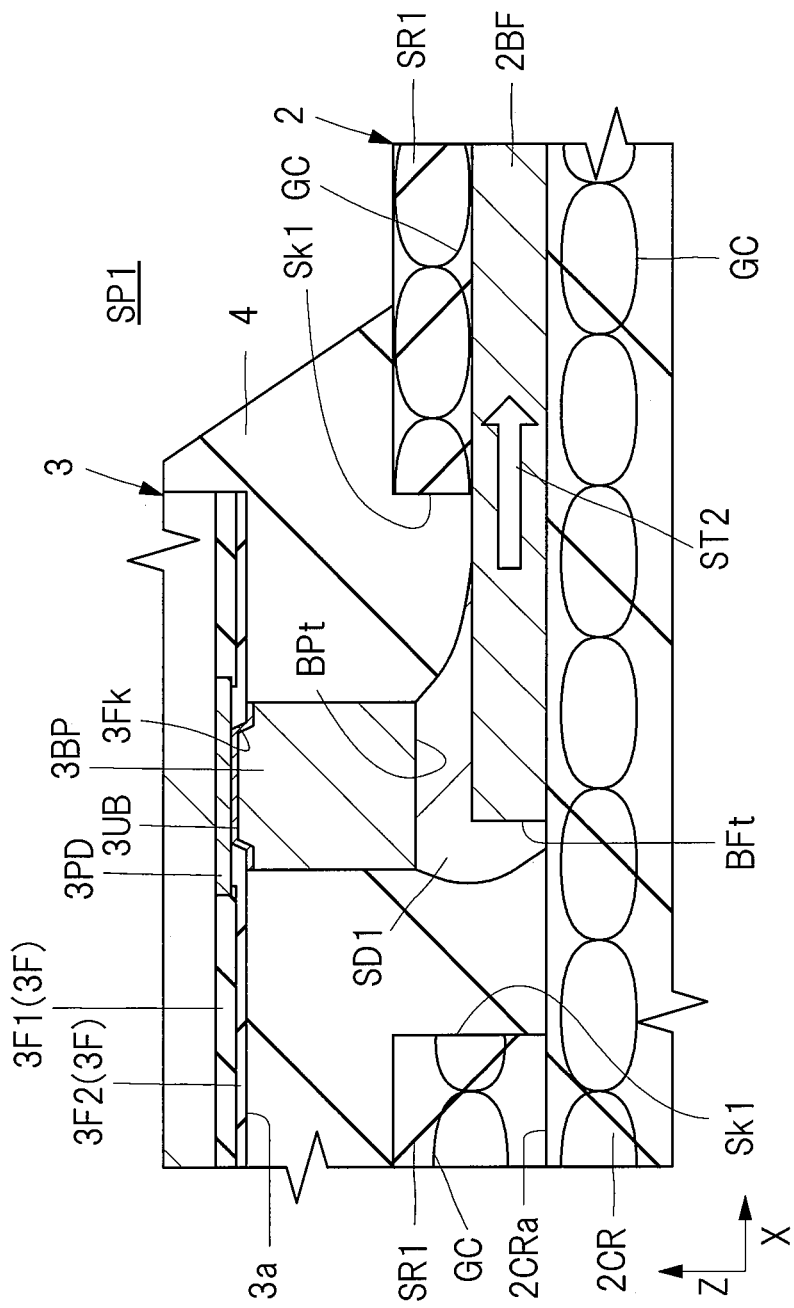
FIG. 6 is an enlarged cross-sectional view of a part which electrically connects the semiconductor chip and the wiring substrate illustrated in FIG. 3.
Figure 7:
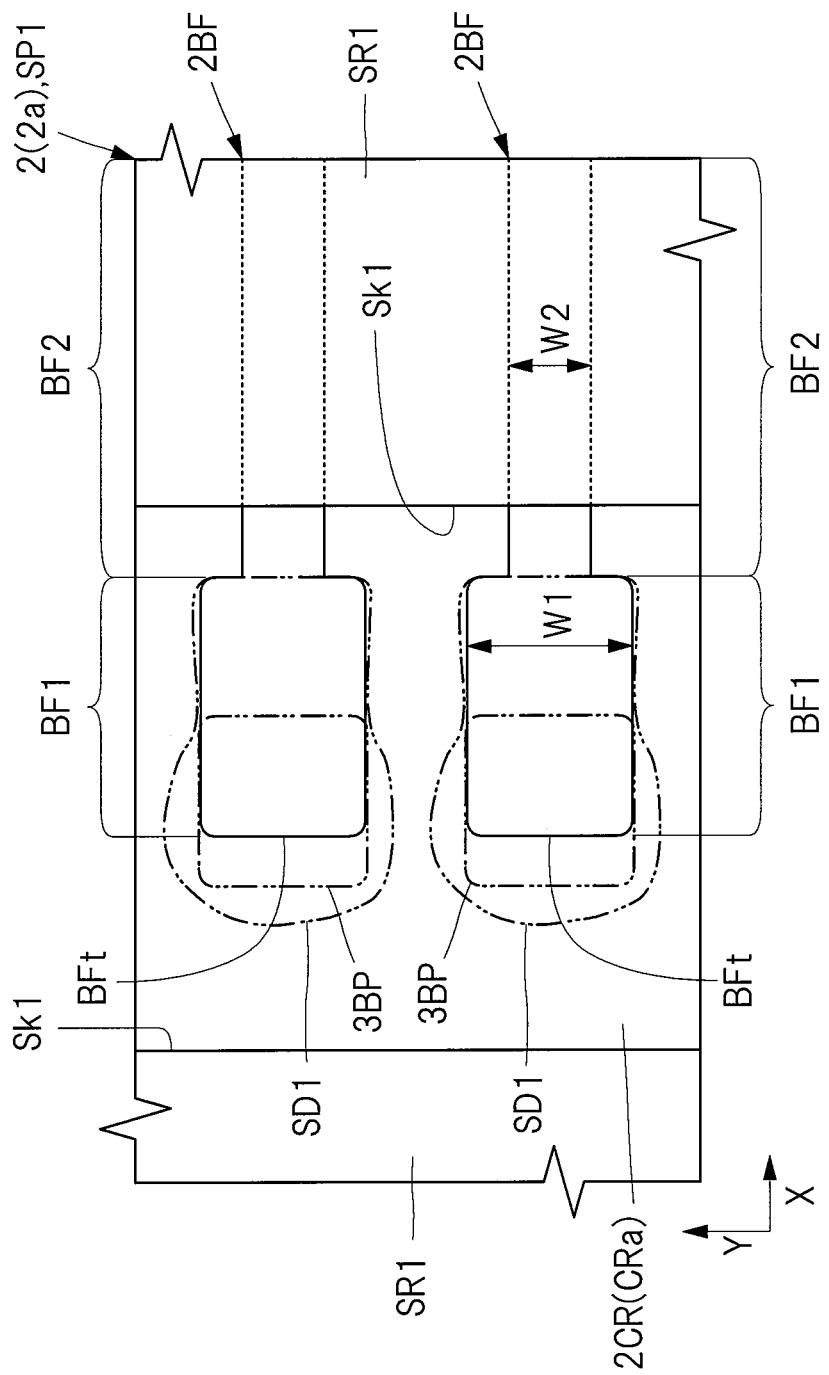
FIG. 7 is an enlarged plan view corresponding to the cross section illustrated in FIG. 6.
Figure 34:
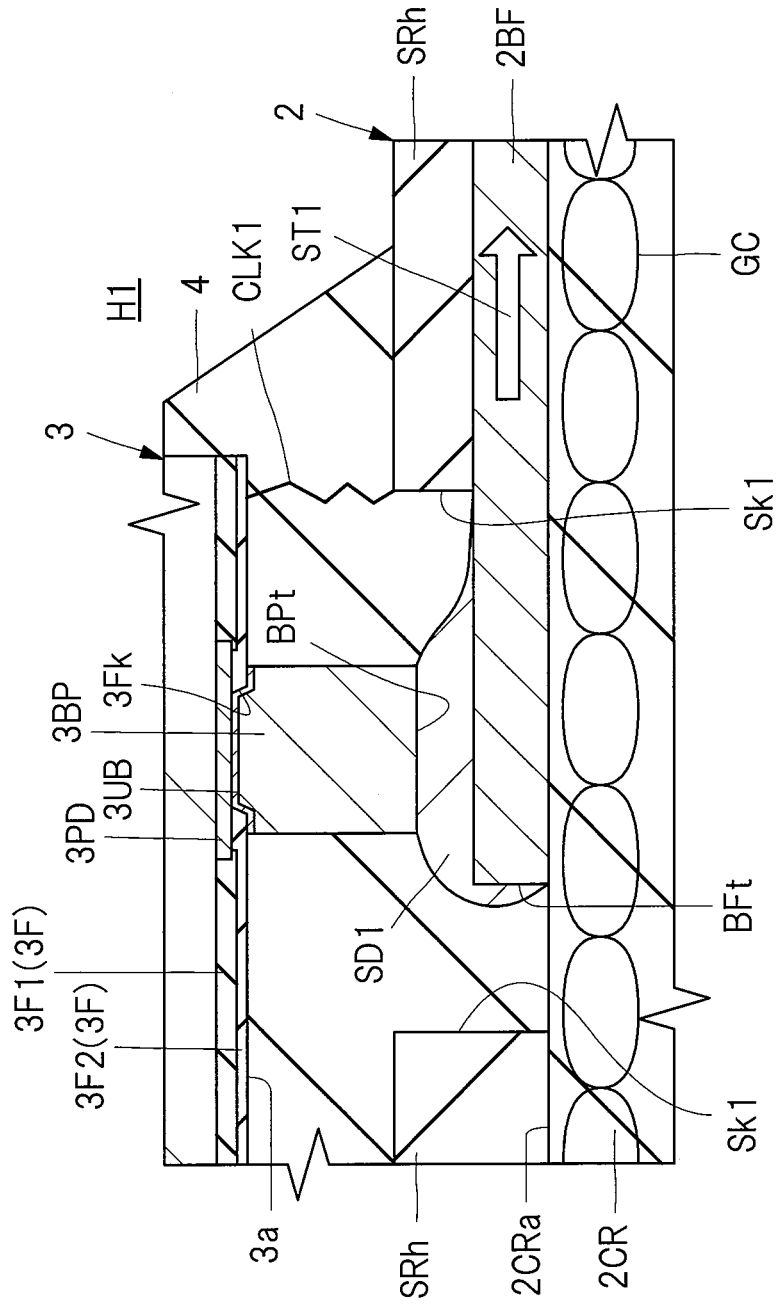
FIG. 34 is an enlarged cross-sectional view of a semiconductor device as a comparative example with respect to FIG. 6.

Next, a description will be given regarding details of a structure between the semiconductor chip 3 and the wiring substrate 2 illustrated in FIG. 3. FIG. 6 is an enlarged cross-sectional view of a part which electrically connects the semiconductor chip and the wiring substrate illustrated in FIG. 3. In addition, FIG. 34 is an enlarged cross-sectional view of a semiconductor device as a comparative example with respect to FIG. 6. In addition, FIG. 7 is an enlarged plan view corresponding to the cross-section illustrated in FIG. 6. Incidentally, in FIG. 7, an illustration of the semiconductor chip 3 and the resin body 4 illustrated in FIG. 6 is omitted in order to facilitate the understanding of a positional relationship in a plan view between the projecting electrode 3BP and the bonding finger 2BF illustrated in FIG. 6. In addition, the projecting electrode 3BP and the solder material SD1 are illustrated by a two-dot chain line in FIG. 7.

As illustrated in FIG. 6, the bonding finger 2BF serving as the terminal of the wiring substrate 2 is formed on the top surface 2CRa of the base material layer 2CR. In addition, the solder resist film SR1 is formed on the top surface 2CRa of the base material layer 2CR, and a part (apart formed outside the opening Sk1) of the bonding finger 2BF is covered with the solder resist film SR1. In addition, a part formed inside the opening Sk1 of the solder resist film SR1 of the bonding finger 2BF is exposed from the solder resist film SR1.

In other words, as illustrated in FIG. 7, each of the plurality of bonding fingers 2BF includes a bond portion BF1 which is a part connecting the projecting electrode 3BP. The bond portion BF1 is formed inside the opening Sk1 and is exposed from the solder resist film SR1. In addition, each of the plurality of bonding fingers 2BF includes a wiring portion BF2 to be connected to the bond portion BF1. The wiring portion BF2 is extended from the connection part with the bond portion BF1 toward the solder resist film SR1. In addition, a part of the wiring portion BF2 is formed at an outer side of the opening Sk1 and is covered with the solder resist film SR1.

In addition, in the present embodiment, the wiring portion BF2 is coupled with one side surface of the bond portion BF1, and the wiring portion BF2 is not connected to a side surface opposite thereto. That is, the bond portion BF1 includes a tip surface (tip side) BFt of the bonding finger 2BF opposite to the side surface coupled with the wiring portion BF2.

In addition, in the example illustrated in FIG. 7, a planar shape of the bond portion BF1 is formed in a quadrangular shape, and particularly specifically in a rectangular shape. A length in a short-side direction, which corresponds to a width W1 of the bond portion BF1, is about 10 µm to 40 µm, for example. In addition, a length in a long-side direction of the bond portion BF1 is about 50 µm to 70 µm, for example. In addition, in the example illustrated in FIG. 7, a width W2 of the wiring portion BF2 is smaller than the width W1 of the bond portion BF1 and is about 5 µm to 40 µm, for example. However, there is also a case in which the width W1 of the bond portion BF1 and the width W2 of the wiring portion BF2 are set to be the same value as a modified example with respect to FIG. 7. Further, there is also a case in which the width W2 of the wiring portion BF2 is set to be a value larger than the width W1 of the bond portion BF1.

In addition, the pad 3PD serving as an electrode of the semiconductor chip 3 is formed on the front surface 3a side of the semiconductor chip 3. To be specific, the semiconductor chip 3 includes a plurality of wiring layers to be laminated on the front surface 3a side, and the pad 3PD is formed on an uppermost layer (a wiring layer at the lowermost side in the case of FIG. 6 since the face-down mounting method is adopted in the example illustrated in FIG. 6) among the plurality of wiring layers. The front surface 3a of the semiconductor chip 3 is covered with the insulating film 3F, and the pad 3PD is exposed from the insulating film 3F in the opening 3Fk formed in the insulating film 3F. In the example illustrated in FIG. 6, the insulating film 3F is a laminated film in which an insulating film 3F1 and an insulating film 3F2 are laminated. The insulating film 3F1 is an inorganic insulating film (a passivation film) made of, for example, silicon oxide ($SiO_2$), silicon nitride (SiN), or the like. In addition, the insulating film 3F2 is a resin insulating film made of, for example, a polyimide resin or the like. Incidentally, various types of modified examples are present regarding the insulating film 3F, and there is also a case in which the insulating film 3F2 is not formed, for example.

In addition, the pad 3PD of the semiconductor chip 3 is electrically connected to the bonding finger 2BF of the wiring substrate 2 via a conductive member. In the example illustrated in FIG. 6, the above-described conductive member includes the projecting electrode 3BP. The projecting electrode 3BP according to the present embodiment is made of, for example, copper (Cu) and is a columnar electrode formed in a prism. To be specific, the projecting electrode 3BP is formed to have a quadrangular shape with chamfered corners in a plan view, as illustrated in FIG. 5. Incidentally, a shape of the columnar electrode is not limited to the prism shape but can be formed in a cylindrical shape, for example.

A length of a side of the columnar projecting electrode 3BP in a plan view illustrated in FIGS. 5 and 7 is about 25 µm to 35 µm. In addition, a height of the projecting electrode 3BP illustrated in FIG. 6 (a distance from a bonding interface with the underlying metal film 3UB to the tip surface BPt) is about 27 µm to 40 µm.

The columnar projecting electrode 3BP is formed on the pad 3PD with an underlying metal film (under bump metal) 3UB interposed therebetween. The underlying metal film 3UB is a metal film configured to improve connectivity (for example, an electrical characteristic and connection strength) between the pad 3PD made of, for example, aluminum and the projecting electrode 3BP made of copper and is made of a metal material, for example, a nickel (Ni) or the like.

In addition, the projecting electrode 3BP and the bonding finger 2BF are are electrically connected via the solder material SD1 which is the conductive member. The solder material SD1 can be made using a lead-free solder, similarly to the solder ball SB which has been described with reference to FIG. 3, for example. The use of the solder material SD1 as the conductive member which electrically connects the projecting electrode 3BP and the bonding finger 2BF is preferable in terms of the following points. That is, when the solder material and a non-connection part are heated to a temperature higher than a melting point of a solder component included in the solder material SD1 and thereafter, are cooled, an alloy layer is formed in the bonding interface between the solder material SD1 and an object to be connected. The process to perform heating to the temperature higher than the melting point of the solder component and then cooling is referred to as a reflow process, and it is possible to collectively process a large number of terminals even in a case in which there are a large number of the terminals. In addition, the alloy layer is formed in the connection interface between the solder material SD1 and the object to be connected even in the case in which a large number of the terminals are collectively processed, and thus, it is easy to secure a required connection strength.

In addition, a periphery of apart that electrically connects the semiconductor chip 3 and the wiring substrate 2, that is, in the example illustrated in FIG. 6, a periphery of each part of the pad 3PD, the underlying metal film 3UB, the projecting electrode 3BP, the solder material SD1, and the bonding finger 2BF exposed from the solder resist film SR1 is sealed by the resin body 4.

Here, it is necessary to suppress peeling-off of a close contact interface (contact interface) between the resin body 4 and the semiconductor chip 3, and the close contact interface between the resin body 4 and the wiring substrate 2 in order to allow the resin body 4 to function as a sealing body. However, there is a large difference in thermal expansion coefficients between the resin material (for example, the resin mainly composed of the epoxy resin) forming the resin body 4 and the semiconductor chip 3 (particularly, silicon forming the semiconductor substrate). Thus, when a temperature cyclic load under which temperature rise and temperature drop are repeated is applied to the close contact interface with large difference in thermal expansion coefficient, the stress is generated on the close contact interface, which causes generation of the peeling-off or the like. To be specific, examples of the thermal expansion coefficient include a linear expansion coefficient which is an indicator of an expansion rate in a linear direction and a volumetric expansion coefficient which is an indicator of an expansion rate in a three-dimensional space, and a difference in the linear expansion coefficient has a great influence on the generation of the stress caused by the temperature cyclic load.

Thus, as described above, the resin body 4 is mixed with the filler particles, for example, silica or the like, which has a value of the linear expansion coefficient close to that of silicon. For example, a mixing ratio of the filler particles is preferably equal to or higher than 50 wt % (aweightpercentage), andthefillerparticles are mixed at about 50 wt % to 80 wt %. A linear expansion coefficient of the semiconductor chip 3 is about 4 ppm (parts per million). With respect to this, in the present embodiment, the filler particles are mixed at equal to or higher than 50 wt % in the resin body 4, and accordingly a linear expansion coefficient of the resin body 4 is about, for example, 25 ppm to 30 ppm. In this manner, the linear expansion coefficient of the resin body 4 is set close to the linear expansion coefficient of the semiconductor chip 3, so that the peeling-off of the close contact interface between the semiconductor chip 3 and the resin body 4 can be suppressed.

Meanwhile, the inventors of the present application have performed an examination and as a result, found out that there are problems as follows only when the linear expansion coefficient of the resin body 4 is simply reduced. The inventors of the present application have found out the following problems in a temperature cyclic test in which a heating process and a cooling process are repeatedly performed with respect to a completed semiconductor package (inspection object). However, it is considered that the following problems are generated depending on not only the case in which the temperature cyclic test is implemented, but also the temperature cyclic load under the actual use environment after mounting the semiconductor package. Hereinafter, a description will be given in detail regarding the problems that have been found as a result of the examination by the inventors of the present application.

In the present embodiment, as described above, most of the top surface 2a of the wiring substrate 2 is covered with the solder resist film SR1. Accordingly, when a linear expansion coefficient of the solder resist film SR1 is large, there is a concern that the peeling-off is caused in the close contact interface between the resin body 4 and the solder resist film SR1 by the temperature cyclic load.

For example, in the case of a semiconductor device H1 illustrated in FIG. 34, a ratio of the filler particles to be mixed in a solder resist film SRh is about equal to or lower than 30 wt %, for example. In addition, the glass fiber is not mixed. In this case, the linear expansion coefficient of the solder resist film SRh is about 500 ppm to 1000 ppm (that is, about 0.05% to 0.1%) and becomes a value equal to or more than ten times the linear expansion coefficient of the resin body 4.

In addition, as illustrated in FIG. 34, when the opening Sk1 is formed in the solder resist film SRh, there is a case in which the stress is concentrated on an end portion of the opening Sk1 due to the temperature cyclic load, and as schematically illustrated in FIG. 34, a crack CLK1 occurs in the resin body 4. According to the examinations of the inventors of the present application, the crack CLK1 is generated starting from an opening end portion (edge portion) of the opening Sk1 of the solder resist film SR1 in many cases.

In addition, when the crack CLK1 is generated, the generated crack CLK1 develops in a vicinity of the generation point thereof and damages the conductive pattern into which the the crack CLK develops, for example, in the example illustrated in FIG. 34, apart of the bonding finger 2BF or a part of the wiring layer laminated on the front surface 3a side of the semiconductor chip 3 in some cases.

In addition, even when the crack CLK1 does not occur, it has found out that the following problems are generated. That is, in a case in which the linear expansion coefficient of the solder resist film SRh is large, the bonding finger 2BF is pulled in a direction of the solder resist film SRh by the solder resist film SRh. FIG. 34 schematically illustrates the direction in which the bonding finger 2BF is pulled toward the solder resist film SRh by denoting the direction by an arrow ST1. When the tensile force is generated in the direction of the arrow ST1 illustrated in FIG. 34, a force acts on the bonding portion between the solder material SD1 and the bonding finger 2BF in a direction of causing the bonding interface to be peeled off. Further, it has been found out that the peeling-off occurs in some of the connection interfaces of the parts that electrically connect the semiconductor chip 3 and the wiring substrate 2 when such a force repeatedly acts. To be specific, it has been found out that the peeling-off of the connection interface occurs at any one point or a plurality of points among a connection interface between the solder material SD1 and the bonding finger 2BF, a connection interface between the solder material SD1 and the projecting electrode 3BP, a connection interface between the projecting electrode 3BP and the underlying metal film 3UB, and a connection interface between the underlying metal film 3UB and the pad 3PD or the insulating film 3F.

In addition, it has been found out that it is necessary to consider a balance in the linear expansion coefficients of the respective laminated materials in addition to simply reducing the linear expansion coefficient of the solder resist film SRh in order to improve the durability of the entire semiconductor package with respect to the temperature cyclic load. For example, when the linear expansion coefficient of the solder resist film SRh is set to be smaller than a linear expansion coefficient of the base material layer 2CR, there is a case in which the peeling-off caused by the temperature cyclic load occurs in a close contact interface between the solder resist film SRh and the base material layer 2CR. In addition, when the glass fiber (the fiber material) GC (see FIG. 6) is excessively mixed in order to reduce the linear expansion coefficient of the solder resist film SRh, the processability of the solder resist film SRh is degraded. Thus, it is difficult to accurately form the opening Sk1, for example.

Thus, the inventors of the present application have conducted an additional examination and have found out the configuration of the present embodiment. That is, in the present embodiment, the solder resist film SR1 includes the plurality of filler particles. In addition, as schematically illustrated in FIG. 6, the solder resist film SR1 includes glass fibers GC. When the glass fiber GC is mixed in the solder resist film SR1, the linear expansion coefficient of the solder resist film SR1 can be reduced.

In the present embodiment, the value of the linear expansion coefficient of the solder resist film SR1 is adjusted by mixing the plurality of filler particles and the glass fiber in the solder resist film SR1. That is, ideally, it is preferable that the respective values of the linear expansion coefficients be sequentially reduced in the order of the resin body 4, the solder resist film SR1, and the base material layer 2CR. Further, it is preferable that the respective values of the linear expansion coefficients be sequentially reduced in the order of the resin body 4, the solder resist film SR1, the bonding finger 2BF, and the base material layer 2CR.

In addition, the linear expansion coefficient of the solder resist film SR1 and the linear expansion coefficient of the resin body 4 may be the same. However, in such a case, the linear expansion coefficient of the solder resist film SR1 is required to set to be larger than the linear expansion coefficient of the base material layer 2CR.

In addition, the linear expansion coefficient of the solder resist film SR1 and the linear expansion coefficient of the base material layer 2CR may be the same. However, in such a case, the linear expansion coefficient of the solder resist film SR1 is required to set to be smaller than the linear expansion coefficient of the resin body 4.

The above-described relationships among the linear expansion coefficients can be summarized as follows. That is, the linear expansion coefficient of the solder resist film SR1 is equal to or larger than the linear expansion coefficient of the base material layer 2CR, the linear expansion coefficient of the solder resist film SR1 is equal to or smaller than the linear expansion coefficient of the resin body 4, and the linear expansion coefficient of the base material layer 2CR is smaller than the linear expansion coefficient of the resin body 4.

In other words, when the linear expansion coefficient of the base material layer 2CR is set to α1, the linear expansion coefficient of the solder resist film SR1 is set to α2, and the linear expansion coefficient of the resin body 4 is set to α3, $$\alpha 1 \leq \alpha 2 < \alpha 3 \quad \text{(Formula 1)}$$

$$\alpha 1 < \alpha 2 \leq \alpha 3 \quad \text{(Formula 2)}$$

the relationship of the above-described (Formula 1) or the above-described (Formula 2) is satisfied.

In the example illustrated in FIG. 6, the linear expansion coefficient of the semiconductor chip 3 (to be specific, the semiconductor substrate provided in the semiconductor chip 3) is about 4 ppm. In addition, the linear expansion coefficient of the resin body 4 to be in close contact with the semiconductor chip 3 and the solder resist film SR1 is 25 ppm to 30 ppm. In addition, the linear expansion coefficient of the solder resist film SR1 is within the range of 15 ppm to 30 ppm and further, is equal to or smaller than the value of the linear expansion coefficient of the resin body 4. In addition, the linear expansion coefficient of the base material layer 2CR is 10 to 15 ppm and is equal to or smaller than the value of the linear expansion coefficient of the solder resist film SR1.

According to the above-described configuration, even in a case in which the temperature cyclic load is applied to the semiconductor device SP1 in which the plurality of members with the different linear expansion coefficients are laminated, the peeling-off of the close contact interfaces of the respective insulating layers can be suppressed. Thus, the reliability of the semiconductor device can be improved.

In addition, a linear expansion coefficient of the bonding finger 2BF is within the range of 15 ppm to 17 ppm and is equal to or smaller than the value of the linear expansion coefficient of the solder resist film SR1. When the linear expansion coefficient of the bonding finger 2BF and the linear expansion coefficient of the solder resist film SR1 satisfy the above-described relationship, the peeling-off of the close contact interface of the insulating layer that is in close contact with the bonding finger 2BF can be suppressed, which is more preferable.

In the present embodiment, the reason that the glass fiber GC is mixed in the solder resist film SR1 is for efficiently reducing the linear expansion coefficient of the solder resist film SR1. If the relationship of the above-described (Formula 1) or the above-described (Formula 2) can be satisfied by mixing the filler particle in the solder resist film SR1, a modified example in which the fiber material is not mixed can be considered. However, it is difficult to satisfy the relationship of the above-described (Formula 1) or the above-described (Formula 2) without mixing the glass fiber GC. On the contrary, if the solder resist film SR1 is caused to include the glass fiber GC, the relationship of the above-described (Formula 1) or the above-described (Formula 2) can be satisfied in a relatively easy manner.

Incidentally, although the peeling-off occurring in some of the connection interfaces that electrically connect the semiconductor chip 3 and the wiring substrate 2 among the problems that have been described with reference to FIG. 34 can be suppressed by employing the solder resist film SR1 that satisfies the relationship of the above-described (Formula 1) or the above-described (Formula 2), as means for more reliably solving this problem, the semiconductor device SP1 according to the present embodiment further includes the following configuration.

That is, in the present embodiment as illustrated in FIG. 6, the projecting electrode 3BP is connected to a position to overlap, in a thickness direction, with a tip of the bonding finger 2BF in an extending direction. To be specific, as illustrated in FIG. 7, each of the plurality of bonding fingers 2BF includes the bond portion BF1 which is the part to which the projecting electrode 3BP is connected via the solder material SD1. The bond portion BF1 includes a tip surface (tip side) BFt, which is arranged inside the opening Sk1 of the solder resist film SR1 and is positioned at the tip of the bonding finger 2BF in the extending direction (an X direction in the example illustrated in FIG. 7) in a plan view. Incidentally, as illustrated in FIG. 6, the tip surface BFt is a side surface positioned at the tip of the bonding finger 2BF in the extending direction (the X direction in FIG. 6) but can be considered as a side in the plan view as illustrated in FIG. 7. Accordingly, in the description of the present embodiment, there is a case in which the tip surface BFt is expressed as the tip surface (the tip side) BFt.

In addition, each of the plurality of bonding fingers 2BF includes the wiring portion BF2 which extends from the bond portion BF1 in an opposite direction to the tip surface (the tip side) BFt, and a part of the wiring portion BF2 is covered with the solder resist film SR1. Further, in the plan view, the plurality of projecting electrodes 3BP overlap with the tip surfaces (the tip sides) BFt of the bond portions BF1 included in the plurality of bonding fingers 2BF, respectively.

As in the present embodiment, when the projecting electrode 3BP and the tip surface (the tip side) BFt of the bonding finger 2BF are arranged to overlap with each other in the thickness direction, that is, when the semiconductor chip 3 is arranged (mounted) such that a part of the projecting electrode 3BP protrudes from the tip surface (the tip side) BFt of the bonding finger 2BF, the amount of the solder material SD1 to be arranged immediately below the projecting electrode 3BP increases. To be specific, it is possible to increase a thickness (thickness in the extending direction (the X direction in FIG. 6) of the bonding finger 2BF) of a part of the solder material SD1 which covers the tip surface BFt of the bonding finger 2BF. The solder material SD1 is a material with a lower elasticity than a major metal material (for example, copper) forming the bonding finger 2BF or the projecting electrode 3BP. As schematically illustrated with an arrow ST2 in FIG. 6, in a case in which the tensile force which pulls the bonding finger 2BF in the direction of the solder resist film SR1 is generated due to the temperature cyclic load, the stress is generated in the periphery of the connection part of the projecting electrode 3BP also even in the case of the present embodiment.

However, in the case of the present embodiment, the amount of the part of the solder material SD1 which covers the tip surface BFt illustrated in FIG. 6 increases, where the solder material SD1 is arranged on a lower side of the projecting electrode 3BP. Thus, since the solder material SD1 including the part which covers the tip surface BFt is elastically deformed, the stress can be mitigated. In other words, by increasing the arrangement amount of the solder material SD1 in the vicinity of the tip surface (the tip side) BFt on which the concentration of the stress is likely to occur due to the temperature cyclic load, the concentration of the stress can be suppressed through the elastic deformation function of the solder material SD1.

In addition, in the present embodiment, as described above, the linear expansion coefficient of the solder resist film SR1 is equal to or larger than the linear expansion coefficient of the base material layer 2CR, the linear expansion coefficient of the solder resist film SR1 is equal to or smaller than the linear expansion coefficient of the resin body 4, and the linear expansion coefficient of the base material layer 2CR is smaller than the linear expansion coefficient of the resin body 4. Thus, the tensile force (the force indicated by the arrow ST2 in FIG. 6) which is generated in the case in which the temperature cyclic load is applied to the semiconductor device SP1 is smaller than the tensile force (the force indicated by the arrow ST1 in FIG. 34) which is generated in the case in which the temperature cyclic load is applied to the semiconductor device H1 illustrated in FIG. 34. Accordingly, in the semiconductor device SP1, as compared to the semiconductor device H1, a phenomenon in which the peeling-off occurs in some of the connection interfaces among the parts that electrically connect the semiconductor chip 3 and the wiring substrate 2 can be suppressed.

In addition, as illustrated in FIG. 7, in the present embodiment, a width (length in a direction orthogonal to the extending direction of the bonding finger 2BF) W1 of the bond portion BF1 is larger than a width (length in the direction orthogonal to the extending direction of the bonding finger 2BF) W2 of the wiring portion BF2. In this manner, by setting the width W1 of the bond portion BF1 to be larger than the width W2 of the wiring portion BF2, it is accordingly possible to increase a bonding area between the bond portion BF1 and the solder material SD1. Thus, a bonding strength between the solder material SD1 and the bonding finger 2BF can be improved. However, although not illustrated, as a modified example with respect to the present embodiment, it is also possible to set the width W1 of the bond portion BF1 and the width W2 of the wiring portion BF2 to be the same. Further, it is also possible to set the width W2 of the wiring portion BF2 to be a value larger than the width W1 of the bond portion BF1.

In addition, in the example illustrated in FIG. 4, the wiring portion BF2 of the bonding finger 2BF extends from the bond portion BF1 formed inside the opening Sk1 toward a peripheral edge portion of the wiring substrate 2 (in other words, toward the side surface 2s). However, as a modified example, it is also possible to allow the wiring portion BF2 to extend inwardly from the bond portion BF1 formed inside the opening Sk1 toward the center of the top surface 2a of the wiring substrate 2. In addition, it is also possible to arrange a plurality of the bond portions BF1 in the single opening Sk1 in a plurality of columns as another modified example with respect to the present embodiment. This modified example will be described later.

In addition, the mode of the embodiment in which the glass fiber GC is included in the solder resist film SR1 on the chip mounting surface side has been described in the present embodiment. Meanwhile, there is no direct relationship between the solder resist film SR2 on the mounting surface side illustrated in FIG. 3 and the part that electrically connects the semiconductor chip 3 and the wiring substrate 2, and thus, it is also possible to form the solder resist film without allowing the glass fiber GC (see FIG. 6) to be included. However, it is preferable to set the linear expansion coefficients of the solder resist film SR1 and the solder resist film SR2 to be uniform in a point of view of suppressing warp deformation of the wiring substrate 2. Accordingly, it is preferable that the solder resist film SR2 include the glass fiber GC, similarly to the solder resist film SR1. In addition, it is preferable that the linear expansion coefficient of the solder resist film SR2 be equal to or larger than the linear expansion coefficient of the base material layer 2CR and be the same degree as the linear expansion coefficient of the solder resist film SR1. In the present embodiment, the linear expansion coefficient of the solder resist film SR2 illustrated in FIG. 3 is set to a value within the range of 10 ppm to 30 ppm, and further, to be equal to or larger than the linear expansion coefficient of the base material layer 2CR.

<Method of Manufacturing Semiconductor Device>

Figure 8:
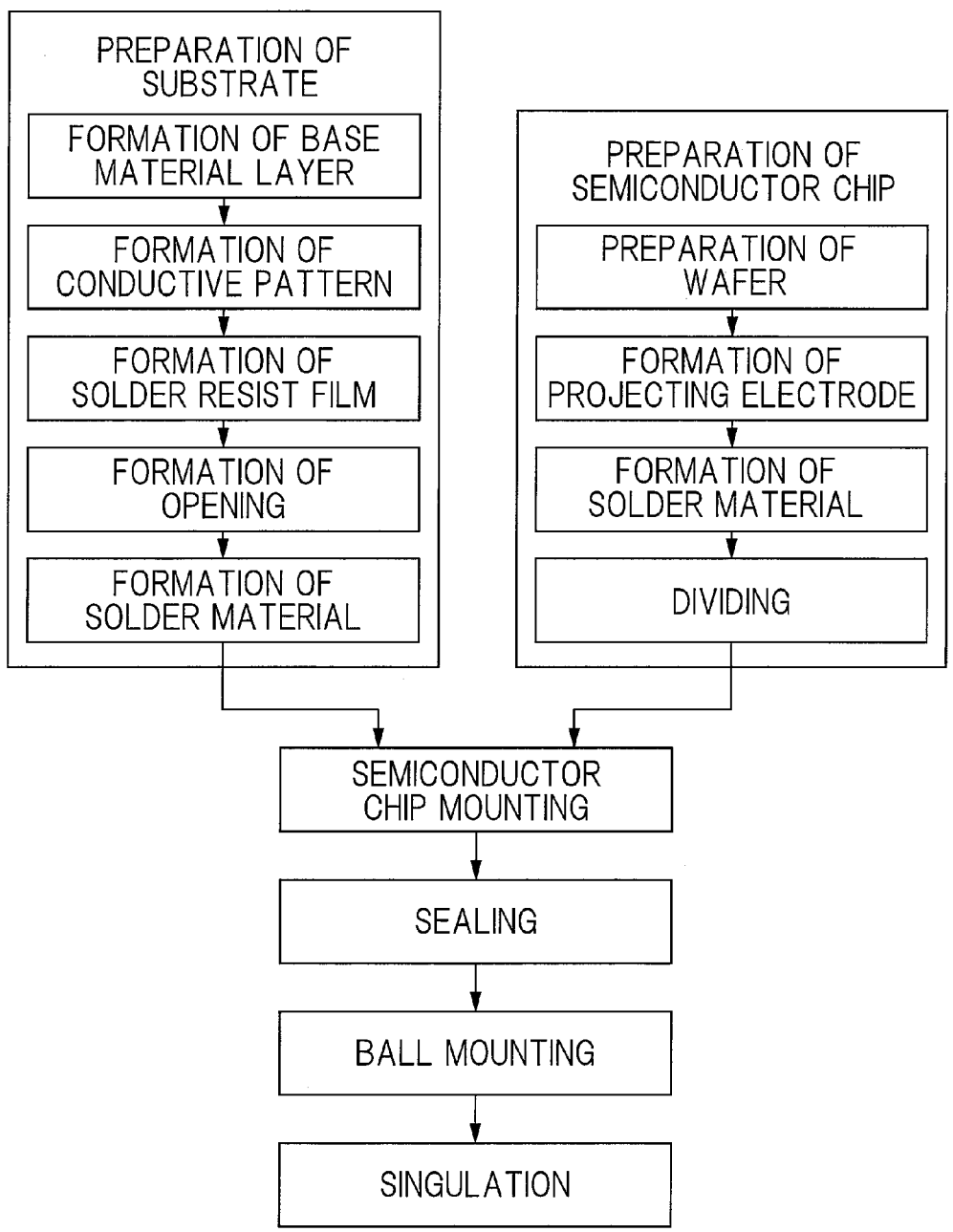
FIG. 8 is an explanatory view illustrating an outline of a manufacturing step of the semiconductor device that has been described with reference to FIGS. 1 to 7.

Next, a description will be given regarding a manufacturing step of a semiconductor device SP1 that has been described with reference to FIGS. 1 to 7. The semiconductor device SP1 is manufactured along a flow illustrated in FIG. 8. FIG. 8 is an explanatory view illustrating an outline of the manufacturing step of the semiconductor device that has been described with reference to FIGS. 1 to 7.

<Substrate Preparation Step>

Figure 9:
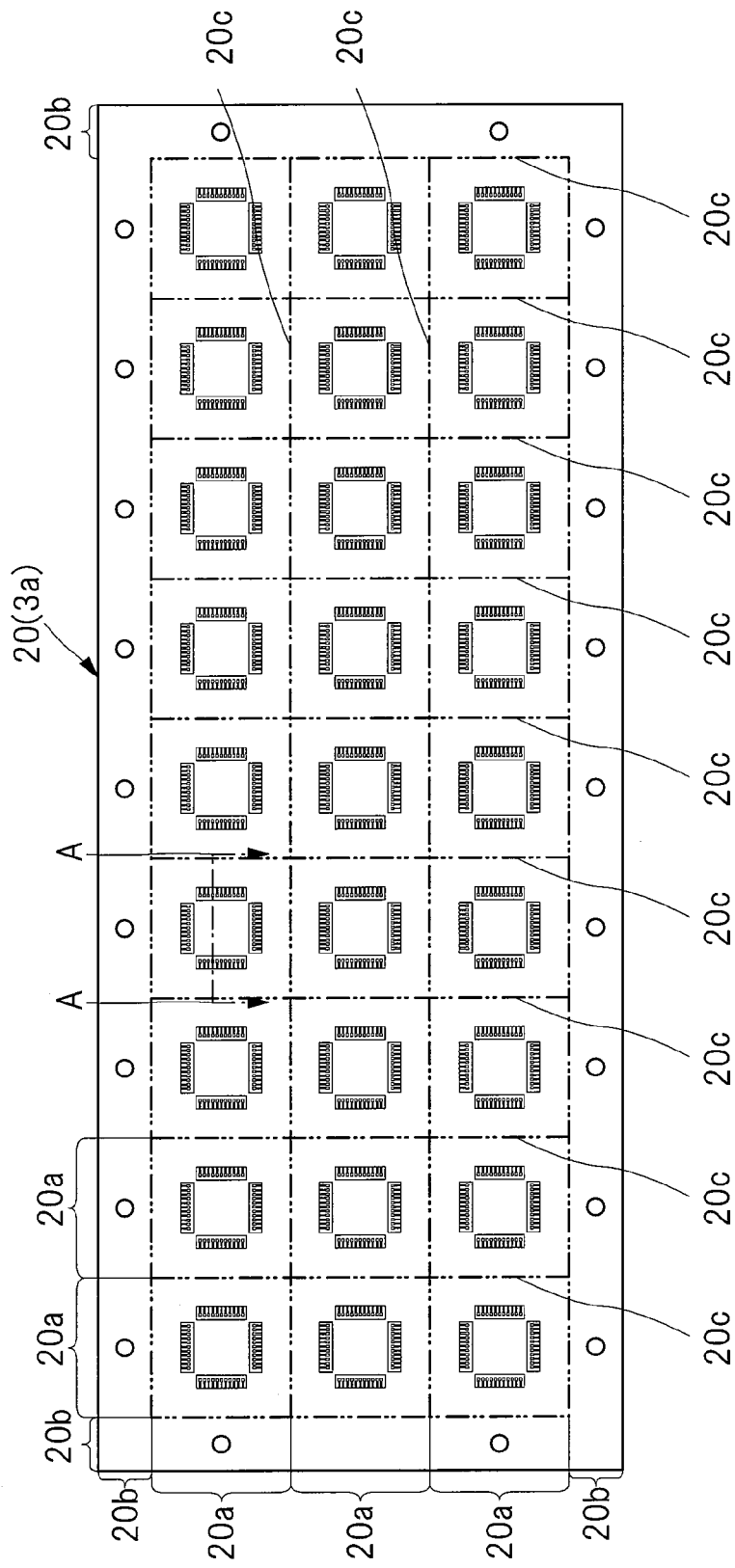
FIG. 9 is a plan view illustrating an overall structure of the wiring substrate to be prepared in a substrate preparation step illustrated in FIG. 8.
Figure 10:
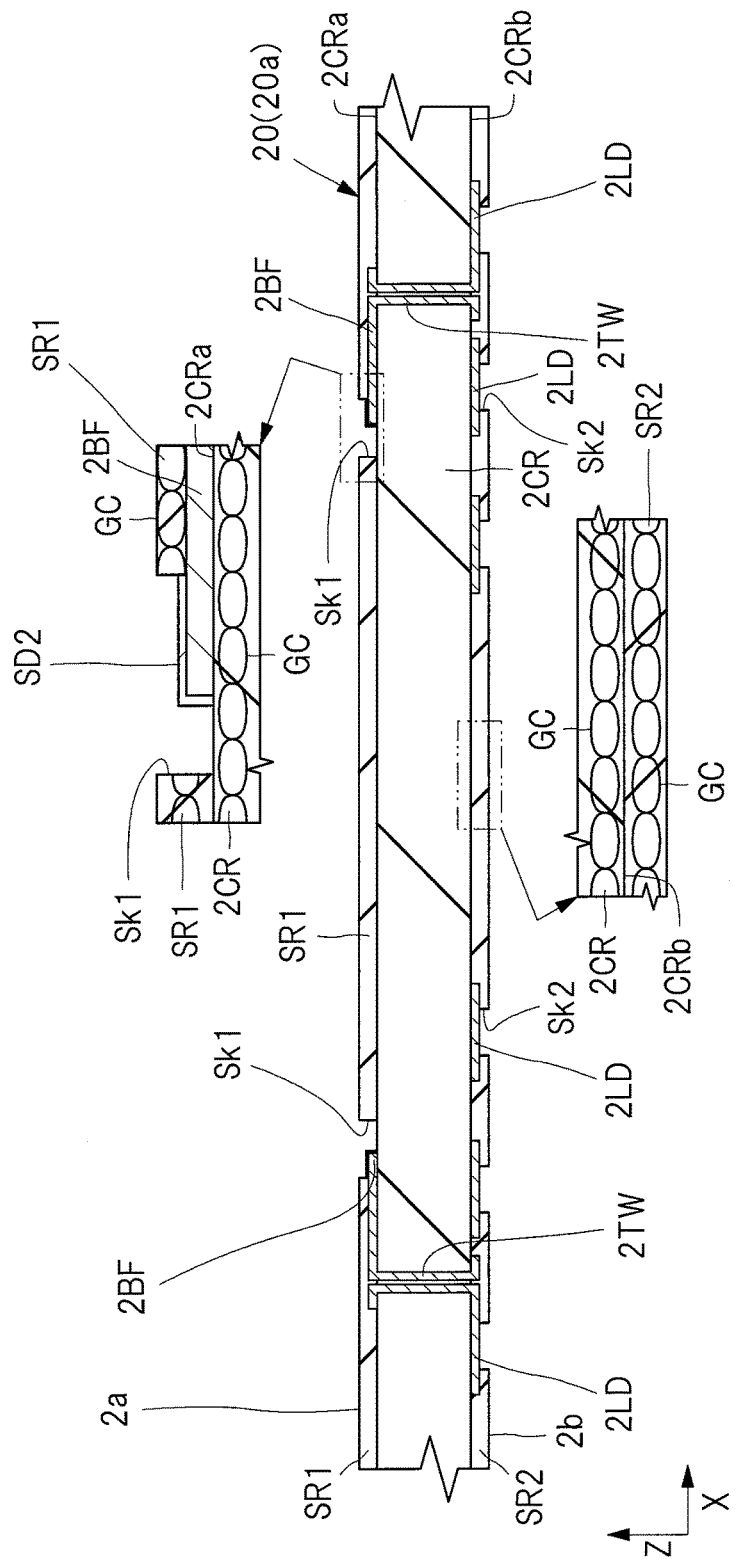
FIG. 10 is an enlarged cross-sectional view taken along a line A-A of FIG. 9.

First, a wiring substrate 20 illustrated in FIGS. 9 and 10 is prepared in a substrate preparation step illustrated in FIG. 8. FIG. 9 is a plan view illustrating an overall structure of the wiring substrate to be prepared in the substrate preparation step illustrated in FIG. 8, and FIG. 10 is an enlarged cross-sectional view taken along a line A-A of FIG. 9. Incidentally, FIG. 10 also illustrates an enlarged view of a periphery of the bonding finger 2BF in order to illustrate the solder material SD2 formed on an exposed surface of the bonding finger 2BF. In addition, FIG. 10 also illustrates an enlarged view of a partial adhesion interface between the solder resist film SR2 and the base material layer 2CR in order to clearly illustrate that the solder resist film SR2 on the mounting surface side includes the glass fiber GC.

As illustrated in FIG. 9, the wiring substrate 20 to be prepared in the present step includes a plurality of product forming regions 20a inside a frame portion (frame body) 20b. To be specific, the plurality of (27 in FIG. 9) product forming regions 20a are arranged in a matrix form. The wiring substrate 20 is a so-called multi-piece substrate including the plurality of product forming regions 20a corresponding to the wiring substrate 2 illustrated in FIG. 3 and dicing lines (dicing regions) 20c between the respective product forming regions 20a. In this manner, by using the multi-piece substrate including the plurality of product forming regions 20a, a manufacturing efficiency can be improved.

Incidentally, in the present embodiment, although the description has been given regarding the method of manufacturing the semiconductor device in which the multi-piece substrate is used, it is also possible to mount the semiconductor chip 3 over the wiring substrate 2 (see FIG. 3) formed in a individual piece as a modified example. In this case, a singulation step illustrated in FIG. 8 can be omitted.

As illustrated in FIG. 10, the respective constituent members of the wiring substrate 2 which have been described with reference to FIGS. 1 to 7 are formed on the respective product forming regions 20a. To be specific, the wiring substrate 20 includes the base material layer 2CR including the top surface 2CRa and the bottom surface 2CRb opposite to the top surface 2CRa. The base material layer 2CR is obtained by allowing the resin mixed with the filler particles to be impregnated in the glass fiber GC, and then, heating and curing a thermosetting resin component.

In addition, the respective product forming regions 20a of the wiring substrate 20 include the plurality of bonding fingers 2BF formed on the top surface 2CRa of the base material layer 2CR, the plurality of lands 2LD to be arranged on the bottom surface 2CRb, and the plurality of through-hole wires 2TW to electrically connect the plurality of bonding fingers 2BF and the lands 2LD.

In addition, the solder resist film (the insulating layer) SR1 which is the insulating layer including the glass fiber GC, the plurality of filler particles, and the resin and has been described with reference to FIG. 6 is formed on the top surface 2CRa of the base material layer 2CR. Most of the top surface 2CRa of the base material layer 2CR is covered with the solder resist film SR1. The solder resist film SR1 is obtained by allowing the resin mixed with the filler particles to be impregnated in the glass fiber GC and then, curing the solder resist film SR1. In a case in which the resin to be impregnated in the glass fiber GC includes the thermosetting resin component, for example, epoxy or the like, after the solder resist film SR1 is formed, the film is subjected to the heating, thereby allowing the film to be cured.

In addition, as illustrated in FIG. 4, an opening Sk1 is formed in the solder resist film SR1, and each part of the plurality of bonding fingers 2BF is exposed from the solder resist film SR1 in the opening Sk1. In the example illustrated in FIG. 4, the opening Sk1 is formed to straddle the plurality of bonding fingers 2BF. In other words, the respective parts of the plurality of bonding fingers 2BF are collectively exposed from the solder resist film SR1 in the single opening Sk1. A method of forming the opening Sk1 can adopt an etching process using, for example, a photolithography technique. However, in the present embodiment, the glass fiber GC (see FIG. 10) is included in the solder resist film SR1. Accordingly, it is preferable that the opening Sk1 be formed by emitting a laser beam from a point of view of removing a part of the glass fiber GC and accurately forming the opening Sk1.

In addition, a solder resist film (insulating layer) SR2 which is an insulating layer containing resin is formed on the bottom surface 2CRb of the base material layer 2CR, and most of the bottom surface 2CRb is covered with the solder resist film SR2. In addition, as illustrated in FIG. 3, the plurality of openings Sk2 are formed in the solder resist film SR2, and each part of the plurality of lands 2LD is exposed from the solder resist film SR2 in the opening Sk2. In the example illustrated in FIG. 3, the openings Sk2 are formed corresponding to the plurality of lands 2LD, respectively. In other words, the opening Sk2 is individually formed in each of the plurality of bonding fingers 2BF, and the plurality of bonding fingers 2BF are exposed from the solder resist film SR2, respectively, in the plurality of openings Sk2.

As described above, in the present embodiment, the glass fiber GC is included also in the solder resist film SR2. The solder resist film SR2 can be formed in the same manner as the solder resist film SR1. In addition, the opening Sk2 can be formed also by the etching process in the same manner as the opening Sk1, but it is preferable to use a method of emitting a laser beam to remove a part of the solder resist film SR2 from a point of view of accurately forming the opening Sk2.

In addition, the conductive patterns (the bonding finger 2BF, the land 2LD, and the through-hole wire 2TW) provided in the wiring substrate 20 are formed by using metal materials containing copper (Cu) as the main component, respectively. In the present embodiment, as a fabrication method of forming these conductive patterns, a fabrication method, for example, a subtraction method, a semi-additive method, or the like, is used to form these patterns. According to such a method, it is possible to form the bond portion BF1 and the wiring portion BF2 exemplified in FIG. 7. According to a formation order of the respective conductive patterns, the through-hole wire 2TW is formed first, and then, the bonding finger 2BF and the land 2LD to be connected to the through-hole wire 2TW are formed. The formation order of the bonding finger 2BF and the land 2LD is not limited thereto.

In addition, the solder resist film SR1 and the solder resist film SR2 are formed after forming the above-described conductive patterns. Thereafter, the opening Sk1 is formed to allow the plurality of bonding fingers 2BF to be exposed in the opening Sk1. In addition, the plurality of openings Sk2 are formed to allow the plurality of lands 2LD to be exposed in the openings Sk2, respectively.

In addition, the parts exposed from the solder resist film SR1 of the plurality of bonding fingers 2BF are coated with the plurality of solder materials SD2 in advance. The solder material SD2 is a raw material of the solder material SD1 illustrated in FIG. 6. The solder material SD2 is formed in advance on the exposed surface of the bond portion BF1 of the bonding finger 2BF prior to a semiconductor chip mounting step illustrated in FIG. 8, so that wettability of a solder material (details will be described later) formed on the projecting electrode 3BP (see FIG. 6) side in the semiconductor chip mounting step can be improved. The solder material SD2 can be formed by various types of formation methods and for example, can be formed by a plating method. In addition, it is preferable that the timing of forming the solder material SD2 be after forming the opening Sk1 in the solder resist film SR1. In this case, the solder material SD2 is not formed on the part covered with the solder resist film SR1.

<Semiconductor Chip Preparation Step>

Figure 11:
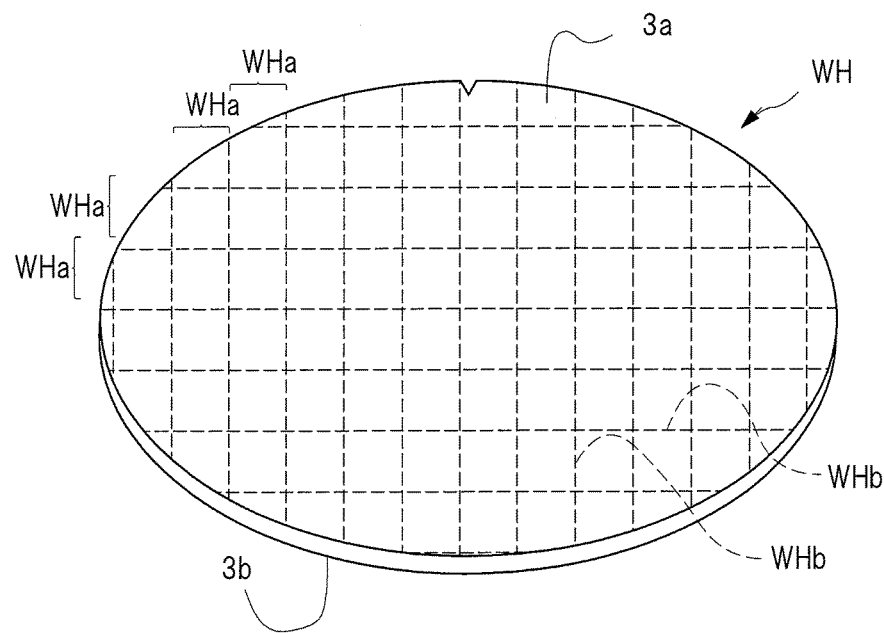
FIG. 11 is a plan view illustrating a semiconductor wafer to be prepared in a wafer preparation step illustrated in FIG. 8.
Figure 12:
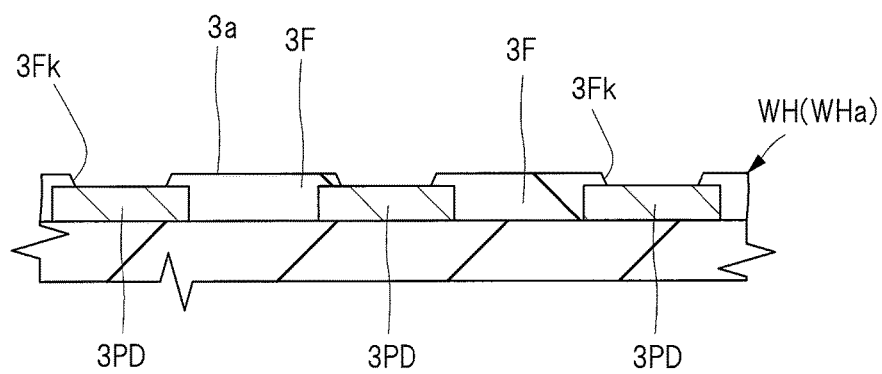
FIG. 12 is an enlarged cross-sectional view illustrating a periphery of a pad which is formed in a chip region of the semiconductor wafer illustrated in FIG. 11.
Figure 13:
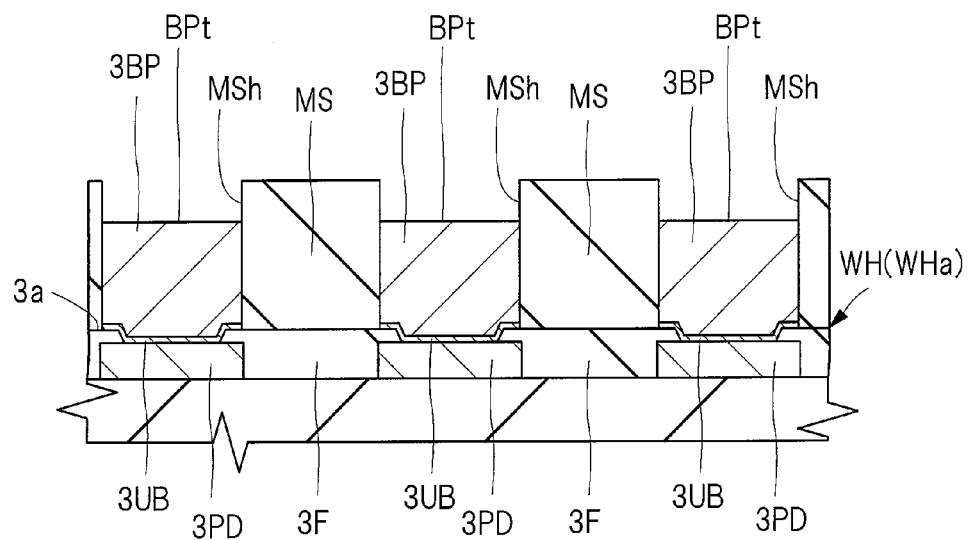
FIG. 13 is an enlarged cross-sectional view illustrating a state in which an underlying metal film and a projecting electrode are formed on the plurality of pads illustrated in FIG. 12.
Figure 14:
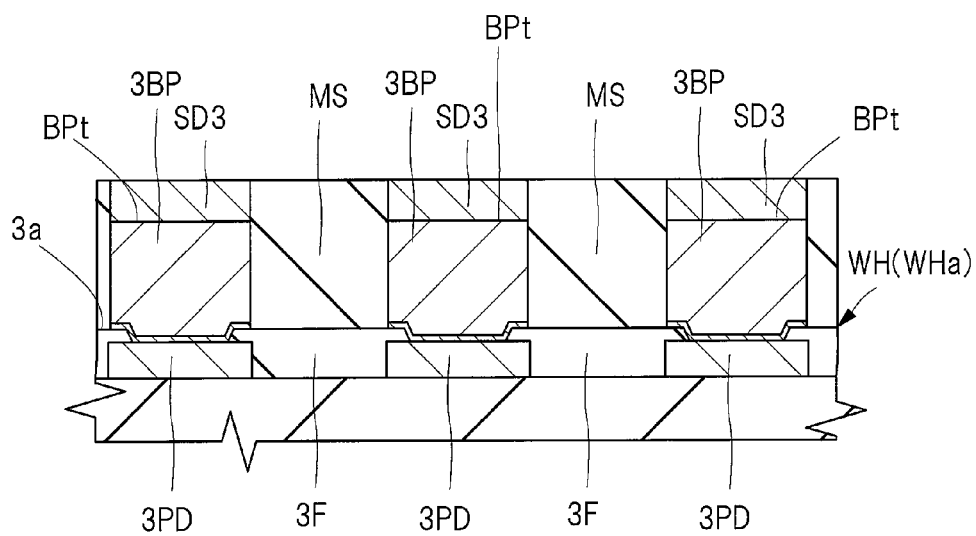
FIG. 14 is an enlarged cross-sectional view illustrating a state in which a solder material is attached to a tip surface of the projecting electrode illustrated in FIG. 13.
Figure 15:
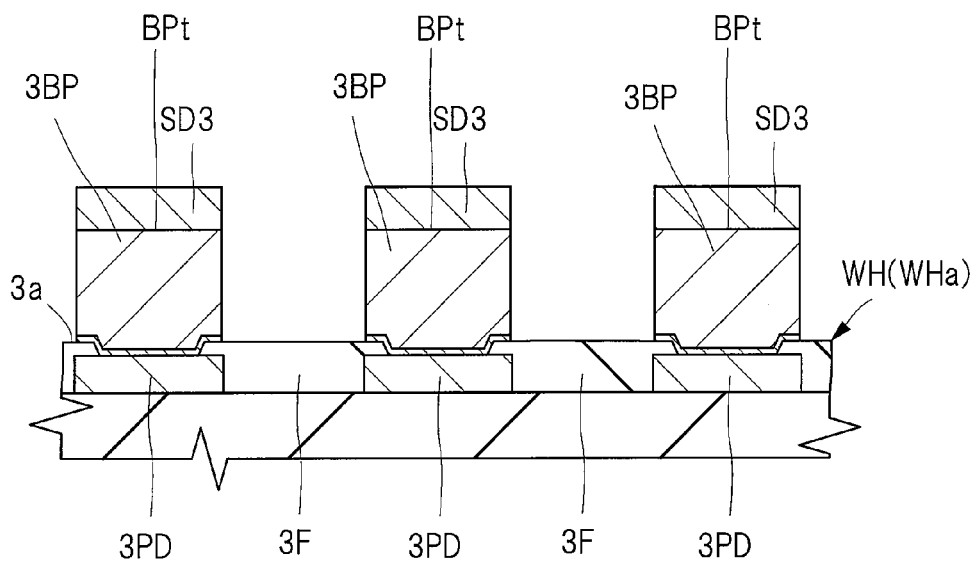
FIG. 15 is an enlarged cross-sectional view illustrating a state in which a mask illustrated in FIG. 14 is removed.
Figure 16:
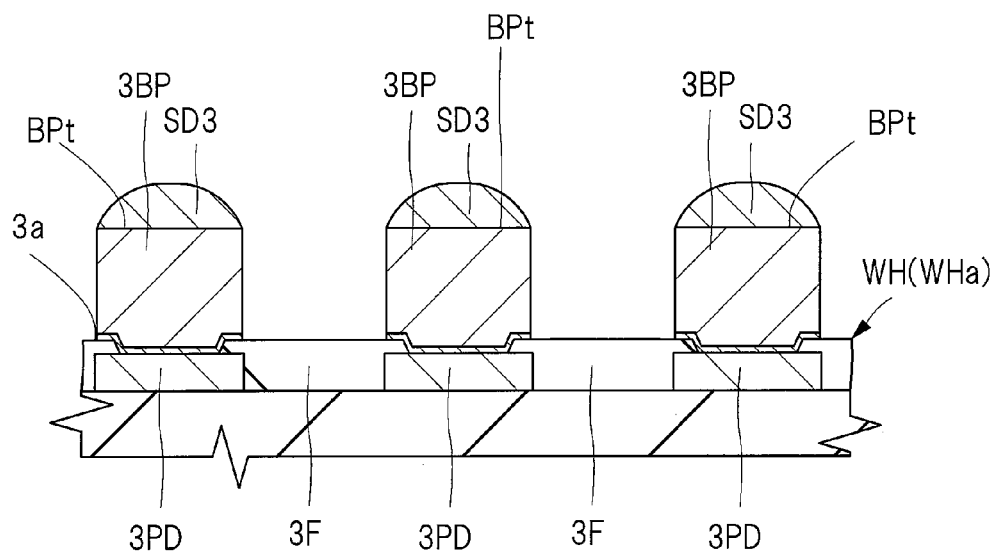
FIG. 16 is an enlarged cross-sectional view illustrating a state in which the solder material illustrated in FIG. 15 is heated to be deformed in a domical shape.

In the semiconductor chip preparation step illustrated in FIG. 8, the semiconductor chip 3 illustrated in FIG. 5 is prepared. FIG. 11 is a plan view illustrating a semiconductor wafer to be prepared in a wafer preparation step illustrated in FIG. 8, and FIG. 12 is an enlarged cross-sectional view illustrating a periphery of the pad which is formed in a chip region of the semiconductor wafer illustrated in FIG. 11. In addition, FIG. 13 is an enlarged cross-sectional view illustrating a state in which the underlying metal film and the projecting electrode are formed on the plurality of pads illustrated in FIG. 12, and FIG. 14 is an enlarged cross-sectional view illustrating a state in which the solder material is attached to the tip surface of the projecting electrode illustrated in FIG. 13. In addition, FIG. 15 is an enlarged cross-sectional view illustrating a state in which a mask illustrated in FIG. 14 is removed, and FIG. 16 is an enlarged cross-sectional view illustrating a state in which the solder material illustrated in FIG. 15 is heated to be deformed in a domical shape.

The semiconductor chip 3 illustrated in FIG. 5 is manufactured as follows, for example. First, in the wafer preparation step illustrated in FIG. 8, a wafer (semiconductor wafer) WH illustrated in FIG. 11 is prepared. The wafer WH to be prepared in the present step includes the front surface 3a having a substantially circular planar shape as illustrated in FIG. 11 and the back surface 3b opposite to the front surface 3a. In addition, the wafer WH includes a plurality of chip regions (device regions) WHa, and each of the chip regions WHa corresponds to the semiconductor chip 3 illustrated in FIG. 5. In addition, a scribe line (scribe region) WHb is formed between the neighboring chip regions WHa. The scribe lines WHb are formed in a grid shape, and the front surface 3a of the wafer WH is partitioned in the plurality of chip regions WHa. In addition, a plurality of conductive patterns such as an alignment mark or a test element group (TEG) for checking whether or not a semiconductor element or the like, formed inside the chip region WHa is properly formed are formed in the scribe line WHb.

The plurality of semiconductor elements (not illustrated), for example, a transistor or the like, are formed on a main surface (element formation surface) of the semiconductor substrate made of, for example, silicon (Si) in the wafer WH to be prepared in the present step. In addition, the plurality of wiring layers (not illustrated) are laminated on the semiconductor element formation surface of the semiconductor substrate, and the plurality of pads 3PD to be electrically connected to the plurality of wiring layers are formed on the uppermost layer. The plurality of pads 3PD are electrically connected to the plurality of semiconductor elements, respectively, via a plurality of wires which are formed on the wiring layers. That is, an integrated circuit is formed in advance on the semiconductor element formation surface of the semiconductor substrate in the wafer WH to be prepared in the present step. In addition, the front surface 3a of the semiconductor chip 3 is covered with the insulating film 3F such as silicon oxide ($SiO_2$) or a polyimide resin, for example, and the opening 3Fk is formed to cover the front surface 3a on the plurality of pads 3PD. Further, the pad 3PD is exposed from the insulating film 3F in the opening 3Fk.

Next, in a projecting electrode forming step illustrated in FIG. 8, as illustrated in FIG. 13, metal films are deposited on the plurality of pads 3PD to form the projecting electrodes 3BP, respectively. In the present embodiment, as illustrated in FIG. 13, a mask MS is arranged (fixed) on the front surface 3a of the wafer WH. Further, a through-hole (opening) MSh is formed at a position at which the projecting electrode 3BP is formed. The through-hole MSh can be formed by using, for example, a photolithography technique or an etching technique.

Subsequently, the metal film is deposited inside the through-hole MSh to form the projecting electrode 3BP. In the present embodiment, the projecting electrode 3BP is formed by depositing the underlying metal film 3UB, for example, a nickel film or the like and then depositing a copper film. A method of depositing the metal film is not particularly limited, and the deposition can be performed by using, for example, a plating method. In this manner, in the case of forming the underlying metal film 3UB and the projecting electrode 3BP by depositing the metal film, the stress to be applied to the pad 3PD can be reduced when the projecting electrode 3BP and the pad 3PD are bonded to each other.

Particularly, as compared to a method of performing pressure bonding (including thermocompression bonding) of a projecting electrode to a pad such as a ball bonding method, the stress can be more reduced in the method according to the present embodiment in which the projecting electrode is formed by using the plating method. Thus, it is possible to suppress the reduction in reliability caused by breakages of the chip region WHa at the time of forming the projecting electrode. In addition, by depositing the metal film in a state in which the plurality of through-holes MSh are formed in the mask MS, a plurality of (a large number of) the projecting electrodes 3BP can collectively be formed. Thus, the projecting electrodes 3BP are efficiently formed. In addition, since the projecting electrodes 3BP are formed before dividing the wafer WH, the projecting electrodes 3BP are collectively formed in the plurality of chip regions WHa. Thus, the projecting electrodes 3BP are efficiently formed.

In this manner, the projecting electrode formed by depositing the metal film inside the through-hole MSh of the mask MS serves as the columnar electrode having a columnar three-dimensional shape. In addition, a planar shape of the projecting electrode 3BP is formed in accordance with an opening shape of the through-hole MSh. For example, in the present embodiment, the opening shape is formed in a quadrangular (quadrilateral) shape with four corners being chamfered and curved. However, there are various types of modified examples in terms of the shape of the columnar electrode, and the electrode can be formed in, for example, a cylindrical shape.

Next, in a solder material forming step illustrated in FIG. 8, as illustrated in FIG. 14, a solder material SD3 is formed (attached) by depositing a solder film on each of the tip surfaces BPt of the projecting electrodes 3BP. In the present embodiment, the metal film is deposited to a middle of the through-hole MSh (see FIG. 13) in the above-described projecting electrode forming step, and thereafter, the solder film is subsequently deposited (without removing the mask MS). Thus, the solder film is subsequently deposited after depositing the copper film, for example, so that formation of an oxide film on the copper film before forming the solder film can be suppressed. Accordingly, it is possible to improve a bonding strength of a bonding interface between the solder material SD3 and the projecting electrode 3BP. In addition, by covering the tip surface BPt of the projecting electrode 3BP with the solder material SD3 in the present step, exposure of the tip surface BPt to the atmosphere can be prevented, thereby maintaining a state in which the oxide film is hardly formed on the tip surface BPt. Accordingly, it is possible to improve a bonding strength of a bonding interface between the solder material SD3 and the projecting electrode 3BP. As a result, it is possible to improve a bonding strength of a bonding interface between the solder material SD3 and the tip surface BPt. Incidentally, in order to more reliably suppress the oxidation of the projecting electrode 3BP, a nickel (Ni) film may be formed on the tip surface BPt of the projecting electrode 3BP. However, in the case of forming the nickel film, the number of steps (processing time) in the plating for forming a nickel plating film increases, and thus, it is preferable to directly form the solder material SD3 on the tip surface BPt of the projecting electrode 3BP as in the present embodiment.

Next, when the mask MS (see FIG. 14) is removed and cleaning is performed, as illustrated in FIG. 15, a side surface of the projecting electrode 3BP is exposed. In this state, although the solder material SD3 has a quadrangular prism shape similarly to the projecting electrode 3BP, when at least a part of the solder material SD3 is melted by performing heat treatment (a heating process), as illustrated in FIG. 16, the shape of the solder material SD3 is deformed by influence of surface tension of a molten solder, thereby being a domical shape. In this manner, when the heat treatment is performed, it is possible to concretely bond the tip surface BPt of the projecting electrode 3BP and the solder material SD3 to each other. In addition, since the solder material SD3 is stable when being formed in the domical shape as illustrated in FIG. 16, falling-off from the projecting electrode or damage can further be suppressed.

Through the respective steps described above, the plurality of projecting electrodes 3BP are formed (bonded) on the front surface (the top surface) of the plurality of pads 3PD, and further, the wafer WH in which the plurality of solder materials SD3 are formed on the tip surfaces BPt of the plurality of projecting electrodes 3BP is obtained.

Next, a back grinding tape is pasted onto a front surface of the wafer WH on which the plurality of projecting electrodes 3BP are formed, and a back surface of the wafer WH is subjected to polishing (grinding), so that the wafer WH with a desired thickness is obtained. Incidentally, in a case in which the thickness of the wafer WH to be prepared is already thin in a preparatory stage of the wafer or in a case in which there is no need to reduce the thickness of the wafer WH, this grinding step can be removed.

Next, the wafer WH illustrated in FIG. 16 is divided (singulated) for each of the chip regions WHa, and a plurality of the semiconductor chips 3 illustrated in FIG. 5 are obtained in a dividing step illustrated in FIG. 8. In the present step, the wafer WH is cut and divided along the scribe line WHb illustrated in FIG. 12. A cutting method is not particularly limited, and a cutting method of using a dicing blade (rotation blade) or a cutting method of emitting a laser beam can be used.

<Semiconductor Chip Mounting Step>

Figure 17:
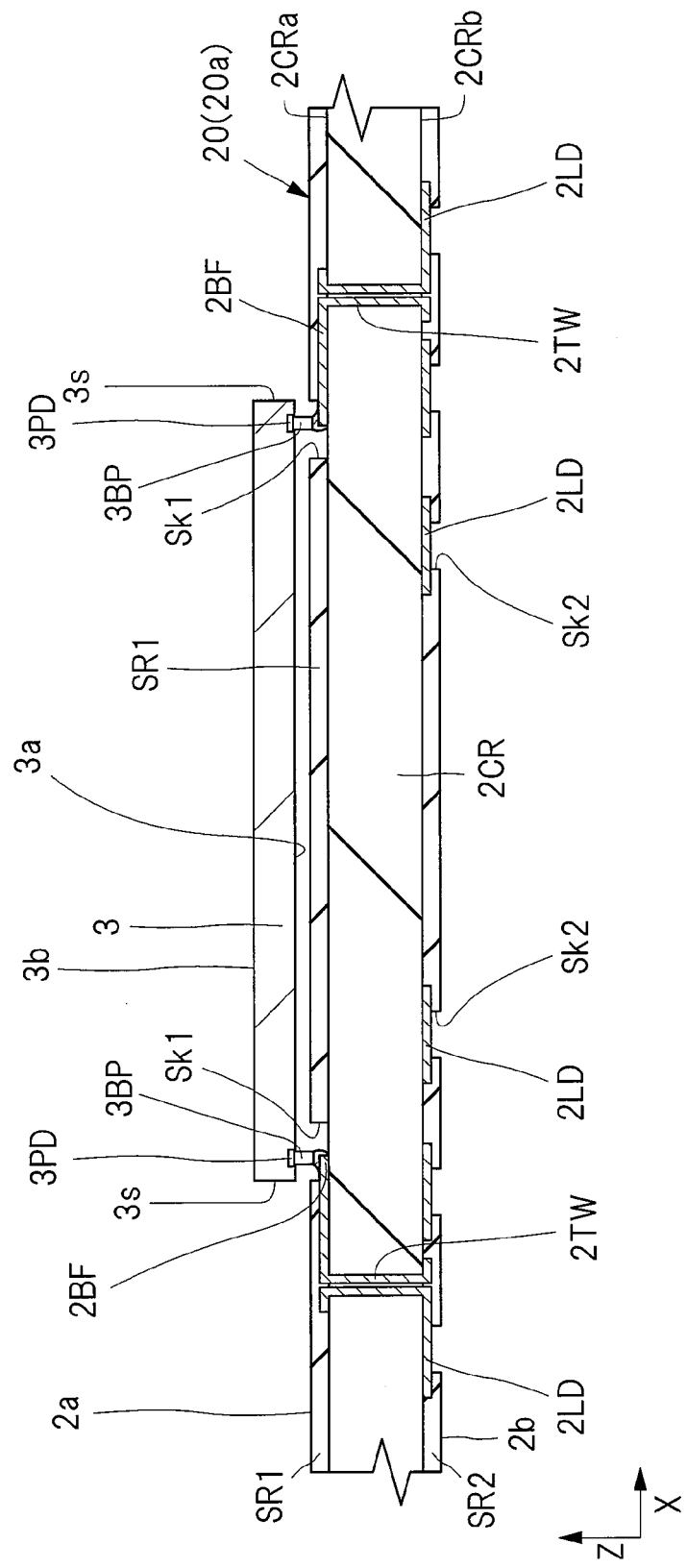
FIG. 17 is an enlarged cross-sectional view illustrating a state in which the semiconductor chip is mounted over the wiring substrate illustrated in FIG. 12.
Figure 18:
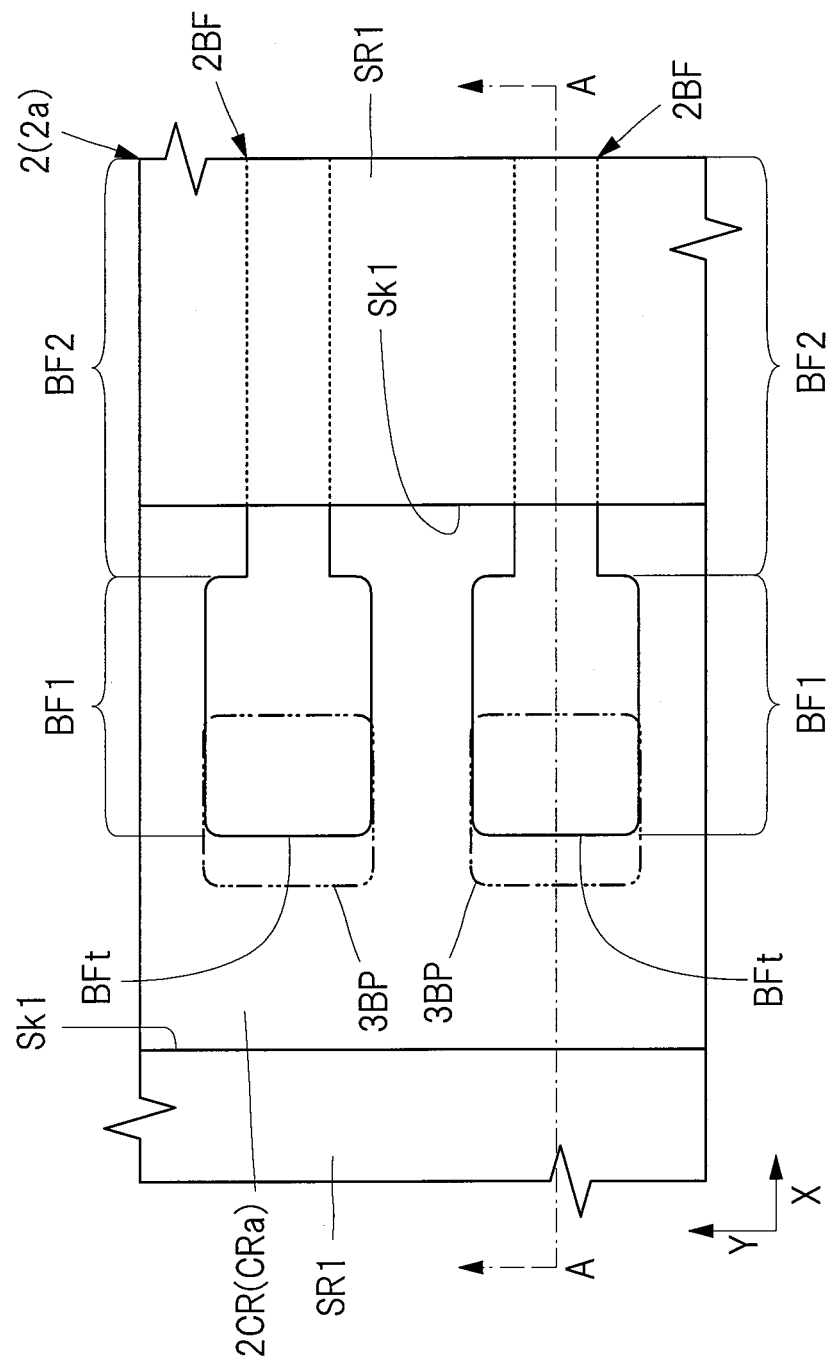
FIG. 18 is an enlarged plan view illustrating a planar positional relationship between the projecting electrode and a terminal when the semiconductor chip is arranged on the wiring substrate.
Figure 19:
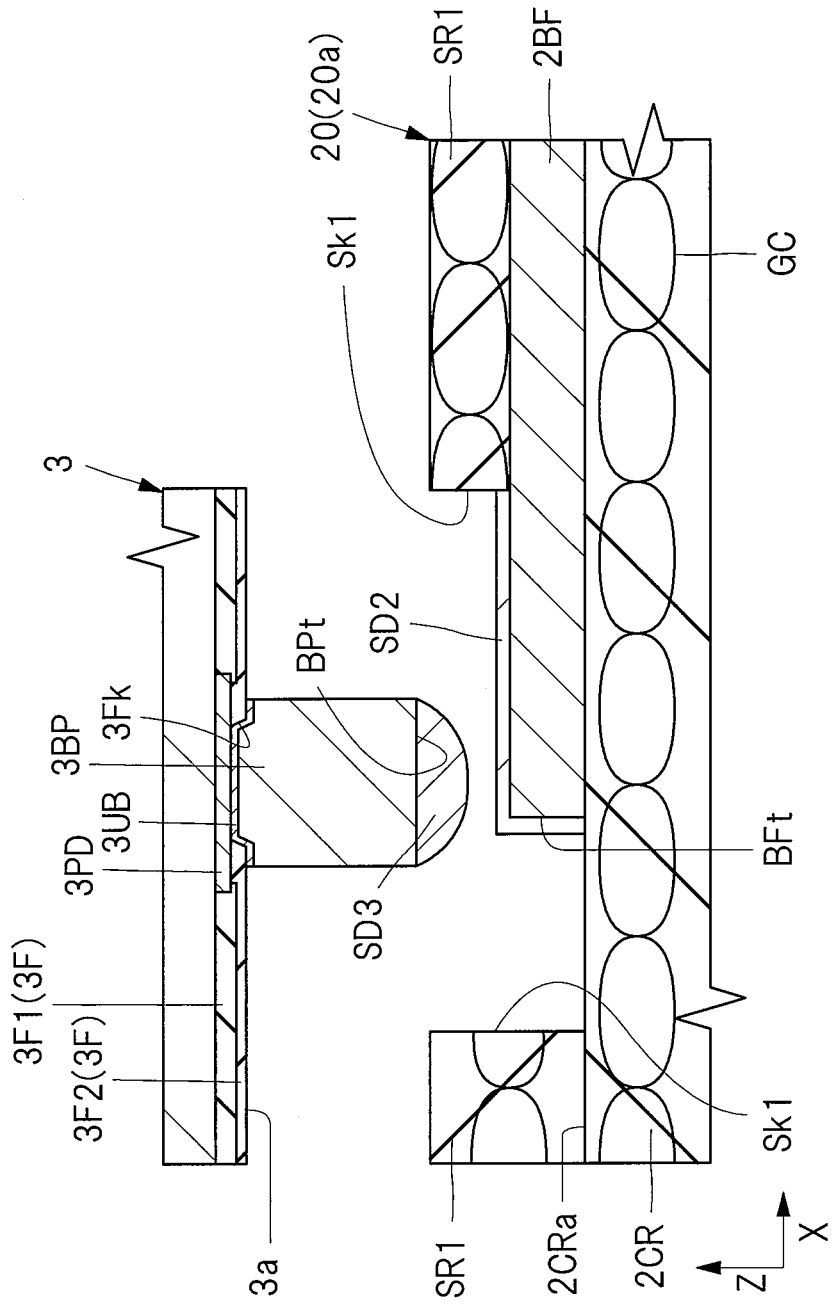
FIG. 19 is an enlarged cross-sectional view taken along a line A-A of FIG. 18.
Figure 20:
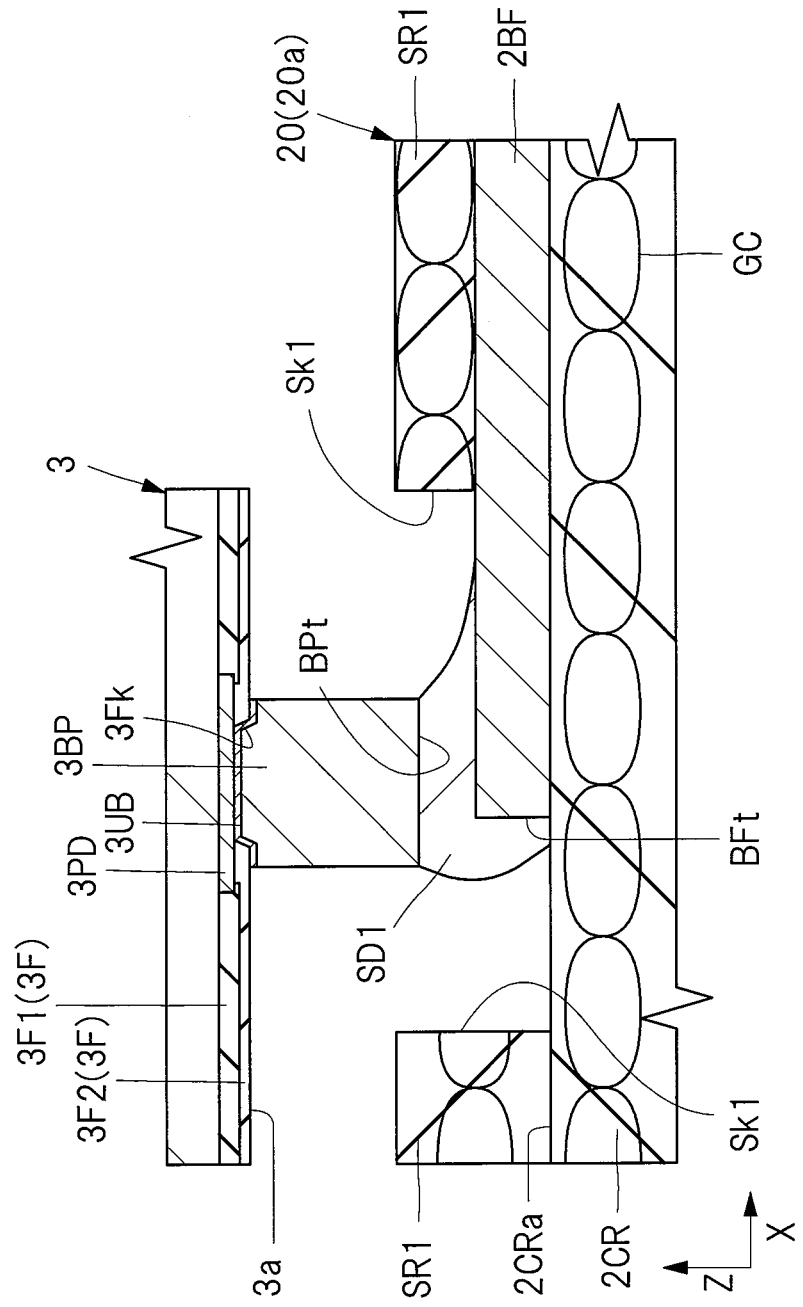
FIG. 20 is an enlarged cross-sectional view illustrating a state in which the solder materials illustrated in FIG. 19 are integrated.

In the semiconductor chip mounting step illustrated in FIG. 8, as illustrated in FIG. 17, the semiconductor chip 3 is mounted over the wiring substrate 20. In the present embodiment, the front surface 3a of the semiconductor chip 3 is arranged on the wiring substrate 20 so as to oppose the top surface 2a of the wiring substrate 20, thereby electrically connecting the plurality of bonding fingers 2BF and the plurality of pads 3PD. FIG. 17 is an enlarged cross-sectional view illustrating the state in which the semiconductor chip is mounted over the wiring substrate illustrated in FIG. 12. In addition, FIG. 18 is an enlarged plan view illustrating a planar positional relationship between the projecting electrode and the terminal when the semiconductor chip is arranged on the wiring substrate. In addition, FIG. 19 is an enlarged cross-sectional view taken along a line A-A of FIG. 18. In addition, FIG. 20 is an enlarged cross-sectional view illustrating a state in which the solder materials illustrated in FIG. 19 are integrated.

In the present step, first, as illustrated in FIG. 17, the front surface 3a of the semiconductor chip 3 is arranged on the wiring substrate 20 so as to oppose the top surface 2a of the wiring substrate (the semiconductor chip arrangement step). At this time, as illustrated in FIG. 18, the planar positional relationship between the semiconductor chip 3 and the wiring substrate 20 is adjusted such that the plurality of projecting electrodes 3BP overlap with the tip surfaces (tip sides) BFt of the plurality of bonding fingers 2BF, respectively. In other words, as illustrated in FIG. 19, the semiconductor chip 3 is aligned and arranged on the wiring substrate 20 such that the solder material SD3 attached to the tip surface BPt of the projecting electrode 3BP overlaps with the tip surface (the tip side) BFt of the bonding finger 2BF in the thickness direction.

As described above, in the present embodiment, by increasing the amount of the part of the solder material SD1 which covers the tip surface BFt of the bonding finger 2BF where the solder material SD1 is arranged on the lower side of the projecting electrode 3BP, the stress to be generated in the periphery of the projecting electrode 3BP due to the temperature cyclic load is mitigated. In the present step, when the alignment can be performed such that the plurality of projecting electrodes 3BP and the tip surfaces (tip sides) BFt of the plurality of bonding fingers 2BF overlap with each other in the thickness direction, it is possible to increase the amount of the part of the solder material SD1 which covers the tip surface BFt of the bonding finger 2BF where the solder material SD1 is arranged on the lower side of the projecting electrode 3BP.

In other words, it is possible to increase a thickness (thickness in the extending direction of the bonding finger 2BF (the X direction in FIGS. 18 and 19)) of the part of the solder material SD1 which covers the tip surface BFt of the bonding finger 2BF. In still other words, it is possible to increase the amount of the solder material SD1 to be arranged immediately below the projecting electrode 3BP.

Next, a distance between the semiconductor chip 3 illustrated in FIG. 19 and the wiring substrate 2 is reduced to allow the solder material SD2 and the solder material SD3 to be brought into contact with (abut on) each other. At this time, the solder material SD3 is brought into contact with the solder material SD2 so as to overlap, in the thickness direction, with the part of the solder material SD2 which covers the tip surface BFt of the bonding finger 2BF. In addition, in order to allow the solder material SD2 and the solder material SD3 to be brought into contact with each other in each of the plurality of bonding fingers 2BF, it is preferable that at least one of the solder material SD2 and the solder material SD3 be heated in advance to such an extent to have a hardness to be deformed after the contact.

Next, the solder material SD2 and the solder material SD3 are further heated to be equal to or higher than each melting point (a heating step (a heat treatment step or a reflow step)). A heating temperature is changed depending on each melting point of the solder material SD2 and the solder material SD3, and in the case of employing a lead-free tin-silver (Sn—Ag) based solder, the heating is performed at 230° C. to 300° C. In the present step, since the heating is performed in the state in which the solder material SD2 and the solder material SD3 are brought into contact with each other, when the semiconductor chip 3 is heated, for example, it is possible to heat the solder material SD2 through heat transfer from the solder material SD3. Further, when each of the solder material SD2 and the solder material SD3 is melted, the solder material SD2 and the solder material SD3 are integrated. That is, the solder material SD2 and the solder material SD3 are in a so-called "wetted" state. Further, when the molten solder after being integrated is cooled, the solder material SD1 illustrated in FIG. 20 is formed.

In addition, when the solder material SD2 and the solder material SD3 which are illustrated in FIG. 19 are integrated, the integrated molten solder is deformed to have a physically stable shape due to the surface tension thereof. That is, the shape similar to a sphere is formed. That is, in the present step, the semiconductor chip 3 is fixed in a state in which the plurality of projecting electrodes 3BP overlap with the tip surfaces (tip sides) BFt of the plurality of bonding fingers 2BF, respectively, in the plan view.

As in the present embodiment, in a case in which some of the projecting electrodes 3BP are present in a position not to overlap with the bonding finger 2BF in the thickness direction, the solder material SD1 is formed to be thick immediately below the corresponding part (a space between the projecting electrode 3BP and the top surface 2CRa of the base material layer 2CR) as illustrated in FIG. 19. That is, it is possible to increase the amount of the solder material SD1 at the part where the projecting electrode 3BP does not overlap with the bonding fingers 2BF, immediately below the projecting electrode 3BP. As a result, the stress which is generated in the periphery of the projecting electrode 3BP due to the temperature cyclic load can be mitigated.

<Sealing Step>

Figure 21:
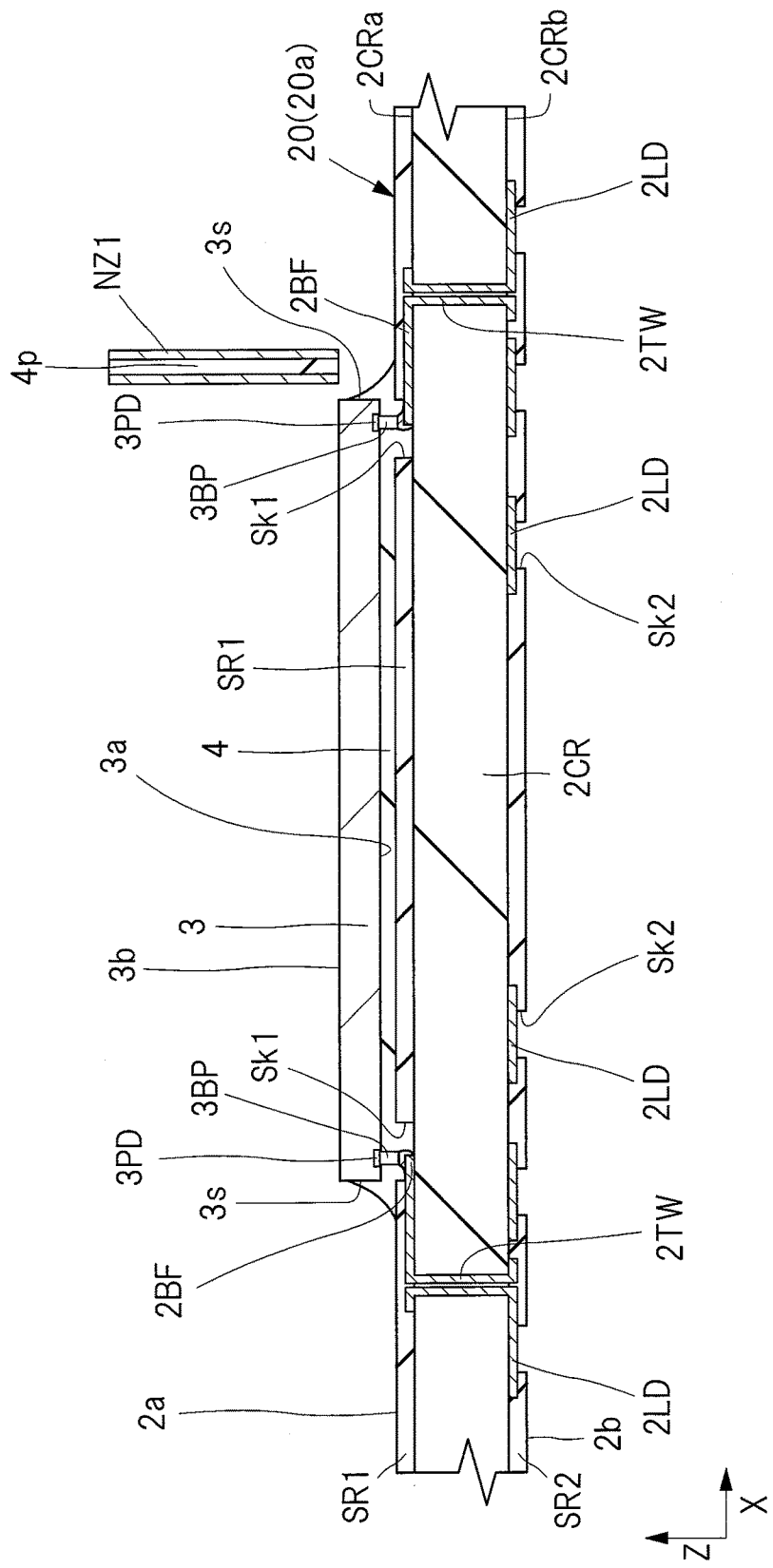
FIG. 21 is an enlarged cross-sectional view illustrating a state in which an underfill resin is supplied to a portion between the semiconductor chip and the wiring substrate illustrated in FIG. 17.

Next, in a sealing step illustrated in FIG. 8, as illustrated in FIG. 21, the resin body 4 is supplied to a portion between the front surface 3a of the semiconductor chip 3 and the top surface 2a of the wiring substrate 20 to seal a part which electrically connects the pad 3PD and the bonding finger 2BF. FIG. 21 is an enlarged cross-sectional view illustrating a state in which an underfill resin is supplied to a portion between the semiconductor chip and the wiring substrate illustrated in FIG. 17.

In the present step, for example, a nozzle NZ1 for supplying resin is arranged at an outer side of the side surface 3s of the semiconductor chip 3, and a liquid-like or paste-like resin 4p is supplied to the portion between the front surface 3a of the semiconductor chip 3 and the top surface 2a of the wiring substrate 20. The resin 4p includes the thermosetting resin component and the plurality of filler particles.

The resin 4p supplied to the portion between the front surface 3a of the semiconductor chip 3 and the top surface 2a of the wiring substrate 20 spreads to the spaces between the front surface 3a of the semiconductor chip 3 and the top surface 2a of the wiring substrate 20 due to a capillary action. Further, when the resin 4p is heated and the thermosetting resin component included in the resin 4p is cured, the respective bonding portions among the pad 3PD, the underlying metal film 3UB, the projecting electrode 3BP, the solder material SD1, and the bonding finger 2BF, which are illustrated in FIG. 20, are collectively sealed by the resin body 4.

In this manner, by sealing the connection parts between the pad 3PD and the bonding finger 2BF with the resin body 4, the stress to be applied to the connection parts can be dispersed to the resin body 4, which is preferable from a point of view of improving the reliability of connection between the pad 3PD and the bonding finger 2BF.

In addition, from a point of view of improving the strength of adhesion between the resin body 4 and the semiconductor chip 3, it is preferable that the resin body 4 be formed also in the periphery of the semiconductor chip 3 and a part of the resin body 4 form a filet which covers at least a part of the side surface 3s of the semiconductor chip 3. When the filet is formed in a peripheral edge portion of the resin body 4, the resin body 4 adheres to each of the front surface 3a of the semiconductor chip 3 and the plurality of side surfaces 3s, thereby improving the adhesion strength.

In addition, as described above, the opening Sk1 of the solder resist film SR1 is closed by the resin body 4 in the case in which the resin body 4 is formed also in the periphery of the semiconductor chip 3. Thus, for example, as illustrated in FIG. 6, a structure in which the opening end portion of the opening Sk1 is sealed by the resin body 4 is formed.

In addition, in the present embodiment, the resin body 4 is formed to include the plurality of filler particles such that the linear expansion coefficient of the resin body 4 is set to about, for example, 25 ppm to 30 ppm, and accordingly, a difference from the linear expansion coefficient of the semiconductor chip 3 (for example, 4 ppm) is reduced. Thus, in the close contact interface between the resin body 4 and the semiconductor chip 3, the generation of the peeling-off caused by the temperature cyclic load can be suppressed.

In addition, the linear expansion coefficient of the cured resin body 4 is, as described above, equal to or larger than the linear expansion coefficient of the solder resist film SR1 which is in close contact with the resin body 4 and is larger than the linear expansion coefficient of the base material layer 2CR. Thus, even in the case in which the linear expansion coefficient of the resin body 4 is reduced by mixing the filler particle in the resin body 4, the generation of the peeling-off caused by the temperature cyclic load can be suppressed in the close contact interface between the solder resist film SR1 and the resin body 4.

Incidentally, the technique that has been described in the present embodiment is not applied only to the manufacturing method in which the resin body 4 is formed after the semiconductor chip mounting step but can be applied to various types of modified examples. For example, as a modified example with respect to the present embodiment, there is a method in which a paste-like or a film-like resin is formed on a region (chip mounting region) to which the semiconductor chip is planned to be mounted prior to the semiconductor chip mounting step. In this case, in the semiconductor chip mounting step, the projecting electrode 3BP and the bonding finger 2BF are electrically connected to each other by penetrating the resin formed in advance, and thereafter, the resin is cured to form the resin body 4. That is, in the sealing step, the heating and curing process is performed without supplying the resin.

<Ball Mounting Step>

Figure 22:
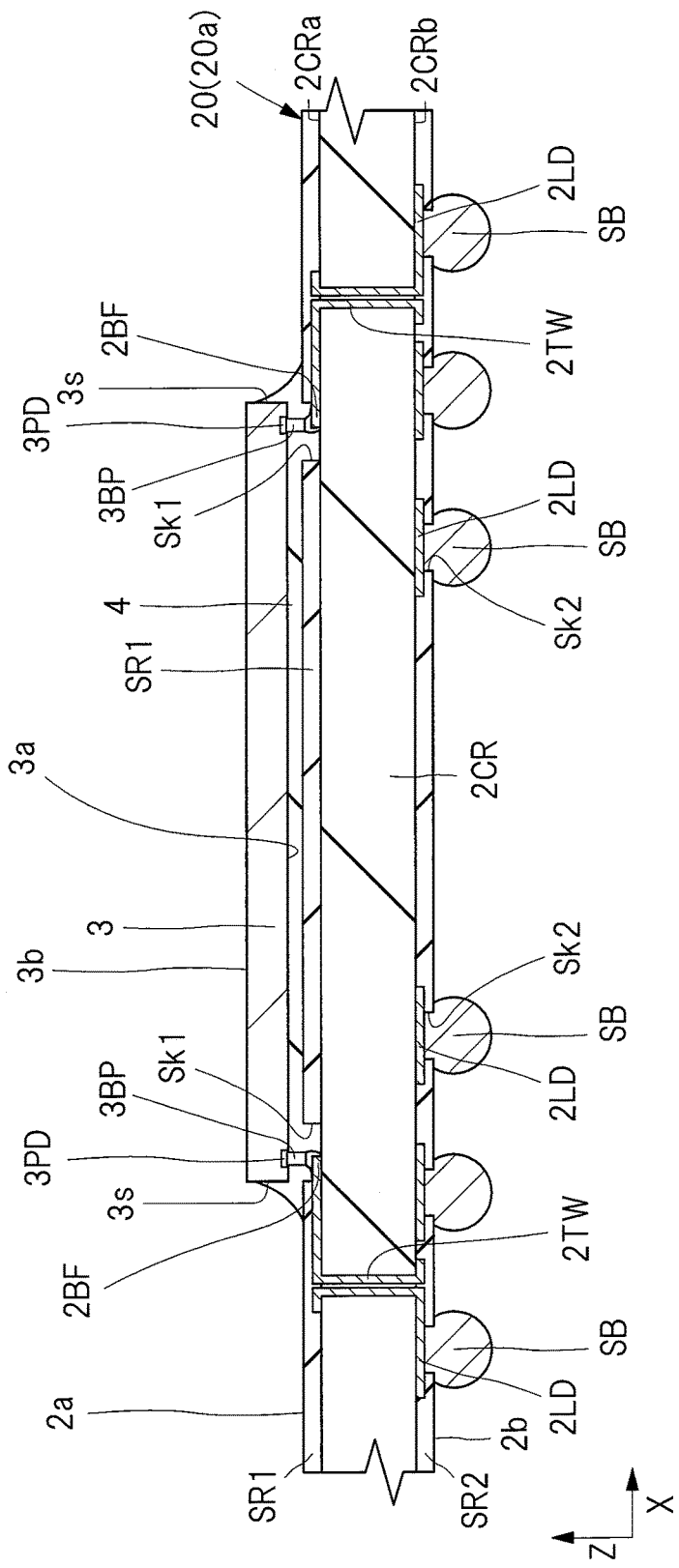
FIG. 22 is an enlarged cross-sectional view illustrating a state in which solder balls are bonded to a plurality of lands of the wiring substrate illustrated in FIG. 21.

Next, in a ball mounting step illustrated in FIG. 8, as illustrated in FIG. 22, the plurality of solder balls SB are bonded to the plurality of lands 2LD formed on the bottom surface 2b of the wiring substrate 20. FIG. 22 is an enlarged cross-sectional view illustrating the state in which the solder balls are bonded to the plurality of lands of the wiring substrate illustrated in FIG. 21. In the present step, as illustrated in FIG. 22, the solder ball SB is arranged on each of the plurality of lands 2LD exposed on the bottom surface 2b of the wiring substrate 20 and then, is heated such that the plurality of solder balls SB and the lands 2LD are boned to each other. According to the present step, the plurality of solder balls SB are electrically connected to the semiconductor chip 3 via the wiring substrate 20. However, the technique that has been described in the present embodiment is not applied only to a so-called ball grid array (BGA) semiconductor device bonded with the solder ball SB. For example, as a modified example with respect to the present embodiment, the technique can be applied to a so-called land grid array (LGA) semiconductor device, which is shipped in a state in which the land 2LD is exposed without forming the solder ball SB, or the land 2LD is coated with a solder paste in a thinner layer than the solder ball SB.

<Singulation Step>

Figure 23:
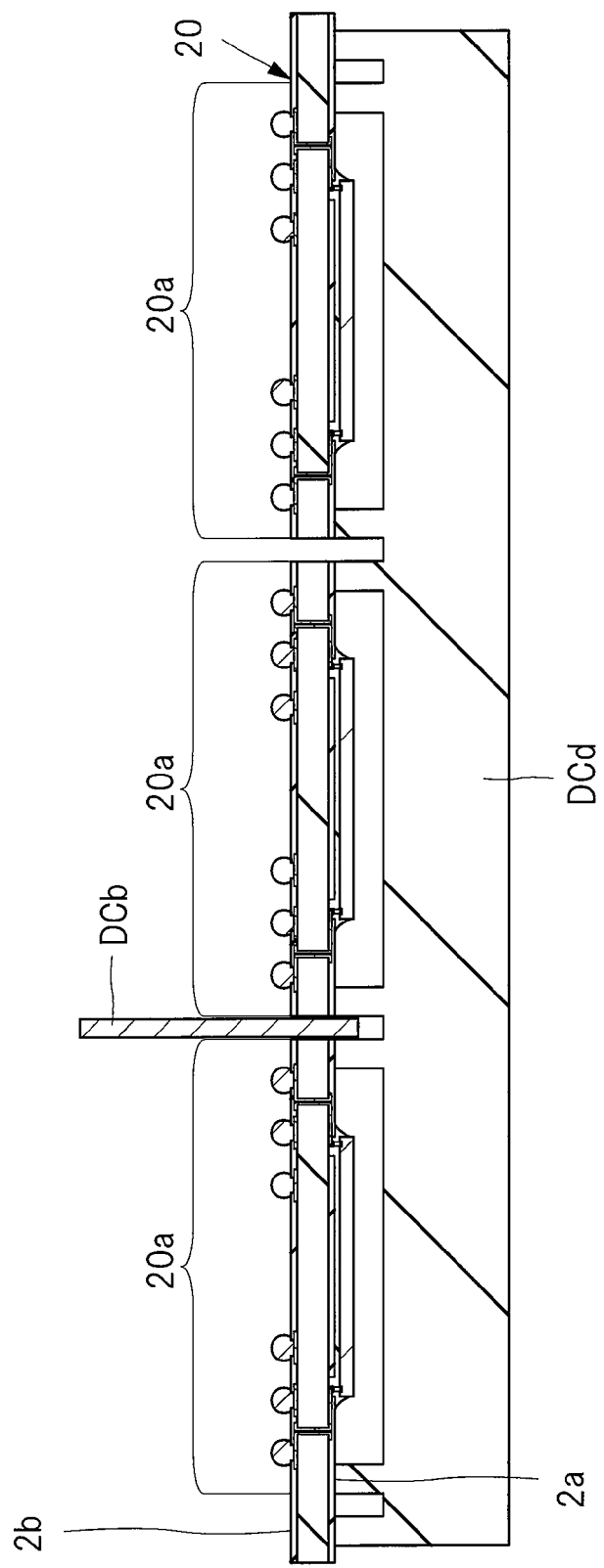
FIG. 23 is a cross-sectional view illustrating a state in which a multi-piece wiring substrate is cut into individual pieces in a singulation step illustrated in FIG. 8.

Next, in the singulation step illustrated in FIG. 8, the wiring substrate 20 is divided for each of the product forming regions 20a (see FIG. 9). FIG. 23 is a cross-sectional view illustrating a state in which a multi-piece wiring substrate is cut into individual pieces in the singulation step illustrated in FIG. 8.

In the present step, the wiring substrate 20 is cut along the dicing line (dicing region) 20c illustrated in FIG. 9 and is divided into individual pieces for each of the product forming regions 20a, thereby obtaining the plurality of semiconductor devices illustrated in FIG. 1. In the example illustrated in FIG. 23, in a state in which the wiring substrate 20 is fixed to a fixing jig DCd, the dicing line 20c of the wiring substrate 20 is cut by using a dicing blade (rotation blade) DCb, and thus, the cutting is performed.

According to the respective steps described above, the semiconductor device SP1 that has been described with reference to FIGS. 1 to 7 is obtained. Thereafter, required inspection and test such as an appearance inspection and an electrical test are performed, and then, the semiconductor device SP1 is shipped and mounted on the mounting substrate not illustrated.

In the foregoing, the invention made by the inventors of the present invention has been concretely described based on the embodiments, but it is needless to say that the present invention is not limited to the foregoing embodiments and in addition to the modified examples that have been exemplarily described as above, various alterations can be made within the scope of the present invention. Hereinafter, modified examples with respect to the above embodiment will be exemplarily described.

<First Modified Example>

First, in the above-described embodiment, the description has been given regarding the technique (hereinafter, will be described as a linear expansion coefficient adjustment technique) in which the solder resist film SR1 is formed to include the glass fiber GC to adjust the linear expansion coefficient of the solder resist film SR1 as the method of suppressing the reduction in reliability of the semiconductor device affected by the stress which is generated due to the temperature cyclic load.

In addition, in the above-described embodiment, the description has been given regarding the phenomenon in which the peeling-off or the damage is generated in the bonding interfaces of the conductive members to electrically connect the pad 3PD and the bonding finger 2BF illustrated in FIG. 6 due to the tensile force indicated with the arrow ST2 in FIG. 6, and the solution thereof. That is, the description has been given regarding the technique (hereinafter, will be described as a projecting electrode layout technique) in which the projecting electrode 3BP and the bonding finger 2BF are electrically connected to each other via the solder material SD1 in the state in which the tip surface (the tip side) BFt of the bonding finger 2BF overlaps with the projecting electrode 3BP in the thickness direction.

In the above-described embodiment, although the description has been given regarding the mode of the embodiment to which the linear expansion coefficient adjustment technique and the projecting electrode layout technique are applied in combination, as a modified example, each of the linear expansion coefficient adjustment technique and the projecting electrode layout technique can also individually be applied.

Figure 24:
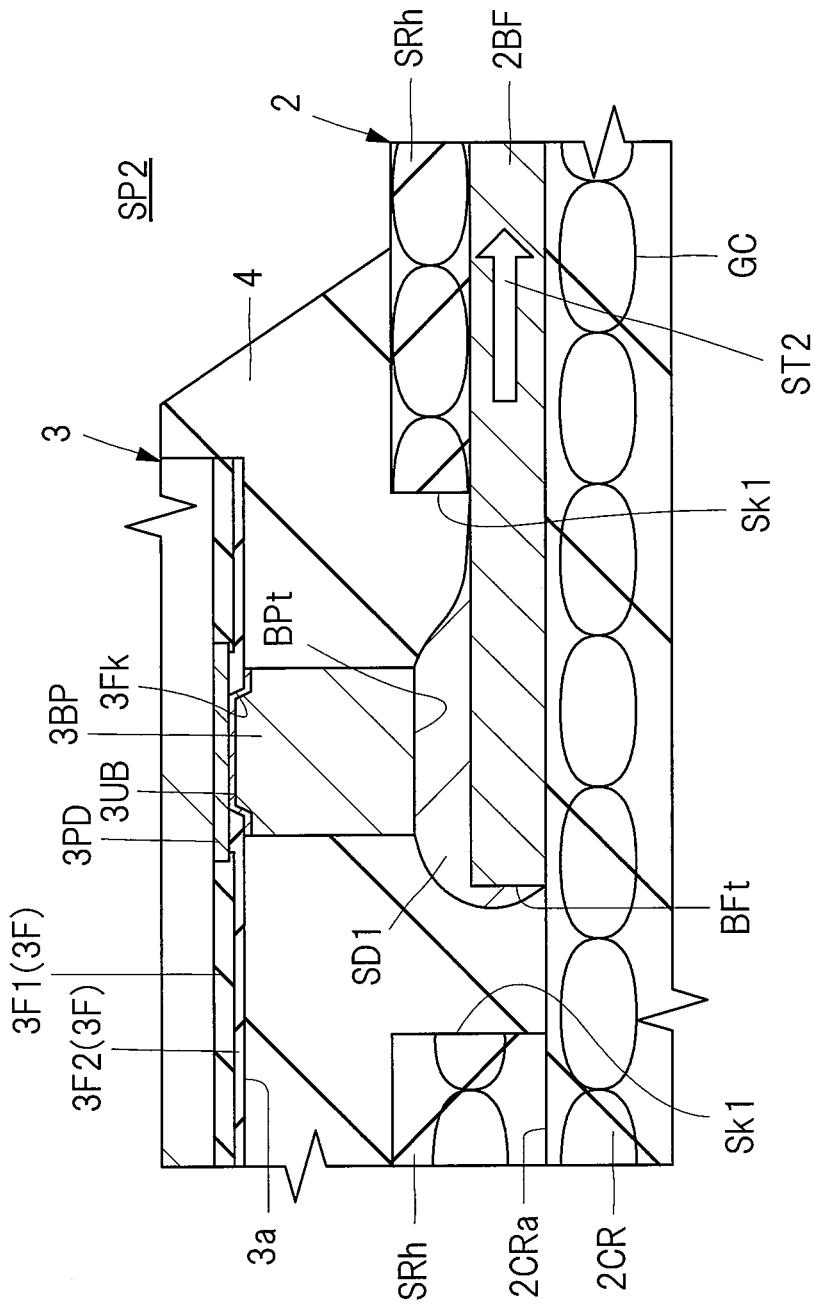
FIG. 24 is an enlarged cross-sectional view illustrating a modified example with respect to the semiconductor device illustrated in FIG. 6.

For example, a semiconductor device SP2 illustrated in FIG. 24 is different from the semiconductor device SP1 illustrated in FIG. 6 in that the projecting electrode 3BP does not overlap with the tip surface (the tip side) BFt of the bonding finger 2BF in the thickness direction. That is, the semiconductor device SP2 is the mode of the embodiment to which the above-described linear expansion coefficient adjustment technique is independently applied, and the above-described projecting electrode layout technique is not applied.

In the case of the semiconductor device SP2, the solder resist film SR1 includes the glass fiber GC. In addition, the linear expansion coefficient of the solder resist film SR1 is equal to or larger than the linear expansion coefficient of the base material layer 2CR, the linear expansion coefficient of the solder resist film SR1 is equal to or smaller than the linear expansion coefficient of the resin body 4, and the linear expansion coefficient of the base material layer 2CR is smaller than the linear expansion coefficient of the resin body 4.

Accordingly, even in a case in which a tensile force indicated by the arrow ST2 in FIG. 24 is generated due to the temperature cyclic load, a magnitude of the tensile force illustrated in FIG. 24 is smaller than that of the tensile force indicated by the arrow ST1 in FIG. 34. Thus, according to the semiconductor device SP2, as compared to the semiconductor device H1, the phenomenon in which the peeling-off occurs in some of the connection interfaces to electrically connect the semiconductor chip 3 and the wiring substrate 2 can be suppressed.

Figure 25:
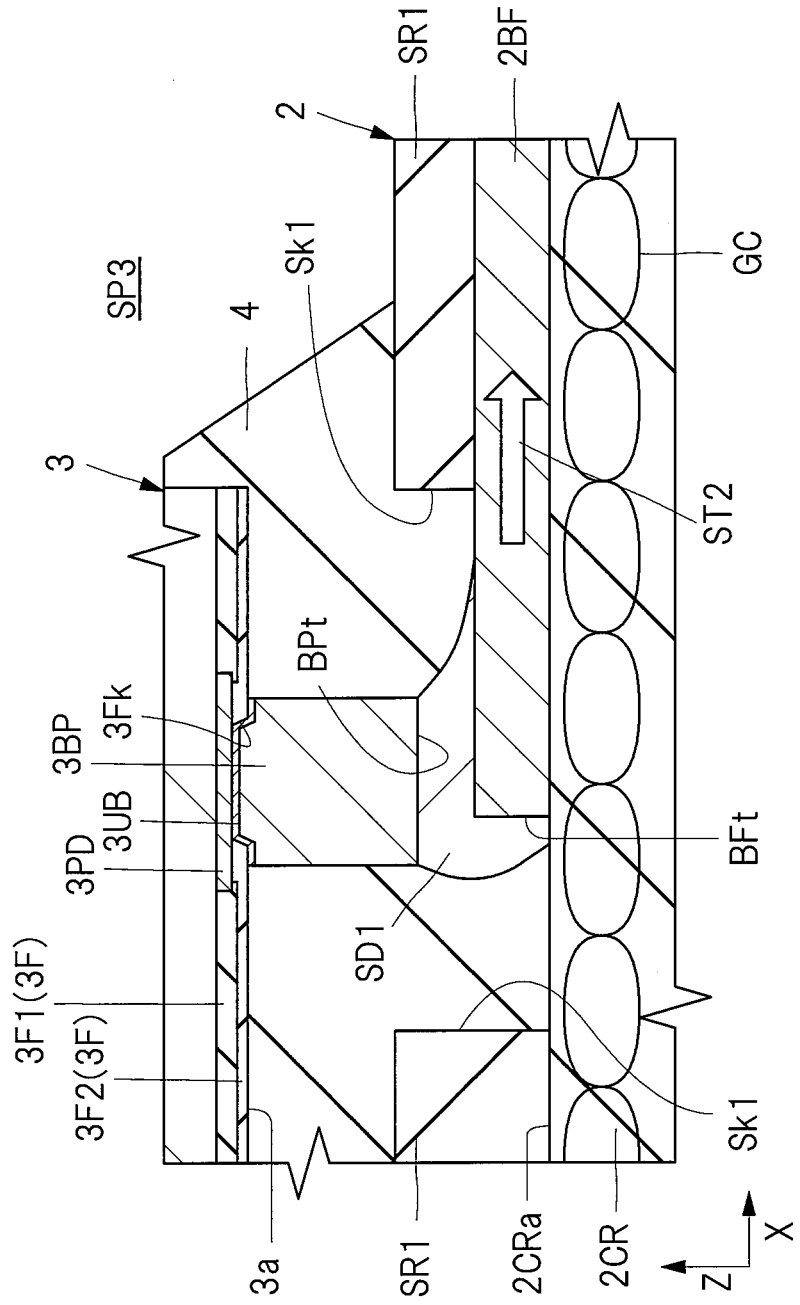
FIG. 25 is an enlarged cross-sectional view illustrating another modified example with respect to the semiconductor device illustrated in FIG. 6.

In addition, a semiconductor device SP3 illustrated in FIG. 25 is different from the semiconductor device SP1 illustrated in FIG. 6 in that a solder resist film SR3 formed on the chip mounting surface side does not include the fiber material such as the glass fiber GC illustrated in FIG. 6. That is, the semiconductor device SP3 is the mode of the embodiment to which the above-described projecting electrode layout technique is independently applied, and the above-described linear expansion coefficient adjustment technique is not applied.

In the case of the semiconductor device SP3, since the solder resist film SR3 does not include the fiber material, a linear expansion coefficient of the solder resist film SR3 is larger than the linear expansion coefficient of the solder resist film SR1 illustrated in FIG. 6. For example, the linear expansion coefficient of the solder resist film SR3 is about 500 ppm to 1000 ppm. Accordingly, the linear expansion coefficient of the solder resist film SR3 is set to a value larger than each of the linear expansion coefficient of the resin body 4 and the linear expansion coefficient of the base material layer 2CR.

Accordingly, a tensile force which is generated when the temperature cyclic load is applied to the semiconductor device SP3 increases as indicated by the arrow ST2 in FIG. 25. However, in the semiconductor device SP3, the projecting electrode 3BP overlaps with the tip surface (the tip side) BFt of the bonding finger 2BF in the thickness direction. Thus, it is possible to increase the amount of the part of the solder material SD1 which covers the tip surface BFt where the solder material SD1 is arranged on the lower side of the projecting electrode 3BP as compared to the semiconductor device H1 illustrated in FIG. 34. Accordingly, the solder material SD1 including the part which covers the tip surface BFt is elastically deformed, so that the stress can be mitigated.

That is, as compared to the semiconductor device H1 illustrated in FIG. 34, in the semiconductor device SP3 illustrated in FIG. 25, when the temperature cyclic load is applied, the generation of the peeling-off or the damage can be suppressed in the bonding interfaces of the conductive members to electrically connect the pad 3PD and the bonding finger 2BF.

The semiconductor device SP2 illustrated in FIG. 24 and the semiconductor device SP3 illustrated in FIG. 25 are the same as the semiconductor device SP1 that has been described in the above-described embodiment except for the above-described differences, and thus the redundant description thereof will be omitted.

<Second Modified Example>

Figure 26:
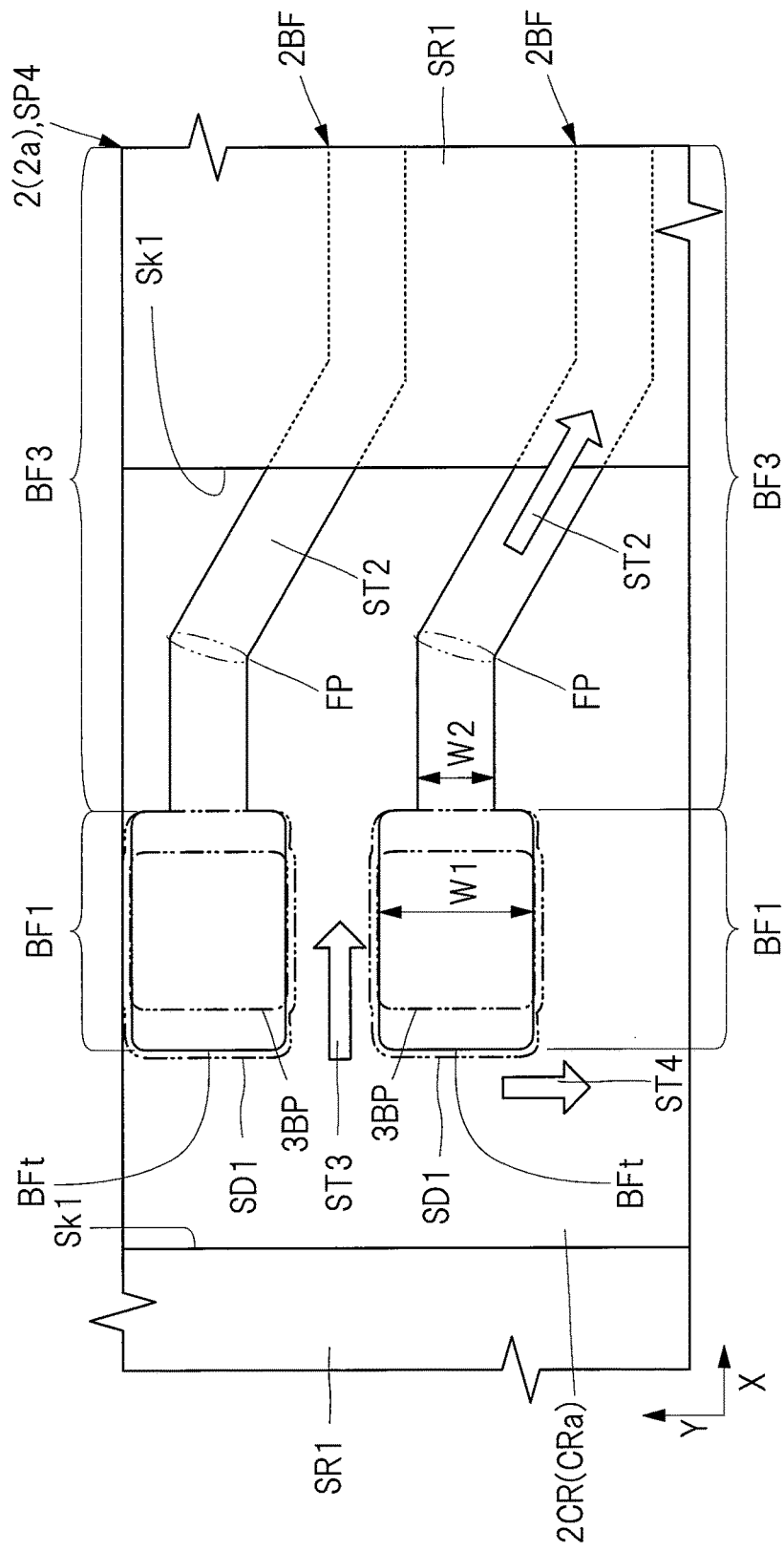
FIG. 26 is an enlarged plan view illustrating a modified example with respect to the semiconductor device illustrated in FIG. 7.

In addition, there is a method of suppressing the peeling-off or the damage in the bonding interfaces of the conductive members to electrically connect the pad 3PD and the bonding finger 2BF as a method different from the projecting electrode layout technique that has been described in the above-described embodiment. A semiconductor device SP4 illustrated in FIG. 26 is different from the semiconductor device SP1 illustrated in FIG. 7 in terms of a shape of a wiring portion BF3 of the bonding finger 2BF which is exposed from the solder resist film SR1 inside the opening Sk1 of the solder resist film SR1. In addition, the semiconductor device SP4 illustrated in FIG. 26 is different from the semiconductor device SP1 illustrated in FIG. 6 in that the projecting electrode 3BP does not overlap with the tip surface (the tip side) BFt of the bonding finger 2BF in the thickness direction.

As illustrated in FIG. 26, each of the plurality of bonding fingers 2BF of the semiconductor device SP4 includes the bond portion BF1 arranged in the opening Sk1, and the wiring portion BF3 which extends from the bond portion BF1 toward the solder resist film SR1, a part of which is covered with the solder resist film SR1.

Here, each of the plurality of wiring portion BF3 has a flexion point FP at which the extending direction is changed between the bond portion BF1 and the part of the wiring portion BF3 covered with the solder resist film SR1. The flexion point FP is a part which is bent to cause the extending direction of the wiring portion BF3 to be changed and may have a structure bent in a curved manner, in addition to the structure in which a middle of the wiring portion BF3 is bent, as illustrated in FIG. 26, for example.

In a case in which the temperature cyclic load is applied to the semiconductor device SP4, a tensile force caused when the bonding finger 2BF is pulled to the solder resist film SR1 is generated along the extending direction of the wiring portion BF3, as indicated by the arrow ST2 in FIG. 26. Meanwhile, a part in which the concentration of stress caused by the tensile force is likely to occur, in the vicinity of the bond portion BF1 of the bonding finger 2BF, is a peripheral part of the tip surface (the tip side) BFt. In addition, a component of the tensile force that causes the peeling-off of the bonding interface of the conductive members such as the projecting electrode 3BP and the bonding finger 2BF is the tensile force component in the direction (the X direction in FIG. 26) orthogonal to the extending direction of the tip surface (the tip side) BFt.

Thus, as in the semiconductor device SP4 illustrated in FIG. 26, when the flexion point FP at which the extending direction is changed is formed between the bond portion BF1 and the part of the wiring portion BF3 covered with the solder resist film SR1, the tensile force indicated by the arrow ST2 is broken down into a tensile force component indicated by an arrow ST3 and a tensile force component indicated by an arrow ST4 in the vicinity of the tip surface (the tip side) of the bond portion BF1. That is, it is possible to reduce the component (the component indicated by the arrow ST3) of the tensile force that causes the peeling-off of the bonding interface of the conductive members such as the projecting electrode 3BP and the bonding finger 2BF.

In this manner, in this modified example illustrated in FIG. 26, it is possible to reduce the tensile force component which causes the peeling-off of the bonding interface of the conductive members such as the projecting electrode 3BP and the bonding finger 2BF, so that the peeling-off or the damage of the bonding interface can be suppressed.

In addition, in a case in which the wiring portion BF3 includes the flexion point FP at which the extending direction is changed between the bond portion BF1 and the part of the wiring portion BF3 covered with the solder resist film SR1, when the tensile force indicated by the arrow ST2 in FIG. 26 is generated, the wiring portion BF3 is likely to be elastically deformed, for example, like a spring. Then, when the wiring portion BF3 is elastically deformed, the tensile force to be transferred to the bond portion can further be reduced.

In addition, from a point of view of allowing the wiring portion BF3 to be elastically deformed like a spring, it is preferable to have the narrow width in the direction orthogonal to the extending direction of the wiring portion BF3. This is because an elongated metal pattern is more likely to be elastically deformed. Accordingly, as illustrated in FIG. 26, a case in which the width (length in the direction orthogonal to the extending direction of the wiring portion BF3) W2 of the wiring portion BF3 is smaller than the width (length in the direction along the tip surface (tip side) BFt) W1 of the bond portion BF1 is preferable from the point of view of facilitating the elastic deformation of the wiring portion BF3.

The semiconductor device SP4 illustrated in FIG. 26 is the same as the semiconductor device SP1 that has been described in the above-described embodiment except for the above-described difference, and thus the redundant description thereof will be omitted.

In addition, in FIG. 26, the description has been given regarding the mode of the embodiment in which the solder resist film SR1 including the glass fiber GC (see FIG. 6) is used. That is, the description has been given regarding the mode of the embodiment in which the linear expansion coefficient adjustment technique and the technique (hereinafter, will be described as the wiring portion bending technique) in which the flexion point FP at which the extending direction is changed is provided between the bond portion BF1 and the part of the wiring portion BF3 covered with the solder resist film SR1 are combined. However, the above-described wiring portion bending technique can independently be applied without being combined with the linear expansion coefficient adjustment technique or the projecting electrode layout technique. In this case, the solder resist film SR1 illustrated in FIG. 26 is replaced by the solder resist film SR3 illustrated in FIG. 25.

In addition, the description has been given in FIG. 26 regarding the mode of the embodiment in which the projecting electrode 3BP does not overlap with the tip surface (the tip side) BFt of the bond portion BF1 of the bonding finger 2BF in the thickness direction. However, the above-described wiring portion bending technique can be used in combination with the projecting electrode layout technique. In this case, the effect of suppressing the peeling-off of the bonding interface of the conductive members such as the projecting electrode 3BP and the bonding finger 2BF is further improved.

In addition, in a case in which all the wiring portion bending technique, the linear expansion coefficient adjustment technique, and the projecting electrode layout technique described above are combined, the effect of suppressing the peeling-off of the bonding interface of the conductive members such as the projecting electrode 3BP and the bonding finger 2BF is further improved.

<Third Modified Example>

In addition, in the above-described embodiment, in order to facilitate understanding of the technical idea, the description has been given by featuring the example of the wiring substrate 2 with the two-layer wiring layer structure in which the wiring layers are formed on the top surface 2CRa and the bottom surface 2CRb of the base material layer 2CR, respectively. However, the number of wiring layers is not limited to two, and the present invention can be applied also to a wiring substrate with a multilayer structure having three or more layers.

Figure 27:
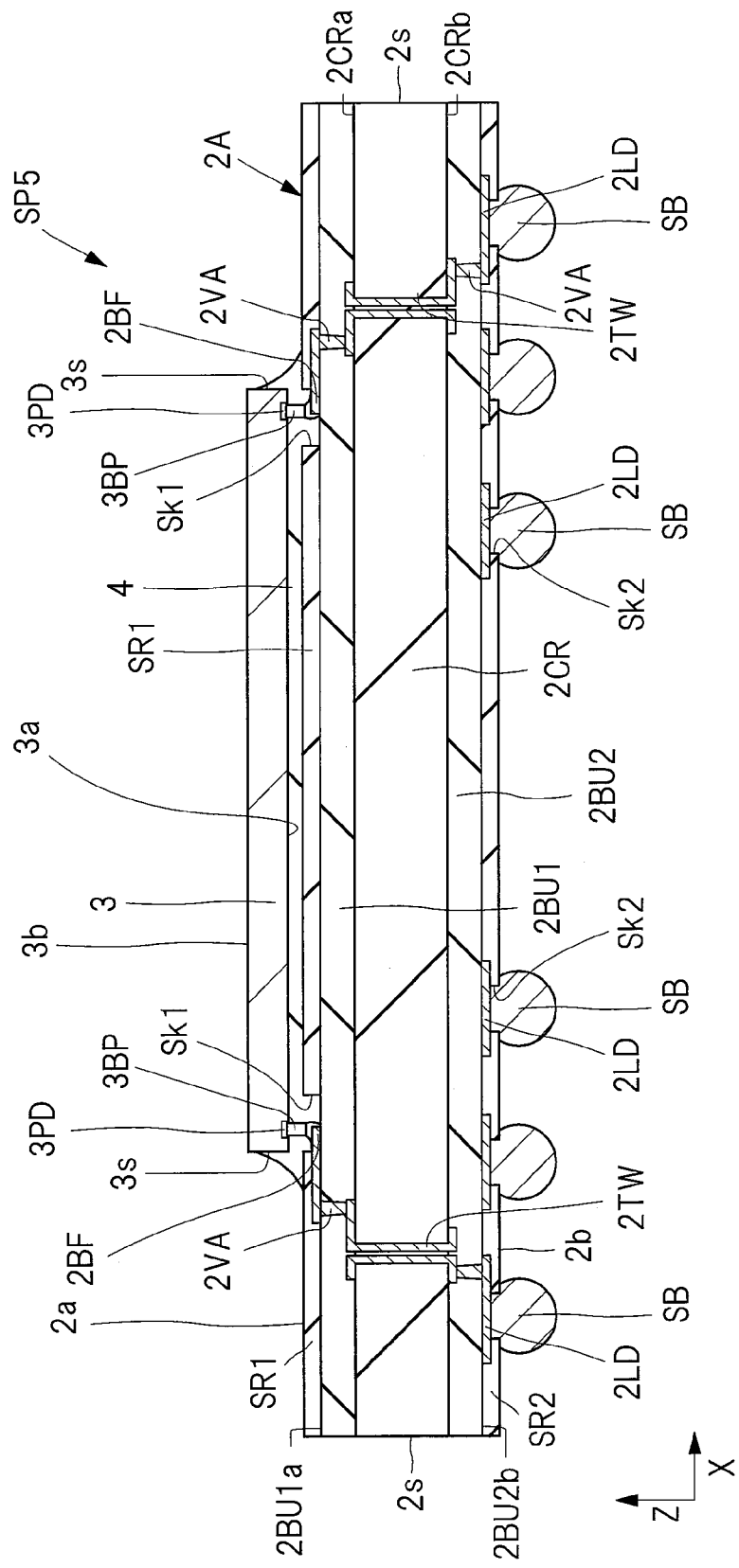
FIG. 27 is an enlarged plan view illustrating a modified example with respect to the semiconductor device illustrated in FIG. 3.

For example, in the semiconductor device SP5 illustrated in FIG. 27, a build-up layer (base material layer) 2BU1, which is an insulating layer formed by a build-up fabrication method, for example, is laminated on the top surface 2CRa of the base material layer 2CR. In addition, a build-up layer (the base material layer) 2BU2, which is an insulating layer formed by the build-up fabrication method, for example, is laminated on the bottom surface 2CRb of the base material layer 2CR. Further, wiring layers are formed on the top surface 2CRa and the bottom surface 2CRb of the base material layer 2CR, a top surface 2BU1a of the build-up layer 2BU1, and a bottom surface 2BU2b of the build-up layer 2BU2, respectively. That is, a wiring substrate 2A included in the semiconductor device SP5 is a multilayer wiring substrate in which the four wiring layers are laminated.

In the case of the wiring substrate 2A, the bonding finger 2BF serving as the terminal is formed on the top surface 2BU1a of the build-up layer 2BU1. In addition, the solder resist film SR1 is formed on the top surface 2BU1a of the build-up layer 2BU1, and a part (part formed outside the opening Sk1) of the bonding finger 2BF is covered with the solder resist film SR1. In addition, a part of the bonding finger 2BF which is formed inside the opening Sk1 of the solder resist film SR1 is exposed from the solder resist film SR1.

In addition, the plurality of lands 2LD to which the plurality of solder balls SB serving as the external terminals of the semiconductor device SP5 are bonded are formed on the bottom surface 2BU2b of the build-up layer 2BU2. In addition, the solder resist film SR2 is formed on the bottom surface 2BU2b of the build-up layer 2BU2, and each of the plurality of lands 2LD is exposed from the solder resist film SR2 in each of the plurality of openings Sk2 formed in the solder resist film SR2.

In addition, the plurality of bonding fingers 2BF and the plurality of lands 2LD are electrically connected to each other via a plurality of via wires 2VA which allow the build-up layer 2BU1 and the build-up layer 2BU2 to be conducted in the thickness direction and the plurality of through-hole wires 2TW which allow the base material layer 2CR to be conducted in the thickness direction.

Incidentally, in the present modified example, although a core insulating layer to be arranged at the center in the thickness direction is described as the base material layer 2CR and the insulating layer to be in close contact with the base material layer 2CR is described as the build-up layer 2BU1 or the build-up layer 2BU2, each of the build-up layer 2BU1 and the build-up layer 2BU2 is also included in the base material layer of the wiring substrate.

A relationship among the linear expansion coefficient of the resin body 4, the linear expansion coefficient of the solder resist film SR1 to be in close contact with the resin body 4, and a linear expansion coefficient of an insulating layer (underlying insulating layer) opposite to the resin body 4 to be in close contact with the solder resist film SR1 is important in the linear expansion coefficient adjustment technique that has been described in the above-described embodiment. Accordingly, in the case of using the wiring substrate 2A which is the multilayer wiring substrate as in the semiconductor device SP5, a relationship among the linear expansion coefficient of the resin body 4, the linear expansion coefficient of the solder resist film SR1, and a linear expansion coefficient of the build-up layer 2BU1 on the chip mounting surface side is important.

Figure 28:
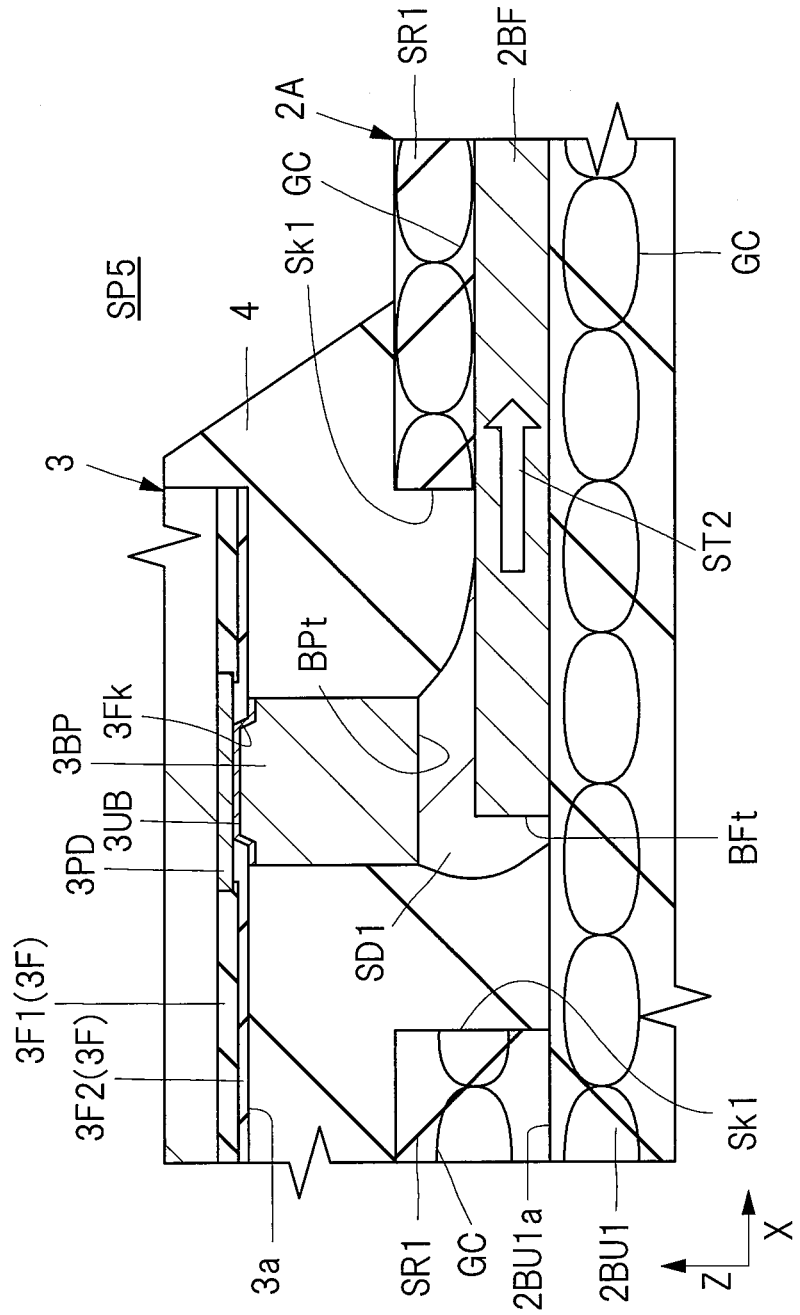
FIG. 28 is an enlarged cross-sectional view of a part which electrically connects the semiconductor chip and the wiring substrate illustrated in FIG. 27.

That is, as illustrated in FIG. 28, each of the build-up layer 2BU1 and the solder resist film SR1 provided in the wiring substrate 2A of the semiconductor device SP5 includes the glass fiber GC. Further, the linear expansion coefficient of the solder resist film SR1 is equal to or larger than the linear expansion coefficient of the build-up layer 2BU1, the linear expansion coefficient of the solder resist film SR1 is equal to or smaller than the linear expansion coefficient of the resin body 4, and the linear expansion coefficient of the build-up layer 2BU1 is smaller than the linear expansion coefficient of the resin body 4.

In other words, when the linear expansion coefficient of the build-up layer 2BU1 is set to $\alpha 1$, the linear expansion coefficient of the solder resist film SR1 is set to $\alpha 2$, and the linear expansion coefficient of the resin body 4 is set to $\alpha 3$, $$\alpha 1 \leq \alpha 2 < \alpha 3 \quad \text{(Formula 1)}$$

$$\alpha 1 < \alpha 2 \leq \alpha 3 \quad \text{(Formula 2)}$$

the relationship of the above-described (Formula 1) or the above-described (Formula 2) is satisfied.

According to the above-described configuration, even in a case in which the temperature cyclic load is applied to the semiconductor device SP5 in which the plurality of members having different linear expansion coefficients are laminated, the peeling-off of the close contact interfaces of the respective insulating layers can be suppressed. Thus, the reliability of the semiconductor device can be improved.

In addition, as another modified example of the semiconductor device SP5 illustrated in FIGS. 27 and 28, the projecting electrode layout technique and the wiring portion bending technique, described above, can be applied independently or in combination.

The semiconductor device SP5 illustrated in FIGS. 27 and 28 is the same as the semiconductor device SP1 that has been described in the above-described embodiment except for the above-described difference, and thus the redundant description thereof will be omitted.

<Fourth Modified Example>

In addition, in the above-described embodiment, in order to facilitate the understanding of the technical idea, as illustrated in FIG. 7, the description has been given regarding the example in which the plurality of bonding fingers 2BF are arranged inside the opening Sk1. However, in regard to the arrangement of the bonding fingers 2BF, there are various types of modified examples other than the mode illustrated in FIG. 7.

Figure 29:
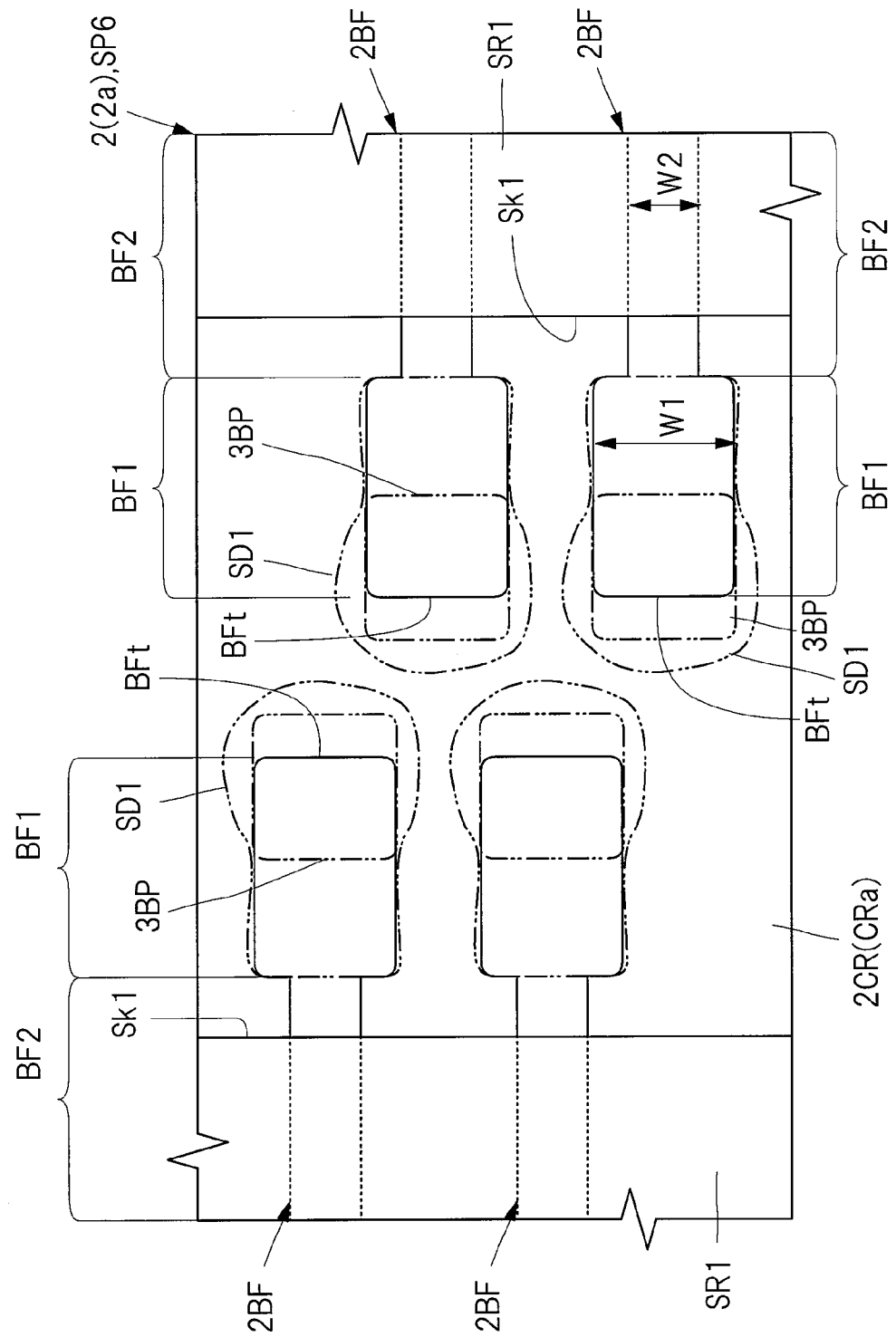
FIG. 29 is an enlarged cross-sectional view illustrating another modified example with respect to the semiconductor device illustrated in FIG. 7.

For example, as in a semiconductor device SP6 illustrated in FIG. 29, there is a modified example in which the plurality of bonding fingers 2BF are arranged in a plurality of columns inside the opening Sk1. In this case, the wiring portions BF2 of the bonding fingers 2BF to be arranged on an outer periphery side of the wiring substrate 2 among the plurality of bonding fingers 2BF extend toward a peripheral edge portion of the top surface 2a of the wiring substrate 2, and the wiring portions BF2 of the bonding fingers 2BF to be arranged on an inner periphery side extend toward a central portion of the top surface 2a of the wiring substrate 2.

In addition, in the case in which the bonding fingers 2BF are formed in the plurality of columns, as in the semiconductor device SP6, it is preferable to arrange the bonding fingers 2BF in a so-called staggered pattern from a point of view of improving an arrangement density of the terminals and reducing the plane area of the wiring substrate 2. The staggered arrangement is an arrangement method in which the arrangement is performed such that positions of the plurality of bonding fingers 2BF in a first column (for example, the column on the right side of the paper in FIG. 29) and positions of the plurality of bonding fingers 2BF in a second column (for example, the column on the left side of the paper in FIG. 29) are alternately deviated in a plan view. To be specific, the staggered arrangement is the arrangement method in which the plurality of bonding fingers 2BF in the first column and in the second column are arranged in an alternately deviated manner such that the tip surface (the tip side) BFt of the bond portion BF1 in the first column opposes a gap between the neighboring bonding fingers 2BF among the plurality of bonding fingers 2BF in the second column.

Figure 30:
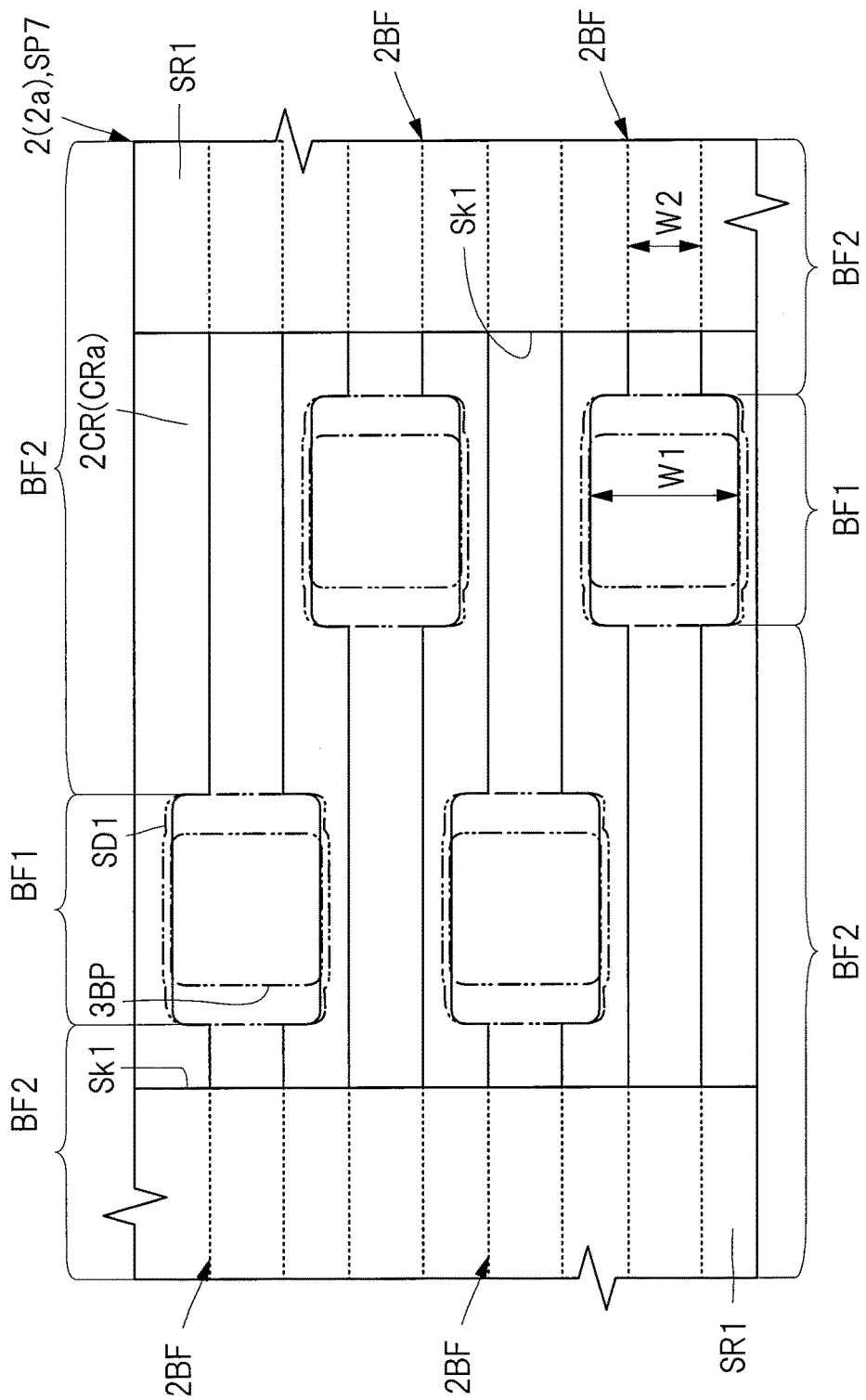
FIG. 30 is an enlarged cross-sectional view illustrating another modified example with respect to the semiconductor device illustrated in FIG. 7.

In addition, for example, as in a semiconductor device SP7 illustrated in FIG. 30, there is also a modified example in which the bonding finger 2BF does not include the tip surface (the tip side) BFt illustrated in FIG. 6 and the wiring portion BF2 is connected to both ends of the bond portion BF1 in the extending direction. As in the semiconductor device SP7, when the wiring portion BF2 is connected to both ends of the bond portion BF1 of the bonding finger 2BF, a wire can be extended to both the peripheral edge portion and the central portion of the top surface 2a of the wiring substrate 2. Accordingly, a degree of freedom in wiring design is improved.

In addition, as another modified example of the semiconductor device SP6 illustrated in FIG. 29 or the semiconductor device SP7 illustrated in FIG. 30, the projecting electrode layout technique and the wiring portion bending technique described above can be applied independently or in combination. However, in the case of the semiconductor device SP7 illustrated in FIG. 30, the wiring portion BF2 is connected to the both ends of the bond portion BF1, and thus, it is difficult to sufficiently increase the amount of the solder material SD1 to cover the side surface of the bond portion BF1 even by deviating the positional relationship between the projecting electrode 3BP and the bond portion BF1 in the plan view. Accordingly, in the case of the semiconductor device SP7, without applying the above-described projecting electrode layout technique, it is preferable to connect the projecting electrode 3BP and the bond portion BF1 of the bonding finger 2BF so as to have the positional relationship in which the projecting electrode 3BP and the central portion of the bond portion BF1 of the bonding finger 2BF are opposed to each other.

The semiconductor device SP6 illustrated in FIG. 29 and the semiconductor device SP7 illustrated in FIG. 30 are the same as the semiconductor device SP1 that has been described in the above-described embodiment except for the above-described differences, and thus the redundant description thereof will be omitted.

<Fifth Modified Example>

In addition, in the above-described embodiment, the description has been given regarding the mode of the embodiment in which the columnar projecting electrode 3BP is formed on the pad 3PD with the underlying metal film 3UB interposed therebetween as the conductive member to electrically connect the semiconductor chip 3 and the wiring substrate 2 and the projecting electrode 3BP and the bonding finger 2BF are electrically connected to each other via the solder material SD1. However, there are various types of modified examples in regard to the conductive member to electrically connect the semiconductor chip 3 and the wiring substrate 2.

For example, although not illustrated in the drawings, there is a modified example in which the underlying metal film 3UB illustrated in FIG. 6 is not formed.

Figure 31:
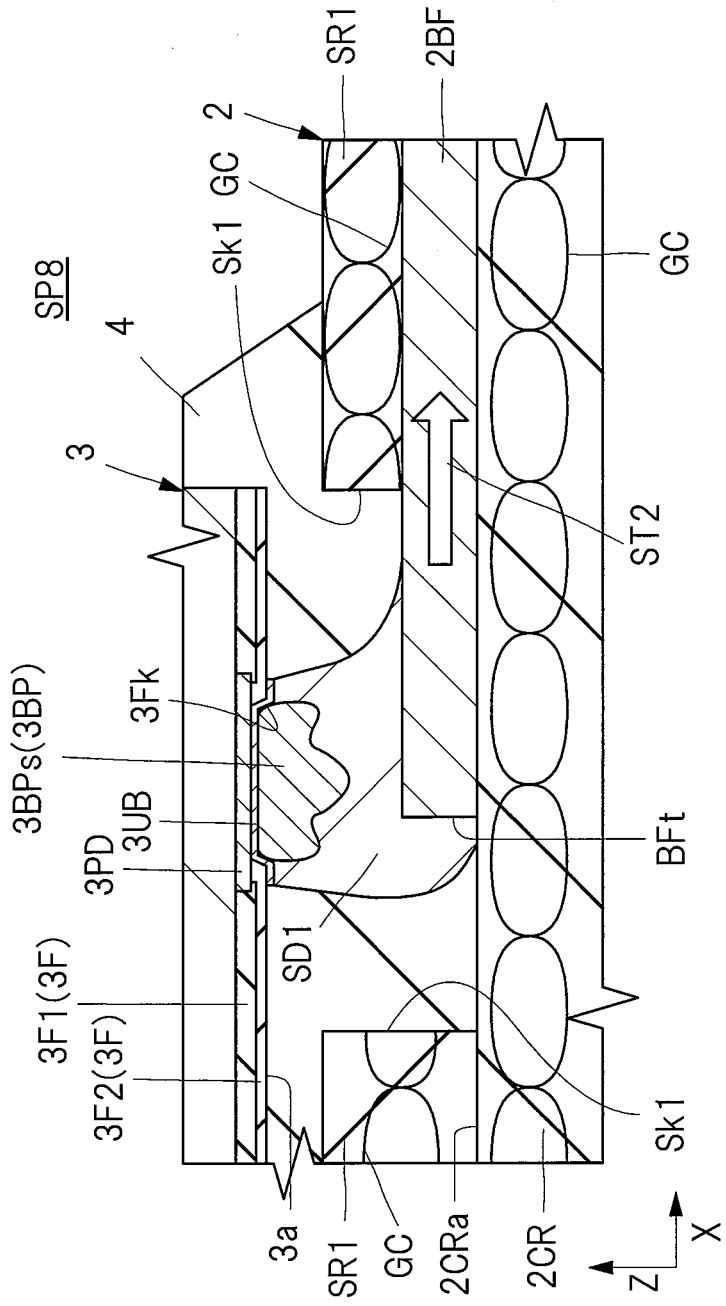
FIG. 31 is an enlarged cross-sectional view illustrating another modified example with respect to the semiconductor device illustrated in FIG. 6.

In addition, for example, as in a semiconductor device SP8 illustrated in FIG. 31, there is a modified example in which a stud bump 3BPs formed by applying a wire bonding technique is used as the projecting electrode 3BP. The stud bump 3BPs described in FIG. 31 is formed using a ball bonding technique, that is, a bonding method in which a ball portion is formed by melting a tip of a wire and then the ball portion is bonded to a portion to be bonded through pressure bonding. For example, when the stud bump 3BPs is formed by using gold, an alloy layer of the gold and the solder is formed in the bonding portion between the solder material SD1 and the projecting electrode 3BP, so that the bonding strength thereof can be improved.

Such a step of forming the stud bump 3BPs can be performed before dividing the semiconductor wafer in the projecting electrode forming step illustrated in FIG. 8. In addition, in the case of forming the stud bump 3BPs by using gold, the solder material forming step included in the semiconductor chip preparation step can be omitted.

In addition, as in the semiconductor device SP8, in a case in which the projecting electrode 3BP is replaced by the stud bump 3BPs, it is also possible to apply any one of the linear expansion coefficient adjustment technique, the projecting electrode layout technique, and the wiring portion bending technique, described above, independently. In addition, two or more of the linear expansion coefficient adjustment technique, the projecting electrode layout technique, and the wiring portion bending technique can be applied in combination.

Incidentally, the stud bump 3BPs is formed by being molded using a cavity (not illustrated), which is a jig to be used at the time of performing the ball bonding, and cutting an extra wire. Accordingly, the tip surface BPt as in the columnar projecting electrode 3BP illustrated in FIG. 6 is not clearly formed in many cases. In a case in which the above-described projecting electrode layout technique is applied to the structure of the semiconductor device SP8, as long as at least a part of the stud bump 3BPs illustrated in FIG. 31 overlaps with the tip surface BFt of the bonding finger 2BF in the thickness direction, the amount of the solder material SD1 to cover the tip surface BFt can be increased.

Figure 32:
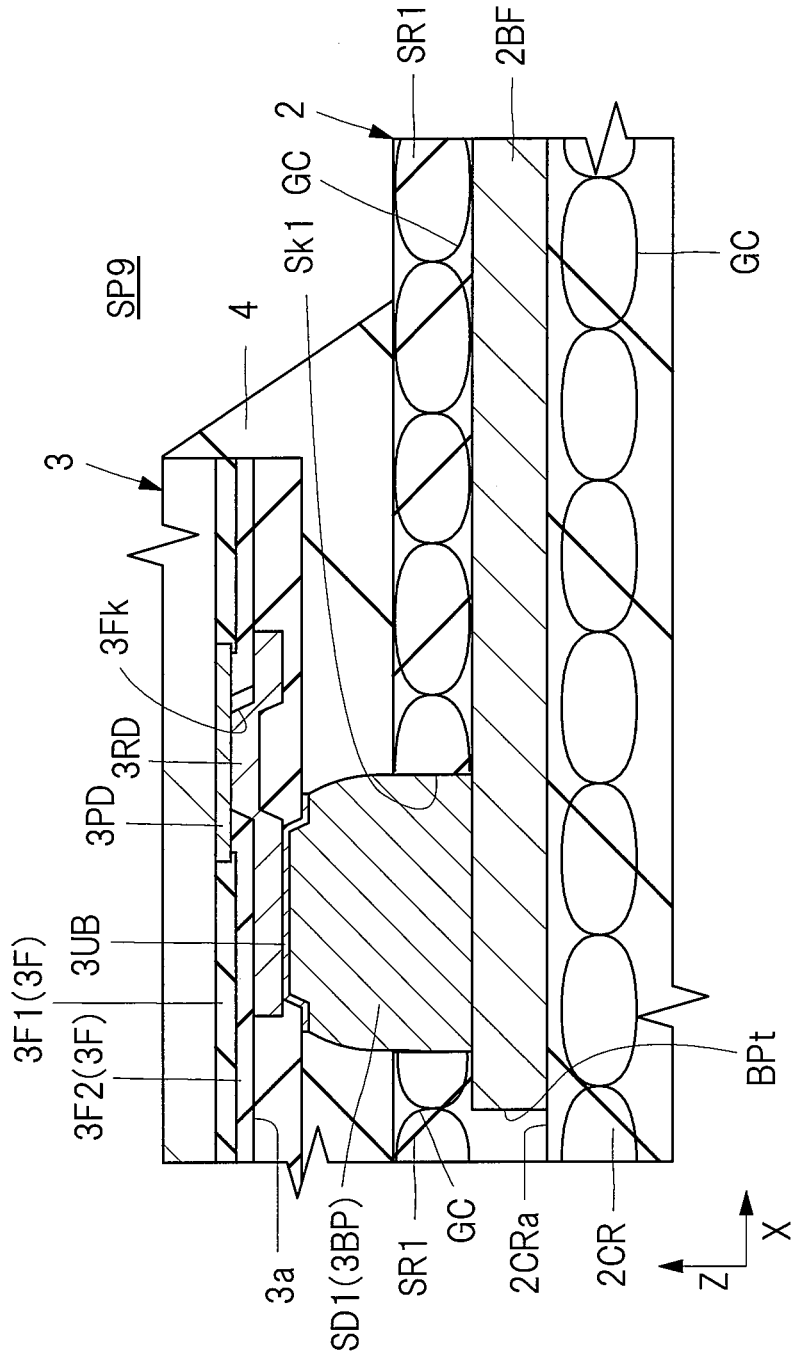
FIG. 32 is an enlarged cross-sectional view illustrating another modified example with respect to the semiconductor device illustrated in FIG. 6.

In addition, for example, as in a semiconductor device SP9 illustrated in FIG. 32, there is a modified example in which the solder material SD1 is utilized as the projecting electrode 3BP. The semiconductor device SP9 is a semiconductor package capable of laminating a redistribution layer on the front surface 3a of the semiconductor chip 3, and arranging the solder material SD1 which serves as the projecting electrode 3BP at a position not to overlap with the pad 3PD in the thickness direction.

In the semiconductor device SP9, a redistribution line 3RD is connected to the pad 3PD of the semiconductor chip, and the solder material SD1 is connected to the redistribution line 3RD via the underlying metal film 3UB. The redistribution line 3RD is a wire for converting the solder material SD1 to be at a different position from the pad 3PD in the plan view. By allowing the redistribution line 3RD to be interposed between the projecting electrode 3BP and the pad 3PD, the positions of the projecting electrodes 3BP serving as interface terminals of the semiconductor chip 3 can also be arranged in a matrix form, for example.

The redistribution layer included in the semiconductor device SP9 is formed by utilizing a step of forming the integrated circuit in the semiconductor wafer before performing the singulation of the semiconductor wafer and obtaining the semiconductor chip 3. Thus, a semiconductor package like the semiconductor device SP9 is referred to as wafer process package (WPP).

Meanwhile, the wiring substrate 2 on which the WPP type semiconductor package is mounted may have the same structure as that of the above-described embodiment and has a structure in which the opening Sk1 is formed for each connection part of the solder material SD1 in many cases. In addition, as illustrated in FIG. 32, the tip surface BFt of the bond portion of the bonding finger (the bonding pad) 2BF which is the terminal on the wiring substrate 2 side is covered with the solder resist film SR1. Such a structure in which a peripheral edge portion of the terminal is covered with the solder resist film SR1 is referred to as a solder mask defined (SMD) structure.

Since the semiconductor device SP9 has the SMD structure, it is difficult to apply the above-described projecting electrode layout technique and the wiring bending technique. However, the linear expansion coefficient adjustment technique can be applied thereto. That is, the linear expansion coefficient of the solder resist film SR1 is equal to or larger than the linear expansion coefficient of the base material layer 2CR, the linear expansion coefficient of the solder resist film SR1 is equal to or smaller than the linear expansion coefficient of the resin body 4, and the linear expansion coefficient of the base material layer 2CR is smaller than the linear expansion coefficient of the resin body 4. Thus, the generation of the crack CLK1 illustrated in FIG. 34 in the resin body 4 can be suppressed. In addition, it is possible to suppress the damage of the bonding finger 2BF caused by development of the crack CLK1.

In a manufacturing method of the semiconductor device SP9, a redistribution layer forming step is performed prior to the projecting electrode forming step illustrated in FIG. 8. In the redistribution step, the redistribution layer including the redistribution line 3RD illustrated in FIG. 32 is formed. In addition, in the projecting electrode forming step illustrated in FIG. 8, the projecting electrode 3BP made of the solder material SD1 is formed, and the solder material forming step included in the semiconductor chip preparation step is omitted.

The semiconductor device SP8 illustrated in FIG. 31 and the semiconductor device SP9 illustrated in FIG. 32 are the same as the semiconductor device SP1 that has been described in the above-described embodiment except for the above-described differences, and thus the redundant description thereof will be omitted.

Figure 33:
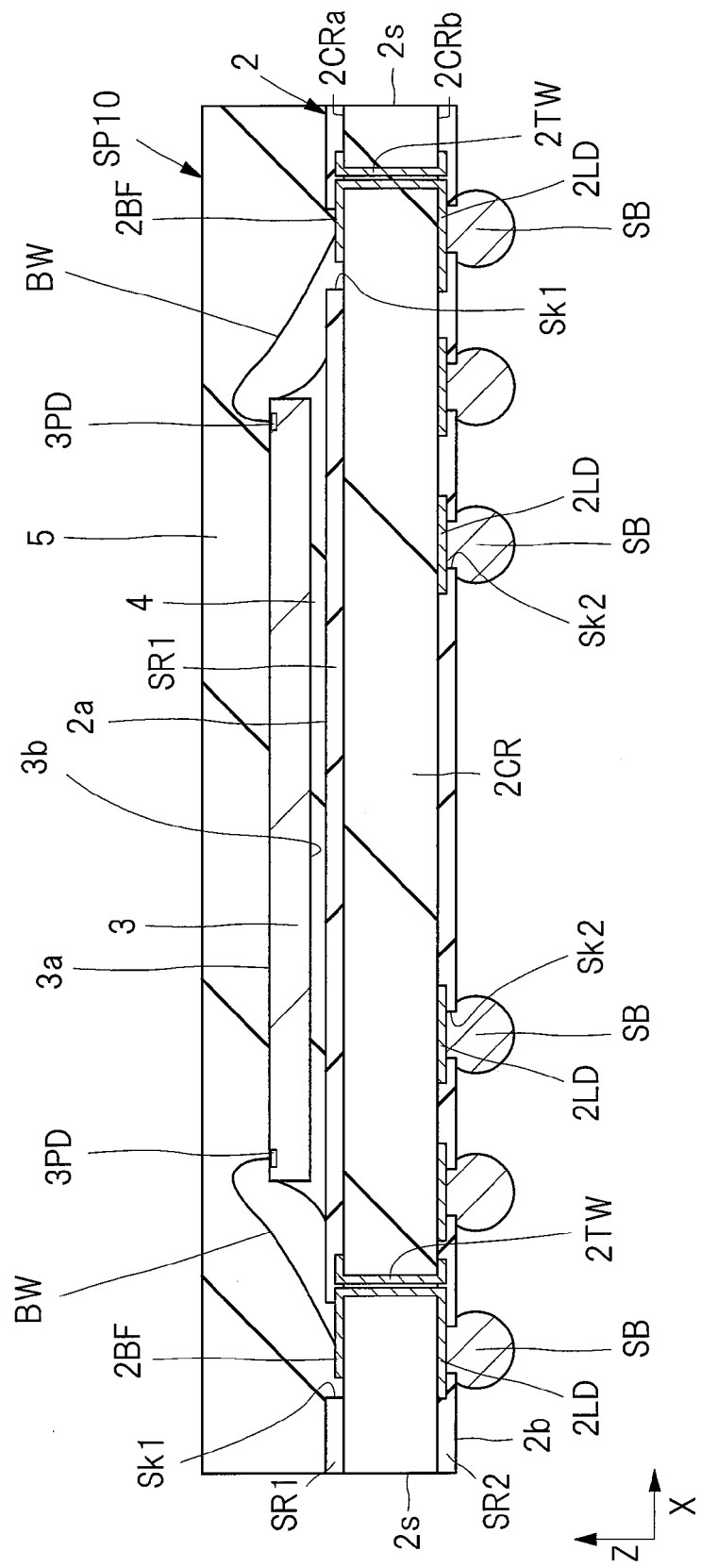
FIG. 33 is an enlarged cross-sectional view illustrating another modified example with respect to the semiconductor device illustrated in FIG. 3.

In addition, for example, as in a semiconductor device SP10 illustrated in FIG. 33, there is a modified example of a so-called face-up mounting method in which the semiconductor chip 3 is mounted over the wiring substrate 2 such that the back surface 3b of the semiconductor chip 3 and the top surface 2a of the wiring substrate 2 are opposed to each other.

In the case in which the semiconductor chip 3 is mounted according to the face-up mounting method as in the semiconductor device SP10, the pad 3PD of the semiconductor chip 3 and the bonding finger 2BF of the wiring substrate 2 are electrically connected to each other via a wire BW which is a conductive member. In addition, in the case of the semiconductor device SP10, the resin body 4 does not have the function of sealing a part (that is, the wire BW) to electrically connect the semiconductor chip 3 and the wiring substrate 2. It is required for the resin body 4 to have a function as an adhesive which adhesively fixes the semiconductor chip 3 to the wiring substrate 2. In addition, in a case in which the pad 3PD and the bonding finger 2BF are connected using the wire BW, it is necessary to form a wire loop shape, so that the bond portion of the bonding finger 2BF is arranged on the peripheral edge portion side rather than the region in which the semiconductor chip 3 is mounted, thereby requiring a certain degree of distance between the semiconductor chips 3. Accordingly, in the semiconductor device SP10 of the face-up mounting method as illustrated in FIG. 33, the resin body 4 is not embedded in the opening Sk1 in many cases.

Accordingly, the problem of generating the crack CLK1 illustrated in FIG. 34 hardly occurs among the problems that have been described in the above-described embodiment. In addition, as described with reference to FIG. 34, the bonding finger 2BF is pulled in the direction of the solder resist film SR1, and as a result, the phenomenon in which the stress is generated in the bonding portion occurs. However, the wire BW has a longer extending distance than the projecting electrode 3BP that has been described in the above-described embodiment, so that the wire BW itself is deformed, thereby mitigating a certain degree of the stress. Accordingly, the projecting electrode layout technique and the wiring portion bending technique, described above, are techniques that can obtain a particularly great effect in the case in which the semiconductor chip 3 is mounted over the wiring substrate 2 using the flip chip connection method.

However, regarding the problem that there is the concern that the peeling-off occurs in the close contact interface between the resin body 4 and the solder resist film SR1 due to the temperature cyclic load, the same problem is also likely to occur even in the case of the semiconductor device SP10. In addition, since the resin body 4 is the member that adhesively fixes the semiconductor chip 3, the peeling-off of the resin body 4 from the wiring substrate 2 causes reduction in the reliability of the semiconductor device SP10. Thus, it is preferable to apply the above-described linear expansion coefficient adjustment technique.

In addition, in the semiconductor device SP10 illustrated in FIG. 33, since the plurality of wires BW are required to be sealed and protected, a sealing body (resin body) 5 to seal the semiconductor chip 3 and the plurality of wires BW is formed. The inside of the opening Sk1 of the solder resist film SR1 is closed by the sealing body 5.

In addition, a method of manufacturing the semiconductor device SP10 illustrated in FIG. 33 is different from the step illustrated in FIG. 8 in terms of the following points. That is, the projecting electrode forming step and the solder material forming step are omitted in the semiconductor chip preparation step. In addition, in the semiconductor chip mounting step, via the resin body 4 serving as the adhesive, the semiconductor chip 3 is mounted over the top surface 2a of the wiring substrate 2 in accordance with the face-up mounting method. In addition, a wire bonding step of electrically connecting the semiconductor chip 3 and the wiring substrate 2 is added between the semiconductor chip mounting step and the sealing step. In addition, in the sealing step, resin is supplied to cover the semiconductor chip 3 and the plurality of wires BW to form the sealing body 5.

The semiconductor device SP10 illustrated in FIG. 33 is the same as the semiconductor device SP1 that has been described in the above-described embodiment except for the above-described difference, and thus the redundant description thereof will be omitted.

<Sixth Modified Example>

In addition, it is possible to apply the modified examples in combination within the scope of the technical idea that has been described in the above-described embodiment.

In addition, the technical idea regarding the semiconductor device and the method of manufacturing the semiconductor device which have been described in the embodiment and the modified examples thereof is extracted and can be expressed as follows.

[Appendix 1]

A semiconductor device that includes:

a wiring substrate including a base material layer, a plurality of first terminals formed on a first surface of the base material layer, and a first insulating layer covering the first surface of the base material layer;

a semiconductor chip including a front surface, a back surface opposite to the front surface, a plurality of bonding pads formed on the front surface, and a plurality of projecting electrodes respectively formed on the plurality of bonding pads, and mounted over the wiring substrate via the plurality of projecting electrodes in a state in which the front surface opposes the first surface of the wiring substrate;

a plurality of solder materials connecting the plurality of projecting electrodes and the plurality of first terminals, respectively; and a second insulating layer arranged between the wiring substrate and the semiconductor chip, and sealing connection parts between the plurality of projecting electrodes and the plurality of first terminals and an inside of a first opening formed in the first insulating layer, each of the plurality of first terminals being exposed from the first opening formed in the first insulating layer, each of the plurality of first terminals including a bond portion which is formed inside the first opening and a wiring portion which extends from the bond portion toward the first insulating layer and has a part covered with the first insulating layer, and the wiring portion including a flexion point at which an extending direction thereof is changed between the bond portion and a part covered with the first insulating layer.

[Appendix 2]

A method of manufacturing a semiconductor device including the following steps of:

(a) preparing a wiring substrate including a base material layer, a plurality of first terminals formed on a first surface of the base material layer, and a first insulating layer covering the first surface of the base material layer;

(b) preparing a semiconductor chip including a front surface, a back surface opposite to the front surface, a plurality of bonding pads formed on the front surface, and a plurality of projecting electrodes formed on the front surface side of the semiconductor chip and electrically connected to the plurality of bonding pads, respectively; and (c) mounting the semiconductor chip over the first surface side of the wiring substrate with a second insulating layer interposed therebetween after the steps (a) and (b), each of the plurality of first terminals being exposed from a first opening formed in the first insulating layer, each of the base material layer and the first insulating layer of the wiring substrate being made of resin containing a plurality of filler particles and a glass fiber, and a linear expansion coefficient of the first insulating layer being equal to or larger than a linear expansion coefficient of the base material layer, the linear expansion coefficient of the first insulating layer being equal to or smaller than a linear expansion coefficient of the second insulating layer, and the linear expansion coefficient of the base material layer being smaller than the linear expansion coefficient of the second insulating layer.

EXPLANATION OF REFERENCE CHARACTERS 2, 2A Wiring substrate
2a Top surface (surface, main surface, or chip mounting surface)
2A Wiring substrate
2b Bottom surface (surface, main surface, or mounting surface)
2BF Bonding finger (terminal, electrode, internal interface terminal, or bonding pad)
2BU1, 2BU2 Build-up layer (base material layer)
2BU1a Top surface
2BU2b Bottom surface
2CR Base material layer (core layer or insulating layer)
2CRa First surface, main surface, or bonding finger formation surface
2CRb Second surface, main surface, or land formation surface 2LD A plurality of lands (terminal, electrode, external interface terminal, or external terminal)
2s Side surface
2TW Through-hole wire
2VA Via wire
3 Semiconductor chip
3a Front surface (main surface or top surface)
3b Back surface (main surface or bottom surface)
3BP Projecting electrode (conductive member, pillar bump, stud bump, or solder bump)
3BPs Stud bump
3F, 3F1, 3F2 Insulating film
3Fk Opening
3PD Pad (bonding pad, electrode, or electrode pad)
3RD Redistribution line
3s Side surface
3UB Underlying metal film (under bump metal)
4 Resin body (insulating layer, underfill material, sealing material, adhesive, or die-bonding material)
4p Resin
5 Sealing body (resin body)
20 Wiring substrate (multi-piece substrate)
20a Product forming region
20b Frame portion (frame body)
20c Dicing line (dicing region)
BF1 Bond portion (bonding portion)
BF2, BF3 Wiring portion
BFt Tip surface (tip side)
BPt Tip surface
BW Wire (conductive member or metal wire)
CLK1 Crack
DCb Dicing blade (rotation blade)
DCd Jig
FP Flexion point
GC Glass fiber (fiber material)
H1 Semiconductor device
MS Mask
MSh Through-hole (opening)
NZ1 Nozzle for supplying resin to outer side
SP1 Semiconductor device
SB Solder ball (solder material, external terminal, electrode, or external electrode)
SD1, SD2, SD3 Solder material
Sk1, Sk2 Opening
SP1, SP2, SP3, SP4, SP5, SP6, SP7, SP8, SP9, SP10, H1 Semiconductor device (semiconductor package)
SR1, SR2, SRh Solder resist film (insulating layer)
ST1, ST2, ST3, ST4 Arrow (tensile force)
W1, W2 Width (length)
WH Wafer (semiconductor wafer)
WHa Chip region (device region)
WHb Scribe line (scribe region)

What is claimed is:

1. A semiconductor device comprising:
   a wiring substrate including a base material layer, a plurality of first terminals formed on a first surface of the base material layer, and a first insulating layer covering the first surface of the base material layer;
   a semiconductor chip including a front surface, a back surface opposite to the front surface, and a plurality of bonding pads formed on the front surface, and mounted over the first insulating layer; and
   a second insulating layer arranged between the wiring substrate and the semiconductor chip, and being in contact with each of the first insulating layer and the semiconductor chip,
   wherein each of the plurality of first terminals is exposed from a first opening formed in the first insulating layer,
   wherein each of the base material layer and the first insulating layer of the wiring substrate is comprised of resin containing a plurality of filler particles and a glass fiber,
   wherein a linear expansion coefficient of the first insulating layer is equal to or larger than a linear expansion coefficient of the base material layer, and is equal to or smaller than a linear expansion coefficient of the second insulating layer, and
   wherein the linear expansion coefficient of the base material layer is smaller than the linear expansion coefficient of the second insulating layer.

2. The semiconductor device according to claim 1,
   wherein the semiconductor chip is mounted over the wiring substrate in a state in which the front surface side opposes the first surface side of the wiring substrate via a plurality of projecting electrodes which are electrically connected to the plurality of bonding pads, and
   wherein connection parts between the plurality of projecting electrodes and the plurality of first terminals, and an inside of the first opening of the first insulating layer are sealed by the second insulating layer.

3. The semiconductor device according to claim 2,
   wherein the plurality of projecting electrodes are formed on the plurality of bonding pads and are electrically connected to the plurality of first terminals via a plurality of solder materials, and
   wherein the plurality of projecting electrodes are formed by using a material different from the plurality of solder materials.

4. The semiconductor device according to claim 3,
   wherein each of the plurality of first terminals includes a bond portion having a tip side formed inside the first opening, and
   wherein each of the plurality of projecting electrodes overlaps with the tip side of the bond portion provided in each of the plurality of first terminals in a plan view.

5. The semiconductor device according to claim 2,
   wherein each of the plurality of first terminals includes a bond portion formed inside the first opening, and a wiring portion extending from the bond portion toward the first insulating layer and having a part covered with the first insulating layer, and
   wherein the wiring portion includes a flexion point at which an extending direction thereof is changed between the bond portion and the part of the wiring portion covered with the first insulating layer.

6. The semiconductor device according to claim 5,
   wherein a width of the wiring portion in a direction orthogonal to the extending direction of the wiring portion is smaller than a width of the bond portion.

7. The semiconductor device according to claim 3,
   wherein the plurality of projecting electrodes are connected to the plurality of bonding pads via a plurality of underlying conductive films formed on the plurality of bonding pads, and
   wherein the plurality of projecting electrodes are formed on the plurality of bonding pads with the plurality of underlying conductive films interposed therebetween.

8. The semiconductor device according to claim 1,
   wherein the wiring substrate includes the plurality of first terminals, a plurality of second terminals which are formed on a second surface of the base material layer opposite to the first surface and are electrically connected to the plurality of first terminals, respectively, a third insulating layer which covers the second surface of the base material layer, and a second opening which is formed in the third insulating layer and causes each of the plurality of second terminals to be exposed, wherein the third insulating layer is formed by using resin containing a plurality of filler particles and a glass fiber, and wherein a linear expansion coefficient of the third insulating layer is equal to or larger than the linear expansion coefficient of the base material layer.

9. A method of manufacturing a semiconductor device, comprising the following steps of:
   (a) preparing a wiring substrate including a base material layer, a plurality of first terminals formed on a first surface of the base material layer, and a first insulating layer covering the first surface of the base material layer;
   (b) preparing a semiconductor chip including a front surface, a back surface opposite to the front surface, a plurality of bonding pads formed on the front surface, and a plurality of projecting electrodes formed on the front surface side and electrically connected to the plurality of bonding pads, respectively;
   (c) mounting the semiconductor chip over the wiring substrate such that the front surface of the semiconductor chip opposes the first surface of the wiring substrate, and electrically connecting the plurality of projecting electrodes and the plurality of first terminals, after the steps (a) and (b); and
   (d) supplying resin to a portion between the wiring substrate and the semiconductor chip, and forming a second insulating layer which is in contact with each of the first insulating layer and the semiconductor chip, after the step (c), wherein each of the plurality of first terminals is exposed from a first opening formed in the first insulating layer, wherein each of the base material layer and the first insulating layer of the wiring substrate is comprised of resin containing a plurality of filler particles and a glass fiber, and wherein a linear expansion coefficient of the first insulating layer is equal to or larger than a linear expansion coefficient of the base material layer, the linear expansion coefficient of the first insulating layer is equal to or smaller than a linear expansion coefficient of the second insulating layer, and the linear expansion coefficient of the base material layer is smaller than the linear expansion coefficient of the second insulating layer.

10. The method of manufacturing a semiconductor device according to claim 9,
   wherein a plurality of first solder materials are formed on exposed surfaces of the plurality of first terminals of the wiring substrate prepared in the step (a), respectively,
   wherein a plurality of second solder materials are formed on tip surfaces of the plurality of projecting electrodes of the semiconductor chip prepared in the step (b), respectively, and
   wherein the plurality of first solder materials and the plurality of second solder materials are heated to be integrated such that the plurality of projecting electrodes and the plurality of first terminals are electrically connected, in the step (c).

11. The method of manufacturing a semiconductor device according to claim 10,
   wherein each of the plurality of first terminals of the wiring substrate prepared in the step (a) includes a bond portion having a tip side formed inside the first opening, and a wiring portion extending from the bond portion toward a direction opposite to the tip side and having a part covered with the first insulating layer, and
   wherein the semiconductor chip is fixed such that the plurality of projecting electrodes overlap with the tip sides of the plurality of first terminals, respectively, in a plan view, in the step (c).

12. The method of manufacturing a semiconductor device according to claim 10,
   wherein each of the plurality of first terminals of the wiring substrate prepared in the step (a) includes a bond portion formed inside the first opening, and a wiring portion extending from the bond portion toward the first insulating layer and having a part covered with the first insulating layer, and
   wherein the wiring portion includes a flexion point at which an extending direction thereof is changed between the bond portion and the part covered with the first insulating layer.

* * * * *